(12) United States Patent
Koga et al.

(10) Patent No.: US 6,627,809 B1
(45) Date of Patent: Sep. 30, 2003

(54) SUPERLATTICE STRUCTURES HAVING SELECTED CARRIER POCKETS AND RELATED METHODS

(75) Inventors: Takaaki Koga, Kawagoo (JP); Mildred S. Dresselhaus, Arlington, MA (US); Xiangzhong Sun, Westford, MA (US); Steven B. Cronin, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/711,160

(22) Filed: Nov. 9, 2000

Related U.S. Application Data
(60) Provisional application No. 60/164,645, filed on Nov. 10, 1999.

(51) Int. Cl.[7] .......................... H01L 35/12; H01L 35/14; H01L 35/20
(52) U.S. Cl. ...................... 136/236.1; 239/240; 257/15
(58) Field of Search ................................ 136/203, 205, 136/236.1, 239, 240; 257/15

(56) References Cited

PUBLICATIONS

Dresselhause, M.S., Lin, Y.M., Dresselhaus, G., Sun, X., Zhang, Z., Cronin, S.B., Koga, T., Ying, J.Y., Advances in 1D and 2D Thermoelectric Materials, 18th International Conference on Thermoelectrics, 1999, pp. 92–99.*

Cronin B. Vining, "A model for the high–temperature transport properties of the heavily doped n–type silicon–germanium alloys", J. Appl. Phys. 69(1), Jan. 1, 1991, pp. 331–341.

Theodorian Borca–Tasciuc, et al., "Thermal Conductivity of Symmetrically Strained Si/Ge Superlattices", Superlattices and Microstuctures, pp. 1–20. No month and/or date provided.

Gang Chen, et al., "Heat Conduction Mechanisms and Phonon Engineering in Superlattice Structures", Thermal Science & Engineering, vol. 7 No. 6, 1999, pp. 43–51. No month and/or date provided.

R. Venkatasubramamian, et al., "In–Plane Thermoelectric Properties of Freestanding Si/Ge Superlattice Structures", 17th International Conference on Thermoelectrics, 1998, pp. 191–197. No month and/or date provided.

G. Chen, et al. "Heat Conduction in Alloy–Based Superlattices", 17th International Conference on Thermoelectrics, 1998, pp. 202–204 No Month and/or date provided.

Eric Kasper, "Properties of Strained and Related Silicon Germanium", INSPEC, the Institution of Electrical Engineers, London, United Kingdom, 1995, pp. 70–71, 73, 75–78, 135–144. No month and/or date provided.

S. Ciraci et al. "Strained Si/GE Superlattices: Structural stability, growth, and electronic properties", The American Physical Society, vol. 38, No. 3, Jul. 15, 1988, pp. 1835–1848.

C. Tserbak,et al. "Unified approach to the electronic structure of strained Si/Ge superlattices", The American Physical Society, vol. 47, No. 12, Mar. 15, 1993, pp. 7104–7112.

Chris G. Van de Walle, "Band lineups and deformation potentials in the model–solid theory", The American Physical Society, vol. 39, No. 3, Jan. 15, 1989, pp. 1871–1883.

Martin M. Reiger, et al. "Electronic–band parameters in strained $Si_{1-x}Ge_x$ alloys on $Si_{1-y}Ge_y$ substrates", vol. 48, No. 19, Nov. 15, 1993, pp. 14276–14280.

Weikun Ge, et al. "Conduction–band minimum of $(GaAs)_1/(AlAs)_1$ superlattices: Relationship to X minimum of AlAS", vol. 44, No. 7, Aug. 15, 1991, 4 pgs.

S.M. Lee, et al. "Thermal conductivity of Si–Ge superlattices", Appl. Phys. Lett. 70(22), Jun. 2, 1997, pp. 2957–2959.

D.A. Broido, et al. "Effect of superlattices structure on the thermoelectric figure of merit", Physical Review B, The American Physical Society, vol. 51, No. 19, May 15, 1995, pp. 13797–13800.

D.A. Brodio,et al. "Comment on Use of Quantum well superlattices to obtain high figure of merit from nonconventional thermoelectric materials", Appl. Phys. Lett. 63, 3230, 1993, 2 pg. No month and/or year provided.

L.D. Hicks, et al., "Use of quantum–well superlattices to obtain a high figure of merit from nonconventional thermoelectric material", Appl. Phys. Lett. 63 (23), Dec. 6, 1993, pp. 3230–3232.

L.D.Hicks, et al. "Experimental study of the effect of quantum–well structures on the thermoelectric figure of merit", Physical Review B, The American Physical Society, vol. 53, No. 16, Apr. 15, 1996, pp R10493–R10496.

L.D.Hicks, "Thermoelectric figure of merit of a one–dimensional conductor", Physical Review B, The American Physical Society, vol. 47, No. 24, Jun. 15, 1993, pp 16631–16634.

(List continued on next page.)

*Primary Examiner*—Patrick Ryan
*Assistant Examiner*—Thomas H. Parsons
(74) *Attorney, Agent, or Firm*—Daly, Crowley & Mofford, LLP

(57) ABSTRACT

A carrier pocket engineering technique used to provide superlattice structures having relatively high values of the three-dimensional thermoelectric figure of merit ($Z_{3D}T$) is described. Also described are several superlattice systems provided in acordance with the carrier pocket engineering technique. Superlattice structures designed in accordance with this technique include a plurality of alternating layers of at least two different semiconductor materials. First ones of the layers correspond to barrier layers and second ones of the layers correspond to well layers but barrier layers can also work as well layers for some certain carrier pockets and vice-versa. Each of the well layers are provided having quantum well states formed from carrier pockets at various high symmetry points in the Brillouin zone of the structure to provide the superlattice having a relatively high three-dimensional thermoelectric figure of merit.

9 Claims, 25 Drawing Sheets

OTHER PUBLICATIONS

L.D. Hicks, et al. "Effect of quantum–well structures on the thermoelectric figure of merit", The American Physical Society, Physical Review B, vol. 47, No. 19, May 15, 1993, pp. 12 727–12 731.

G.D. Mahan, et al. "The best thermoelectric", Proc. Natl. Acad. Sci. USA, Applied Physical Sciences, vol. 93, Jul. 1996, pp. 7436–7439.

J.O. Sofa et al., "Thermoelectric figure of merit of superlattices", Appl. Phys. Lett. 65 (21), Nov., 21, 1994, pp. 2690–2692.

P.J. Lin–Chung et al., Thermoelectric figure of merit of composite superlattice system, Physical Review B, vol. 51, No. 19, May 15, 1995, pp. 13 244–13 248.

J. O. Sofo, et al., "Optimum band gap of a thermoelectric material", Physical Review B, vol. 49, No. 7, Feb. 15, 1994, pp. 4565–4570.

L.D. Hicks et al., "The Effect of Quantum Well Structures on the Thermoelectric Figure of Merit", Mat. Res. Soc. Symp. Proc. vol. 281, 1993, pp. 821–826. No Month and/or year provide.

D.A. Broido et al. "Thermoelectric transport in quantum well superlattices", American Institute of Physics, Appl. Phys. Lett. 70 (21), May 26, 1997,pp. 2834–2836.

Theodorian Borca–Tasciuc, et al., "Thermal Conductivity of Si/Ge Superlattices". No source provided.

T.P. Pearsall, et al. "Temperature dependence of mobility in n–type Si–Ge superlattices", American Institute of Physics, Appl. Phys. Lett. 72 (1), Jan. 5, 1998, pp. 76–78.

J.P. Dismukes, et al. "Thermal and Electrical Properties of Heavily Doped Ge–Si Alloys up to 1300°K*", Journal of Applied Physics, vol. 35, No. 10, Oct., 1964, pp. 2899–2907.

Cardona, et al., "1.3 Germanium (Ge)", Date Unknown, pp. 87–93, 103–119, 400–425, 432–434. No source provided.

Cardona, et al. "1.2 Silicon (Si)", Date unknown, pp. 43–46, 61–77, 359,363–364, 369–385, 397–399. No source provided.

* cited by examiner

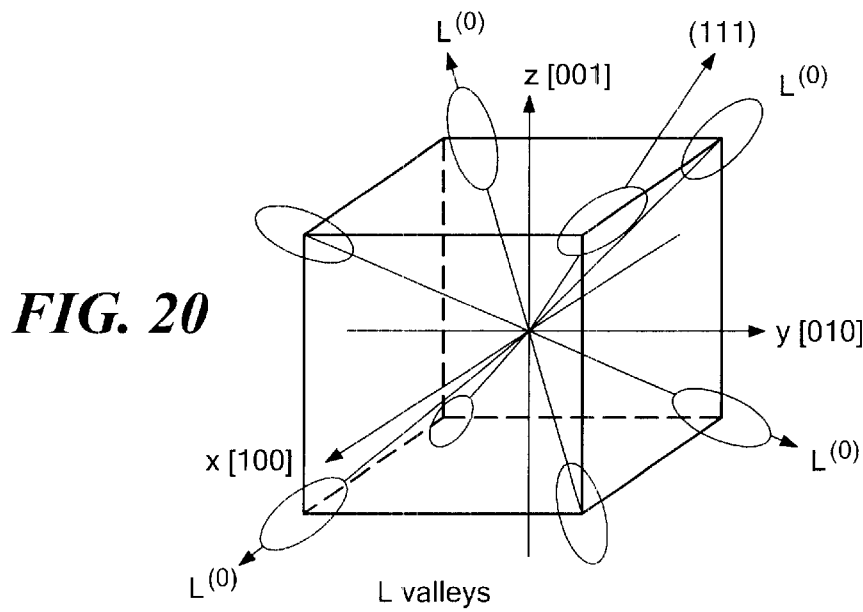
*FIG. 20*
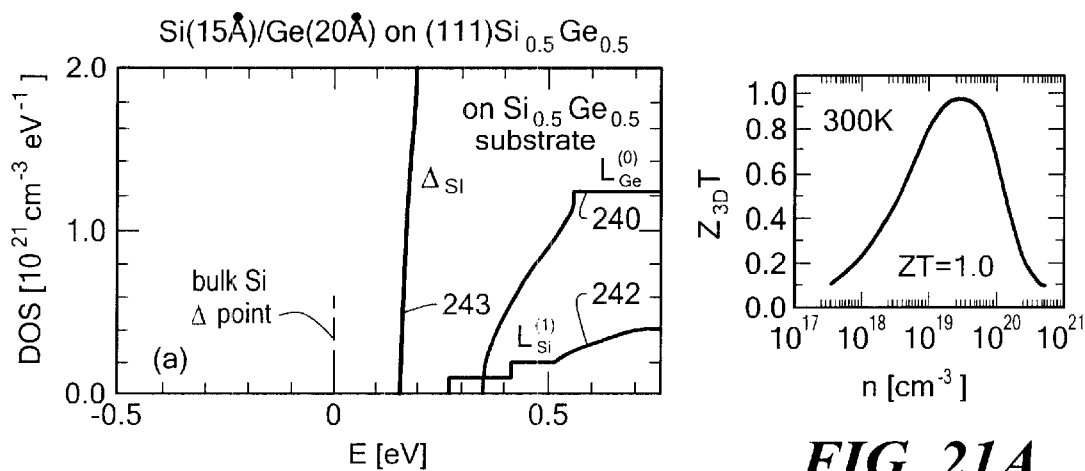
*FIG. 21*
*FIG. 21A*
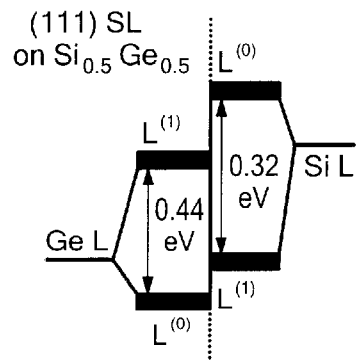
*FIG. 21B*

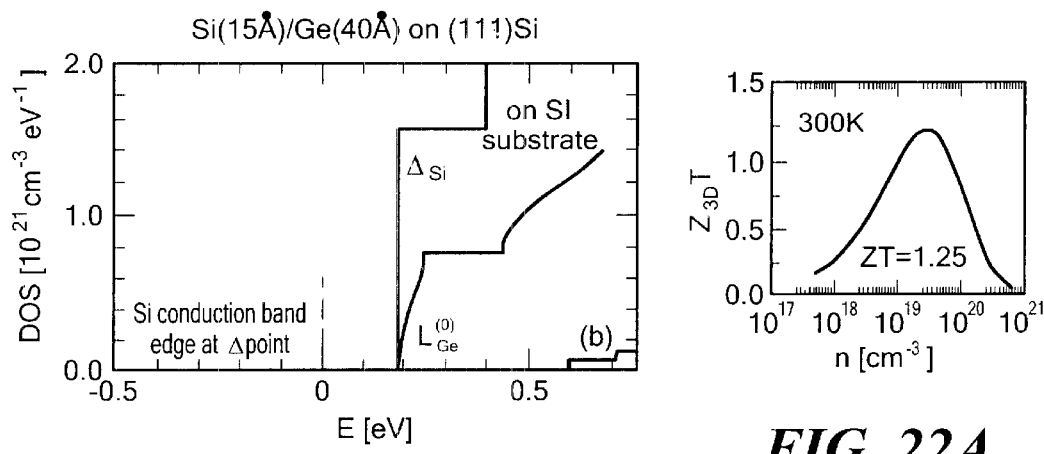
FIG. 22A
FIG. 22
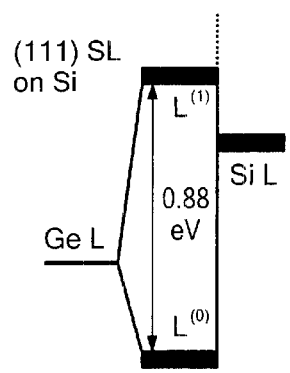
FIG. 22B

SUPERLATTICE STRUCTURES HAVING SELECTED CARRIER POCKETS AND RELATED METHODS

CROSS-REFERENCE TO RELATED APPLICATIONS

This application claims priority under 35 U.S.C. §119(e) from application Ser. No. 60/164,645 filed on Nov. 10, 1999 which application is hereby expressly incorporated herein by reference in its entirety.

STATEMENTS REGARDING FEDERALLY SPONSORED RESEARCH

This invention was made with Government support under Contract No. 205-G-7A114-01 awarded by the Office of Naval Research (ONR) and under Contract No. N00167-98-K-0052 awarded by the Department of the Navy. The U.S. Government may have certain rights in this invention.

BACKGROUND OF THE INVENTION

1. Field of the Invention

This invention relates generally to thermoelectric materials and more particularly to superlattice structures used in thermoelectric materials and techniques for providing superlattice structures having enhanced thermoelectric figures of merit.

2. Description of the Related Art

As is known in the art, a thermoelectric material refers to a material capable of directly converting thermal energy into electrical energy and vice versa or capable of cooling a material when a current is flowing in the desired direction. Such materials include, for example, heavily doped semiconductor materials. In a thermoelectric generator, for example, the Seebeck voltage generated under a temperature difference drives a current through a load circuit. Typical thermoelectric generators employ a radioisotope, a nuclear reactor or a hydrocarbon burner as the heat source. Such generators are custom made for space missions, for example. Some materials such as tellurides and selenides are used for power generation up to a temperature of about 600° centigrade (C). Silicon germanium alloys provide better thermoelectric performance above 600° C. and up to about 1000° C. With presently available materials, conversion efficiencies in the five to ten percent range are typically expected.

It would, however, be desirable to provide such thermoelectric materials having higher conversion efficiencies. Such devices may then be effectively employed in an apparatus such as an automobile to thus increase the fuel efficiency of the automobile.

Superlattice structures, in general, are known and typically comprise a composite made of alternating ultrathin layers of different materials. Typically, the superlattice has an energy band structure which is different from, but related to, the energy band structure of the component materials. By the appropriate choice of materials (and other factors discussed below), a superlattice having a desired energy band structure and other characteristics can be produced. Superlattices have many uses, including, but not limited to, use in the field of thermoelectric power generation or cooling.

The fabrication of a superlattice by molecular beam epitaxy (MBE), or other known epitaxial growth techniques, is generally known. However, the choice of materials and the relative amounts of the materials which make up the superlattice are predominant factors in determining the characteristics of the superlattice. For use as a thermoelectric material in power generation applications, it is desirable to choose the materials, and their relative amounts, so that the thermoelectric figure of merit, ZT, is maximized.

The dimensionless thermoelectric figure of merit (ZT) is a measure of the effectiveness of the material for both cooling and power conversion applications and is related to material properties by the following equation:

$$ZT = S^2 \sigma T / K,$$

where S, $\sigma$, K, and T are the Seebeck coefficient, electrical conductivity, thermal conductivity and temperature, respectively. The Seebeck coefficient (S) is a measure of how readily electrons (or holes) can convert thermal to electrical energy in a temperature gradient as the electrons move across a thermoelement. The highest useful Seebeck coefficients are found in semiconductor materials with a high density of states at the Fermi level. In theory, to maximize the thermoelectric figure of merit ZT, one would try to increase or maximize the Seebeck coefficient S, electrical conductivity $\sigma$ and temperature T and minimize the thermal conductivity K. However, in practice, this is not so simple. For example, as a material is doped to increase its electrical conductivity ($\sigma$), bandfilling tends to lower the Seebeck coefficient S and the electronic contribution, $K_e$, to the thermal conductivity K increases. At a given temperature, the thermoelectric figure of merit ZT for a given material is maximized at an optimum doping level. In most materials, the thermoelectric figure of merit ZT is maximized at doping levels of approximately $10^{19}$ cm$^{-3}$. Since increasing (or decreasing) one parameter may adversely decrease (or increase) another parameter, it is generally difficult to achieve higher values for ZT. It should of course be appreciated that increasing $\sigma$ increases $K_e$, but decreases S and vice-versa. Currently, the best thermoelectric materials have a maximum ZT of approximately 1. The ZT values are below one at temperatures both below and above the temperature at which they achieve the maximum value.

The thermoelectric figure of merit ZT in conventional (bulk) thermoelectric materials is also related to the thermoelectric materials factor (b*) which may be expressed as:

$$b^* = \mu m^{*3/2} / K_L$$

in which:

$\mu$ is the carrier mobility;

m* is the density of states effective mass; and $K_L$ is the lattice thermal conductivity.

The precise relationship between the thermoelectric materials factor b* and the thermoelectric figure of merit ZT is relatively complex.

A superlattice provides the opportunity to enhance the values of ZT for a number of reasons. Under appropriate conditions, the Seebeck coefficient of a superlattice increases as the thickness of a period of a quasi-two-dimensional superlattice decreases. The carrier mobility is generally increased by means of modulation doping and $\delta$-doping, and this effect has previously been demonstrated in Si/SiGe strained-layer superlattices. Furthermore, the lattice thermal conductivity of a small-period superlattice is expected to be substantially lower than the average of those for the component materials because of augmented phonon-interface scattering effects.

In view of the above, it would be desirable to provide a superlattice structure which has a thermoelectric figure of merit which is higher than that heretofore achieved.

SUMMARY OF THE INVENTION

In accordance with the present invention, a superlattice structure includes a plurality of alternating layers of at least two different semiconductor materials. First ones of the layers correspond to barrier layers and second ones of the layers correspond to well layers. It should be understood that there are cases where "well" layers act as both "well" and "barrier" layers and "barrier" layers act as both "well" and "barrier" layers. For example, in GaAs/AlAs superlattices, GaAs (AlAs) layers are "well" ("barrier") layers for the Γ- and L-valleys, whereas they are "barrier" ("well") layers for the X-valleys. Each of the well layers are provided having quantum well states formed from carrier pockets at various high symmetry points in the Brillouin zone of the superlattice structure. With this particular arrangement, a superlattice having a relatively high thermoelectric figure of merit is provided.

The superlattice structures of the present invention may be used for various purposes including, but without limitation, thermoelectric power generation, cooling, and electronic devices. In one embodiment, the barrier layers of the thermoelectric material are provided from one of AlGaAs and AlAs and the well layers are provided from one of GaAs and AlGaAs. In another embodiment, the alternating layers are provided one of silicon (Si) and silicon-germanium (SiGe), and one of silicon-germanium (SiGe) and Ge (germanium).

As mentioned above, the same layer (for example GaAs layer in a GaAs/AlAs superlattice) can be used as both a "barrier" and a "well" layer in the same superlattice structure. This means that quantum wells for the Γ- and L-valleys in a GaAs/AlAs superlattice (or Δ-valleys in a Si/Ge superlattice) are formed within the GaAs (Si) layers, whereas quantum wells for the X-valleys (or L-valleys in a Si/Ge superlattice) are formed within the AlAs (Ge) layers of the superlattice, in the same superlattice structure. Therefore, using the carrier pocket engineering technique, both GaAs and AlAs layers are used as both the barrier and the well layers so that the thermoelectric coefficients of the GaAs/AlAs superlattice are enhanced after the application of the carrier pocket engineering technique. The same thing is true, of course, for the Si/Ge superlattice.

For example, a superlattice according to the present invention may be made of alternating layers of a first material and a second material, where the first material comprises silicon (Si) and where the second material comprises SiGe or both materials could be SiGe with different Si to Ge stoichiometric ratios.

It has been discovered that the figure of merit ZT for selected quantum well superlattice structures may be enhanced by the process of carrier pocket engineering in which the structures and geometries of a given superlattice system are optimized in such a way that the optimized structure maximizes the value of ZT for the whole superlattice.

BRIEF DESCRIPTION OF THE DRAWINGS

The foregoing features of this invention, as well as the invention itself, may be more fully understood from the following description of the drawings in which:

FIG. 20 is a diagram to show the L-point valleys in the first Brillouin Zone for bulk Si and Ge;

FIG. 21 is a plot of the density of states for electrons as a function of energy relative to the Δ point of bulk Si in a Si(15 Å)/Ge(20 Å) superlattice grown on a (111) oriented $Si_{0.5}Ge_{0.5}$ substrate.

FIG. 21A is a plot of the calculated value of $Z_{3D}T$ as a function of the carrier concentration corresponding to the superlattice of FIG. 21 at a temperature of 300° C.

FIG. 21B is a plot of the bulk energy levels for the materials that are used for the superlattices shown in FIG. 21.

FIG. 22 is a plot of the density of states for electrons in (111) oriented Si/Ge superlattices as a function of energy relative to the Δ point of bulk Si calculated for the subbands in an Si(15 Å)/Ge(40 Å) superlattice grown on a (111) oriented Si substrate.

FIG. 22A is a plot of the calculated value of $Z_{3D}T$ as a function of the carrier concentration corresponding to the superlattice of FIG. 22 at a temperature of 300° C.

FIG. 22B is a plot of the bulk energy levels for the materials that are used for the superlattices shown in FIG. 22.

DETAILED DESCRIPTION OF THE INVENTION

Figure 1:
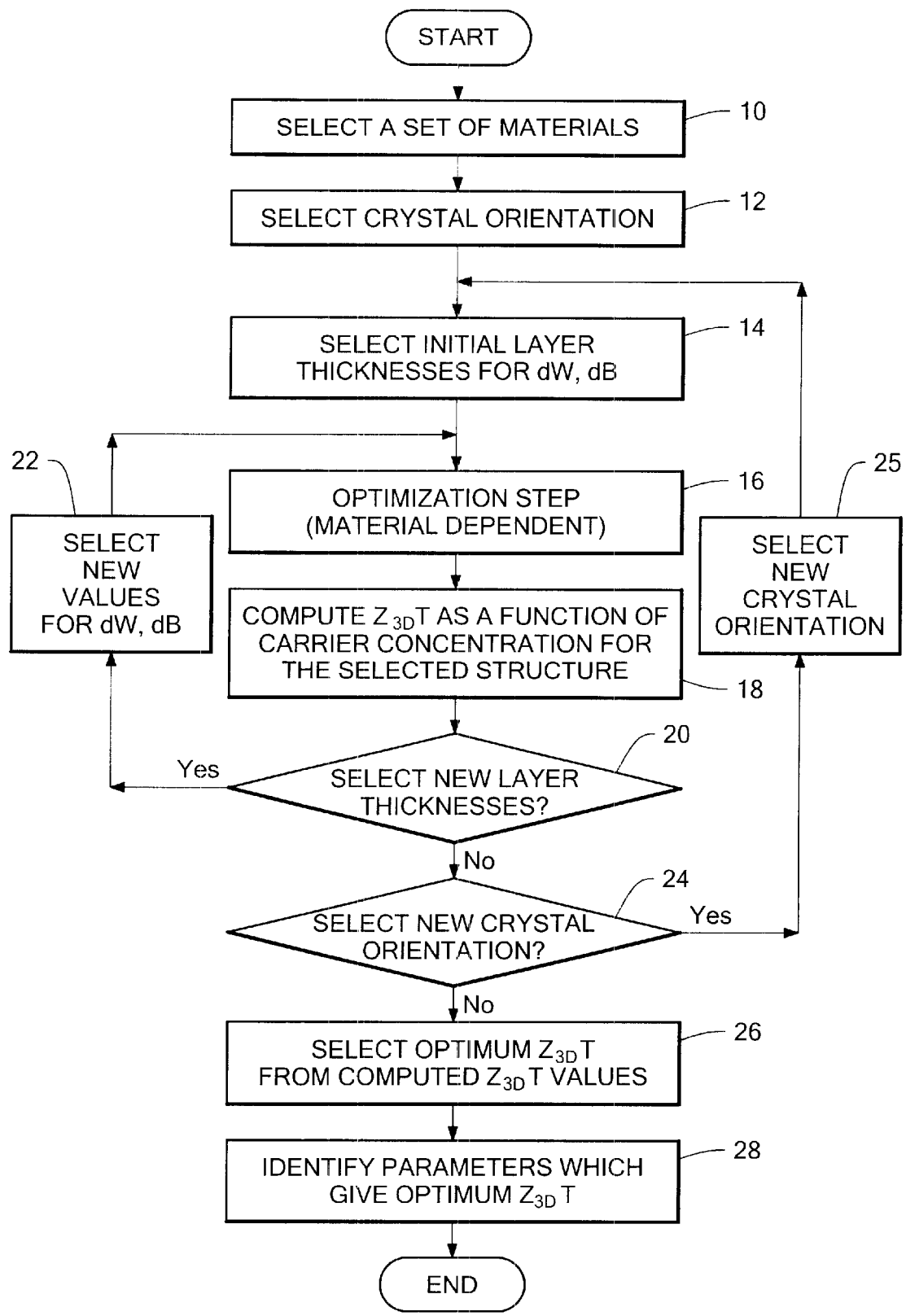
FIG. 1 is flow diagram showing the steps of a carrier pocket engineering technique which is used to optimize the superlattice structures to maximize values of $Z_{3D}T$ using a given set of constituent materials.

Before embarking on a description of the figures, it may first be helpful to explain some introductory concepts and terminology. The present invention relates to a process and concept referred to as carrier pocket engineering which can be used to provide superlattice structures having enhanced values of the three-dimensional thermoelectric figure of merit for the whole superlattice, denoted by $Z_{3D}T$. This concept is applied to GaAs/AlAs superlattices, where it is found that a large enhancement in $Z_{3D}T$ is predicted relative to the corresponding $Z_{3D}T$s for bulk GaAs and AlAs, despite the fact that neither of these constituent materials is a good thermoelectric material in the bulk form ($Z_{3D}T \approx 0.0085$ for both materials). It turns out that the large enhancement in $Z_{3D}T$ is possible only if the structures and the properties of the superlattices are designed carefully in accordance with techniques described herein.

As used herein, the term carrier pocket engineering refers to a technique for enhancing the three-dimensional thermoelectric figure of merit $Z_{3D}T$ through the use of models to predict a figure of merit for isolated quantum wells (denoted $Z_{3D}T$) in conjunction with models to predict a figure of merit for the whole superlattice (denoted $Z_{3D}T$). In one embodiment, this is done using the Kronig-Penney model. The Kronig-Penney model predicts the energy dispersion relations for carriers that propagate in the z-direction (parallel to the superlattice growth direction), i.e., $E_Z$ vs. $k_Z$. Various superlattice parameters including superlattice growth direction, well- and barrier-layer thicknesses ($d_W$ and $d_B$, respectively), carrier concentrations (or equivalently the position of the chemical potential), and material dependent parameters, including quantum wells formed at various high symmetry points in the Brillouin zone are varied to optimize the value of $Z_{3D}T$.

The techniques of the present invention have been used to obtain (using the theoretical models) GaAs/AlAs superlattices having enhanced (or maximum) values of $Z_{3D}T$ at the optimum carrier concentrations for either (001) or (111) oriented GaAs(20 Å)/AlAs(20 Å) superlattices. Such a value of $Z_{3D}T$ for GaAs(20 Å)/AlAs(20 Å) superlattices is about 50 times greater than that for the corresponding bulk GaAs (or AlAs) obtained using the same basic model to predict the values for the thermoelectric figure of merit $Z_{3D}T$.

Carrier pocket engineering techniques have also been used to predict $Z_{3D}T$ for various other $d_W$ and $d_B$'s. Thus, those of ordinary skill in the art should appreciate that the examples provided herein are only for purposes of explanation and are not intended to be limiting.

It is desirable to enhance the dimensionless thermoelectric figure of merit $Z_{3D}T$ ($Z=S^2\sigma/K$), where S is the Seebeck coefficient, C is the electrical conductivity, K is the thermal conductivity, and T is the temperature, for a material in the form of a multiple-quantum-well (MQW) or superlattice structure since this means that conversion of energy from one form to another (e.g. from heat to electricity or vice-versa) may be achieved more efficiently. Superior thermoelectric materials using superlattice structures having thermoelectric figures of merit $Z_{3D}T$ enhanced relative to the corresponding constituent bulk materials can be realized by taking advantage of the enhanced density of states for electrons near the Fermi level (denoted hereafter as the "quantum well approach") as well as by utilizing the potential barriers in the superlattice structures (as realized by the barrier layers) as an effective energy filter to screen out the low energy carriers (denoted hereafter by "potential barrier approach"). The enhanced density of states for electrons near the Fermi level are due to the reduced dimensionality for isolated quantum wells. The potential barrier approach achieves an enhanced value of the Seebeck coefficient that results from the favorable change in the functional form of the relaxation time function $\tau(E)$ as a function of energy, as a result of energy filtering.

In the quantum well approach, the transport coefficients for the samples that are prepared in the form of multiple-quantum-wells are studied along the plane of the quantum wells. In the potential barrier approach, on the other hand, the transport coefficients are usually studied in a direction perpendicular to the layers of the superlattices (i.e., parallel to the superlattice growth direction). The main focus of the present invention is on the utilization of the quantum well approach to design superlattice structures that have enhanced values of $Z_{3D}T$. Occasionally, however, the idea of the potential barrier approach is used, if desirable.

When studying the enhancement of $Z_{2D}T$ (thermoelectric figure of merit within the quantum wells) using the quantum well approach, thick barrier layers are conventionally employed to spatially separate the neighboring quantum wells in order to minimize the overlap of wavefunctions between them. Therefore, in this approach, primary interest has been in the properties of the quantum wells themselves ($Z_{2D}T$) rather than the properties of the whole superlattice ($Z_{3D}T$). The main strategies in the quantum well approach include: (1) enhancing the value of the Seebeck coefficient relative to that for the corresponding bulk material at a given carrier concentration due to the enhanced density of states near the band edge (within the order of $k_BT$) relative to that for the corresponding bulk materials; (2) increasing the lattice thermal resistivity due to the boundary scattering of phonons at the barrier-well interfaces; and (3) enhancing the electron carrier mobility by using the $\delta$- and modulation doping techniques.

The concept of the Carrier Pocket Engineering that can be used to design superlattice structures having relatively large values of the thermoelectric figure of merit (denoted as $Z_{3D}T$ for the whole superlattice) includes the effect of the tunneling of the carriers between the neighboring quantum wells (using the Kronig-Penney model along the superlattice growth axis) and the parasitic thermal conduction in the barrier layers that would decrease the values of $Z_{3D}T$ but which has no effect on the values of $Z_{2D}T$ (thermoelectric figure of merit within the quantum wells). It is noted that the tunneling of carriers between the quantum wells through the barrier layers causes the broadening of the density-of-states function DOS(E) near the band edge, which leads to a two-dimensional to three-dimensional (2D-to-3D) transition in the thermoelectric properties of the superlattices. Hence, although the values of $Z_{3D}T$ for the superlattice tend to increase with decreasing thickness of the constituent layers of the superlattice as far as the effect of tunneling of the carriers between the layers is negligible, thinning the layers of the superlattice beyond some critical thickness which represents the 2D-to-3D transition of the electronic transport properties of the superlattice would actually lead to a reduction of the Seebeck coefficient and of the resultant value of $Z_{3D}T$ for a given carrier concentration due to the broadening of the density of electronic states DOS(E) function near the band edge.

FIG. 1 is a flow diagram illustrating the steps in the carrier pocket engineering technique. Before describing the particular steps in FIG. 1, an overview of the process is given.

In general, the carrier pocket engineering technique is used to provide superlattice structures having enhanced values of $Z_{3D}T$ using a given set of constituent materials.

It should be appreciated that, in general, the optimization process is performed by changing known parameters as to be described. For the simplest case of a one-band bulk material, the only parameter that one can vary at one's will is the chemical potential $\zeta$. For the case of a one-band model for an isolated 2D quantum well, one obtains the freedom of changing the quantum well thickness $d_W$ in addition to the chemical potential $\zeta$, so that the optimum value of the dimensionless thermoelectric figure of merit within the quantum well $Z_{2D}T$ is calculated as a function of $d_W$. It is then shown that the smaller the value of $d_W$, the larger the optimum value of $Z_{2D}T$ in this simple model.

The optimization process gets a little more complicated, if more than one (sub)band are contributing to the thermoelectric transport. However, the optimization process for such a multi-(sub)band system is still conceptually simple if one can change the relative energies for the available (sub)band edges independently. In the case of a two-band model, for example, if it is assumed that the relative energies of the two (sub)bands can be changed freely, one can derive a condition for having the largest value of $Z_{2D}T$ for an isolated quantum well in a two-band model for a given value of $d_W$. In this case, it is found that the value of $Z_{2D}T$ in two-(sub)band systems (or any dimensional ZT in the corresponding two-band systems, including $Z_{3D}T$ and $Z_{1D}T$) becomes a maximum, when the energies of these two (sub)band edges are completely degenerate.

Having known this condition, the problem of getting the largest value of $Z_{3D}T$ using superlattice structures is practically reduced to the problem of developing an experimental methodology to make the available (sub)bands degenerate as much as possible by changing various parameters of the superlattices, such as the values of the quantum well layer thickness ($d_W$) and the barrier layer thickness ($d_B$), and the superlattice growth orientation. More precisely, the value of the optimum $Z_{3D}T$ for a given superlattice system is a function of other properties of the superlattice as well, such as the lattice thermal conductivity and the carrier mobilities of each available (sub)band, in addition to the degeneracy condition mentioned above. Therefore, a number of competing processes will be encountered when optimizing the value of $Z_{3D}T$ using the Carrier Pocket Engineering concept and the resolution of these competing processes in order to obtain the largest value of $Z_{3D}T$ is the achievement of the invention.

The expressions for the Seebeck coefficient S, electrical conductivity $\sigma$, and electronic contribution to the thermal conductivity $K_e$ are very generally given in terms of the transport tensor quantities. The tensor quantities corresponding to the above transport coefficients $\sigma$, S and $K_e$ are denoted by the same symbols, respectively. The electron or hole mobility is denoted $\mu$, and N denotes the number of the equivalent valleys for the band of interest in the first Brillouin zone.

It should again be noted that $Z_{3D}T$ (dimensionless thermoelectric figure of merit for the whole superlattice) is the quantity one would like to ultimately optimize, although the quantity $Z_{2D}T$ (thermoelectric figure of merit within the quantum wells) is sometimes used to illustrate the idea of the optimization process. Occasionally the examples provided herein use such 2D quantities and their variations, because the extension of the model for $Z_{3D}T$ for the whole superlattice is based on the models for $Z_{2D}T$ for isolated quantum wells. Thus, the knowledge acquired in studying the optimization condition for $Z_{2D}T$ for one- and two-band materials, should be also useful in considering the optimization process for $Z_{3D}T$ for the whole superlattice, at least qualitatively, as discussed below.

Turning now to FIG. 1, the process of carrier pocket engineering begins in steps 0 and 12 in which a particular material system and a particular crystal orientation are selected. Steps 14–24 implement an optimization loop. In step 14 the initial layer thicknesses $d_W$, $d_B$ are selected.

Processing then proceeds to step 16 in which an optional material dependent optimization step is performed. For example, in the case where the superlattice is comprised of silicon (Si) and germanium (Ge), step 16 may include the step of selecting a lattice strain. Alternatively, if the superlattice comprises PbTe layers, then step 16 could include consideration of the use of polar optical phonon scattering to increase the value of the Seebeck coefficient. Thus, the particular procedure or procedures carried out in step 16 will depend upon the particular materials being used to provide the suplerlattice.

Regardless of whether step 16 is implemented, processing continues to step 18 where $Z_{3D}T$ is computed as a function of carrier concentration for the selected structure. Processing then proceeds to step 20 where a decision is made to select new layer thicknesses $d_W$, $d_B$. If a, decision is made to select new thicknesses, then processing flows to steps 22 and 16, in which new thicknesses are selected and the corresponding $Z_{3D}T$ values are computed. The loop implemented by steps 16–22 is repeated until a decision is made that no further iterations of selecting layer thicknesses (step 22) are needed.

The condition to end the optimization process is that the value of $Z_{3D}T$ is increased to a maximum value. For example, one can change the value of $d_W$ and $d_B$ in such a way that $dw+d_B \equiv d_L$=constant. Then, one can obtain a maximum value of $Z_{3D}T$ for a given $d_L$. Next, these maximum values of $Z_{3D}T$ as a function of $d_L$ can be examined. Finally, the true maximum value of $Z_{3D}T$ and the corresponding well-and barrier-thicknesses, $d_W$ and $d_B$, can be obtained.

Processing then proceeds to step 24 where a decision is made to select a new crystal orientation. If a decision is made to select a new crystal orientation, then processing flows to step 25 where a new crystal orientation is selected and then processing steps 14–20 are repeated for the new crystal orientation. The loop implemented by step 24 is repeated until decision is made that no further iterations of crystal orientation are needed. Practically, the number of choices for the crystal orientation for the superlattice growth is not large (typically, only a few orientations are possible for the practical growth of a superlattice). Therefore, all of these practical crystal orientations should be examined in step 25.

When the decision is made in step 24 not to select a new crystal orientation, the optimum $Z_{3D}T$ values are selected from the $Z_{3D}T$ values computed in step 18 and in step 28 in the above iteration loops, the values of $d_W$ and $d_B$ which give the optimum $Z_{3D}T$ values are identified. At this point, the characteristics of the superlattice (including but not limited to layer thicknesses for $d_W$, $d_B$, number of periods, dopant concentrations, crystal orientation) which yield the optimum $Z_{3D}T$ are known and the superlattice structure can be fabricated.

As discussed in conjunction with step 14 above, the first step in implementing the superlattice design strategy using the concept of Carrier Pocket Engineering is the selection of materials for the constituent layers of the superlattice.

The constituent materials for the superlattice are selected from those that have large values of $B_X$ quantities (x=3D, 2D or 1D) (large values of the density-of-states effective mass and of the carrier mobility, and a small value of the lattice thermal conductivity). The equations to compute $B_X$ are found in Takaaki Koga, "*Concept and Application of Carrier Pocket Engineering to Design Useful Thermoelectric Materials Using Superlattice Structure*", PhD thesis, Harvard University, April 2000. Division of Engineering and Applied Sciences (hereinafter the "Koga thesis").

The materials that have a large value of the density-of-state mass and a large value of the carrier mobility at the same time are usually realized by both having a multiple number of equivalent valleys in the Brillouin zone for the pertinent conduction or valence band and having a large anisotropy in the constant energy ellipsoids for these valleys. The multiplicity in the number of equivalent valleys is directly proportional to the value of $B_X$ (x=1D, 2D, 3D), and a large anisotropy in the constant energy surfaces provides large values in the following mass ratio that is also proportional to the value of $B_X$ for a given value for the relaxation time $\tau$, $$\frac{(m_x m_y)^{\frac{1}{2}}}{m^*_{trp}} \equiv \frac{(m_x m_y)^{\frac{1}{2}}}{2}\left(\frac{1}{m_x}+\frac{1}{m_y}\right),$$

for isolated 2D quantum wells, and $$\frac{(m_x m_y m_z)^{\frac{1}{2}}}{m^*_{trp}} \equiv \frac{(m_x m_y m_z)^{\frac{1}{2}}}{3}\left(\frac{1}{m_x}+\frac{1}{m_y}+\frac{1}{m_z}\right),$$

for 3D bulk materials.

In the latter equations, $m_x$, $m_y$ and $m_z$ are x, y and z components of the diagonalized effective mass tensor (by rotating the coordinate axes), respectively, and $m^*_{trp}$ is the directionally-averaged transport effective mass for the set of pertinent equivalent valleys. Assuming that the density of states effective mass $((m_x m_y)^{1/2}$ for 2D $(m_x m_y m_z)^{1/3}$ for 3D is kept constant, large values of such mass ratios (as defined in the above equations) contribute to increasing the values of $B_X$ (x=1D, 2D, 3D), since the carrier mobility $\mu$ is inversely related with the transport effective mass $m^*_{trp}$.

Another factor that determines the value of $B_X$ (x=1D, 2D, 3D) is the lattice thermal conductivity $K_{ph}$. A small lattice thermal conductivity $K_{ph}$ increases the value of $B_X$ (x=1D, 2D, 3D). Small values of $K_{ph}$ are usually realized in materials that consist of heavy atoms (since such crystals usually have relatively small sound velocities) or by alloying the material with atoms that have the same valence state as the host material (isoelectronic alloying) to increase the alloy scattering of phonons. However, to achieve the goal of enhancing the value of $Z_{3D}T$ using superlattice structures in accordance with the present invention, the values of lattice thermal conductivity $K_{ph}$ can be controlled by the structural properties of the superlattice. This strategy utilizes the fact that the phonon mean free path l is limited by the thicknesses of the well- and barrier-layers (denoted by $d_W$ and $d_B$, respectively). The technique of reducing the value of $K_{ph}$ through the structural design of the superlattice is denoted as "lattice engineering" or "phonon engineering."

Figure 2:
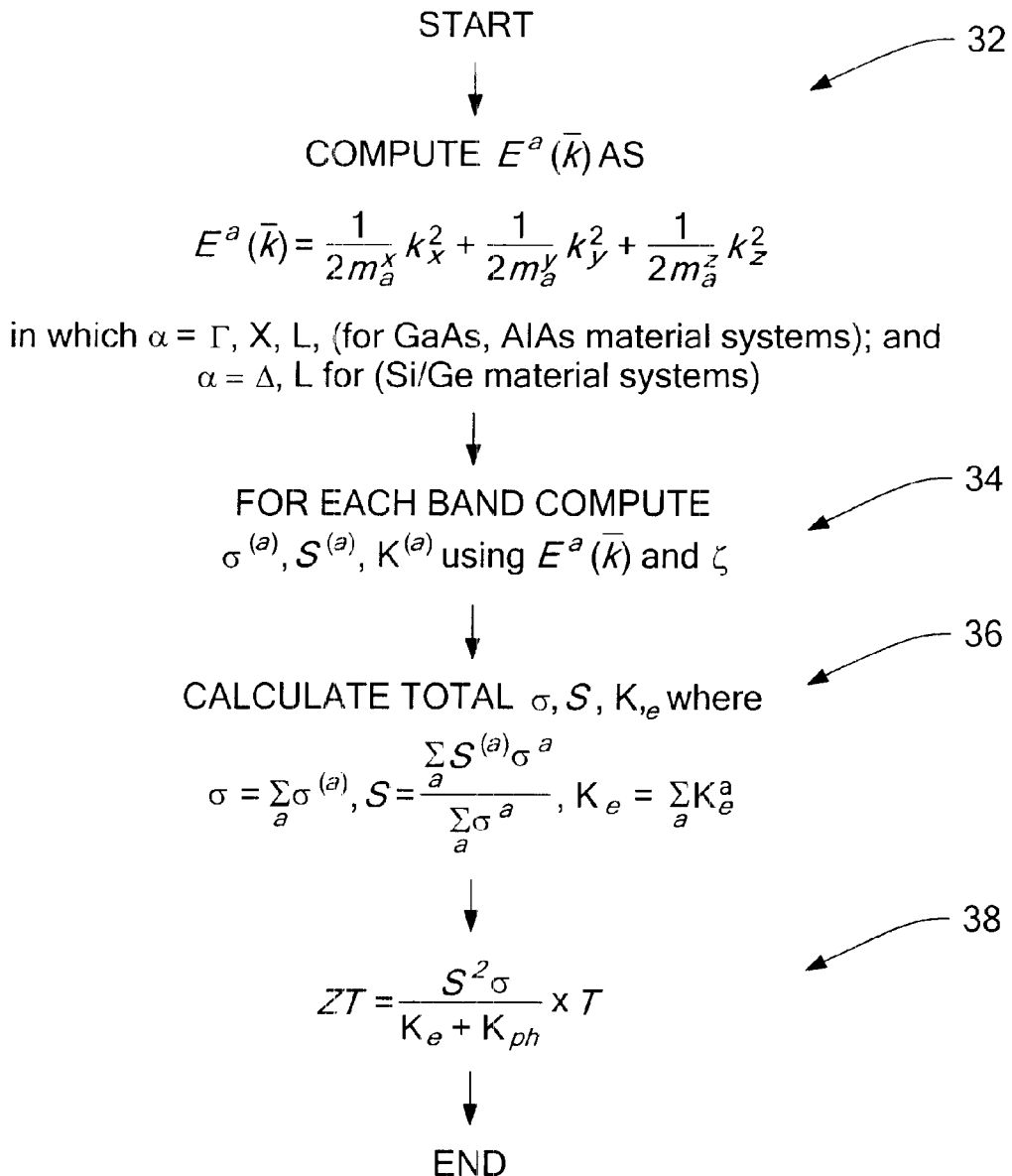
FIG. 2 is flow diagram showing the steps to compute a thermoelectric figure of merit.

FIG. 2 shows the steps to compute $Z_{3D}T$ as a function of carrier concentration for a selected structure. Processing begins in step 32 in which $E^\alpha(\vec{k})$ is computed as $$E^\alpha(\vec{k}) = \frac{1}{2m_\alpha^x}k_x^2 + \frac{1}{2m_\alpha^y}k_y^2 + \frac{1}{2m_\alpha^z}k_z^2$$

in which $\alpha = \Gamma$, X, L (for GaAs/AlAs materials systems) and $\alpha = \Delta$, L for (Si/Ge materials systems).

Processing then proceeds to step 34 where for each band, values for $\sigma^{(\alpha)}$, $S^{(\alpha)}$, $K_e^{(\alpha)}$ are computed using $E^\alpha(k)$ and $\zeta$ (chemical potential).

Processing then proceeds to step 36 where computations for the total $\sigma$, $S$, $K_e$ values are made where $$\sigma = \sum_\alpha \sigma^{(\alpha)}, \quad S = \frac{\sum_\alpha S^{(\alpha)} \sigma^\alpha}{\sum_\alpha \sigma^\alpha}, \quad K_e = \sum_\alpha K_e^\alpha$$

Next, in processing step 38 ZT is computed as:

$$ZT = \frac{S^2 \sigma}{K_e + K_{ph}} \times T$$

in which:

T=temperature $K_e$=electronic contribution to the thermal conductivity; and $K_{ph}$=an experimental value for the lattice thermal conductivity As shown in steps 18–22 of FIG. 1, the second step in the implementation of the concept of Carrier Pocket Engineering is to look at the higher energy valleys (or lower energy valleys for p-type materials) that do not contribute to the thermoelectric transport in the bulk form, but which may be made to contribute to the thermoelectric transport in the form of a superlattice as a result of the application of the carrier pocket engineering concept. For the limiting cases of x=0 (pure GaAs) and x=1 (pure AlAs), it is found that the conduction band minima lies at the Γ- and X-points in the Brillouin zone, respectively. These Γ- and X-valleys are the valleys, in the bulk form, that contribute to the transport properties in GaAs and AlAs, respectively, with n-type doping.

On the other hand, when designing superlattice structures for enhanced values of $Z_{3D}T$, one should not exclude the possibility of having all the available Γ-, L- and X-valleys made to contribute to the thermoelectric transport for the whole superlattice. Shown in Table 1 are the bulk band parameters for GaAs and AlAs that are determined for each valley type (Γ-, L- or X-valleys) separately, together with the values of $B_{3D}$ as defined in Appendix A of the Koga Thesis and the optimum values of $Z_{3D}T$, calculated using these band parameters for each valley minima.

TABLE 1

| Material | GaAs | AlAs | Ga$_{0.55}$Al$_{0.45}$As |
|---|---|---|---|
| Parameters for Γ valley (N = 1) | | | |
| m$^\Gamma$/m (effective mass) | 0.067 | 0.150 | 0.104 |
| m$_{trp}^\Gamma$/m (transport mass) | 0.067 | 0.150 | 0.104 |

TABLE 1-continued

| Material | GaAs | AlAs | Ga$_{0.55}$Al$_{0.45}$As |
|---|---|---|---|
| $\mu_\Gamma$ [cm$^2$/V · s](electron mobility) | 3000 | 2200 | 700 |
| $E_g^\Gamma$ [eV] | 1.424 | 2.96 | 1.985 |
| $B_{3D}^\Gamma \sim (m^\Gamma)^{3/2} \frac{\mu_\Gamma}{K_{ph}}$ | 7.96 × 10$^{-4}$ | 9.47 × 10$^{-4}$ | 1.46 × 10$^{-3}$ |
| $Z_{3D}^\Gamma T$ | 0.00850 | 0.0101 | 0.0155 |
| Parameters for L valley (N = 4) | | | |
| m$_t^L$/m (transverse component) | 0.0754 | 0.0964 | 0.0849 |
| m$_l^L$/m (longitudinal component) | 1.9 | 1.9 | 1.9 |
| $m_{trp}^L / m \left[ \frac{m}{m_{trp}^L} = \frac{m}{3}\left(\frac{2}{m_t^L} + \frac{1}{m_l^L}\right) \right]$ | 0.111 | 0.141 | 0.124 |
| $\mu_L$ [cm$^2$/V · s](electron mobility) | 950 | 320 | 100 |
| $E_g^L$ [eV] | 1.705 | 2.41 | ~2.0 |
| $B_{3D}^L \sim N\{(m_t^L)^2 m_l^L\}^{1/2} \frac{\mu_L}{K_{ph}}$ | 6.04 × 10$^{-3}$ | 1.26 × 10$^{-3}$ | 2.89 × 10$^{-3}$ |
| $Z_{3D}^L T$ | 0.0610 | 0.0134 | 0.0301 |
| Parameters for X valley (N = 3) | | | |
| m$_t^X$/m (transverse component) | 0.23 | 0.19 | 0.212 |
| m$_l^X$/m (longitudinal component) | 1.3 | 1.1 | 1.21 |
| $m_{trp}^X / m \left[ \frac{m}{m_{trp}^X} = \frac{m}{3}\left(\frac{2}{m_t^X} + \frac{1}{m_l^X}\right) \right]$ | 0.317 | 0.262 | 0.292 |
| $\mu_X$ [cm$^2$/V · s](electron mobility) | 400 | 180 | 75 |
| $E_g^X$ [eV] | 1.91 | 2.168 | 1.985 |
| $B_{3D}^X \sim N\{(m_t^X)^2 m_l^X\}^{1/2} \frac{\mu_X}{K_{ph}}$ | 4.81 × 10$^{-3}$ | 7.97 × 10$^{-4}$ | 3.24 × 10$^{-3}$ |
| $Z_{3D}^X T$ | 0.0492 | 0.00852 | 0.0337 |

TABLE 2

| Property at 300 K | GaAs | AlAs | Ga$_{0.55}$Al$_{0.45}$As |
|---|---|---|---|
| Lattice constant a [Å] | 5.6533 | 5.6611 | 5.6568 |
| Specific heat C$_p$ [Jm$^{-3}$K$^{-1}$] | 1.795 | 1.732 | 1.766 |
| Speed of sound | | | |
| V$_{[100]}$ (∥ to [100]) [×10$^3$m/s] | 4.76 | 5.7 | 5.13 |
| V$_{[110]}$ (∥ to [110]) [×10$^3$m/s] | 5.26 | 6.2 | 5.64 |
| V$_{[111]}$ (∥ to [111]) [×10$^3$m/s] | 5.42 | — | — |
| K$_{ph}$ [Wm$^{-1}$K$^{-1}$] | 44.05 | 90.91 | 10.91 |
| Phonon mean free path | | | |
| $l_{[100]}$ (∥ to [100]) [Å] | 155 | 276 | 36 |
| $l_{[110]}$ (∥ to [110]) [Å] | 140 | 254 | 33 |

There are two reasons why the values for $Z_{3D}T$ for the actual GaAs/AlAs superlattices should be enhanced relative to those for the corresponding 3D materials. The first reason is that the lattice thermal conductivity $K_{ph}$ for the superlattice is greatly reduced relative to the corresponding bulk values that are given in Table 2. It is shown below that the value of $K_{ph}$ for a GaAs(20 Å)/AlAs(20 Å) superlattice is 7.3 W/m·K, which is a factor of 6 and 12 reduction relative to $K_{ph}$ for bulk GaAs and AlAs, respectively. Therefore, if one incorporates the effect of boundary scattering of phonons into the model of 3D degenerate bands, where the values of $B_{3D}^\alpha$ ($\alpha = \Gamma$, L and X) in Table 1 are simply added together to yield the total $B_{3D}^{total}$ for the superlattice using the bulk values for the lattice thermal conductivity, the "effective" values of $B_{3D}{}^{total}$ for the model superlattice system after incorporating the effect of boundary scattering of phonons increase by factors of 6 and 12 for GaAs and AlAs, respectively. This new model including the effect of boundary scattering of phonons is denoted by "degenerate 3D superlattice limit" (in the sense that the electronic properties of the superlattice are still three-dimensional). The second reason that larger values of $Z_{3D}T$ should be obtained in the actual GaAs/AlAs superlattices than those in the degenerate 3D bulk limit comes from the quantum confinement effect for the conduction carriers, which tends to increase the value of the Seebeck coefficient for a given carrier concentration. To estimate the upper bound for such a quantum confinement effect for the conduction carriers, a so-called "degenerate 2D superlattice limit" can be defined by the following conditions: (1) the conduction carriers are completely confined in each conduction layer (therefore, the DOS(E) function for each subband contributing to the thermoelectric transport is a step function; (2) the value of $K_{ph}$ is reduced due to the boundary scattering of phonons; and (3) all the available subbands are degenerate with one another, meaning that they have the same energy. Since all the carriers are completely confined in the well layers in the degenerate 2D superlattice limit, one can estimate the figure of merit for the whole superlattice ($Z_{3D}T$), where the contributions from all the available conduction band valleys are summed together.

The third step in the implementation of the Carrier Pocket Engineering concept is the actual design of a specific structure for the system of choice. As shown in steps 26, 28 of FIG. 1, the specific structure corresponds to that structure which yields the preferred value of $Z_{3D}T$. The actual design of the superlattice is closely related to the properties of the constituent materials themselves.

An example of the actual implementation of the Carrier Pocket Engineering concept using GaAs/AlAs superlattices is next described. GaAs/AlAs superlattices grown by MBE are generally of high quality and have interfaces that are often controlled on an atomic scale. The fact that high quality superlattices can be grown out of GaAs and AlAs is partially due to the nearly perfect lattice matching (lattice mismatch=0.14%) at the interfaces between GaAs and AlAs (see Table 2).

The possibility of having high quality samples in this system provides good opportunities to test experimentally the theoretical predictions that are made. GaAs and AlAs, or more generally most III–V materials, have a zinc-blende crystal structure whose Bravais lattice is a face-centered cubic (fcc).

Figure 3A:
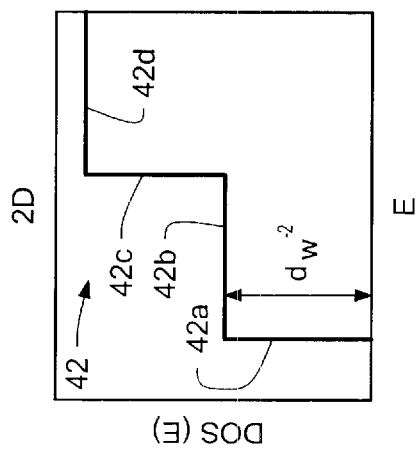
FIGS. 3–3B are a series of plots showing the electronic density of states (DOS) vs. conduction band energy (E).
Figure 3:
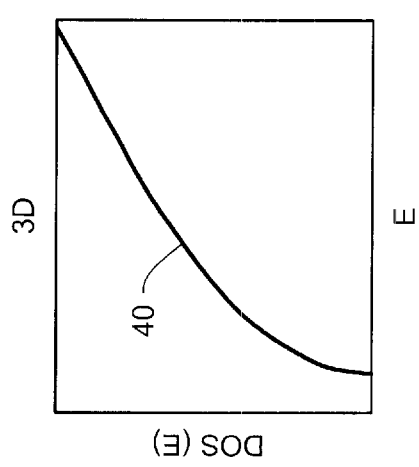
Figure 3B:
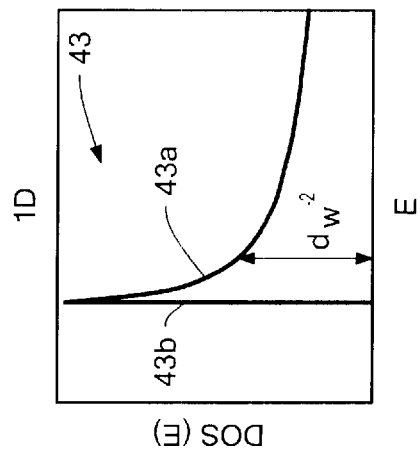

FIGS. 3–3B are plots of the density of states (DOS) vs. energy E for the case of 3D, 2D and 1D, respectively. FIG. 3 shows that DOS~$E^{1/2}$ for a 3D material where the size of the sample has no effect on the values of the DOS. FIGS. 3A and 3B show that DOS~$d_W^{-1}$ and ~$d_W^{-2} E^{-\frac{1}{2}}$ for 2D and 1D materials, respectively, where the DOS of electrons is shown to be dependent on the size (thickness) of the quantum wells and wires (denoted as $d_W$) for the case of 2D and 1D materials.

Figure 4:
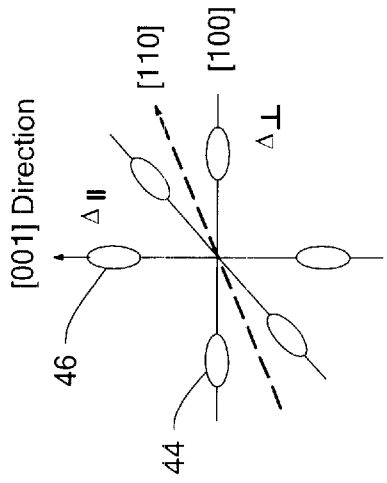
FIG. 4 is a diagram of a lattice coordinate system showing the [001], [100], [110] directions.

FIG. 4 is a sketch of a lattice coordinate system showing the [001], [100], [110] directions and the positions of the $\Delta$-valleys that are both parallel and perpendicular to the directions of the superlattice growth axis. Also shown in FIG. 4 are the carrier pockets 44, 46. Carrier pockets 46 exist along the $\Delta_\|$ axis while carrier pockets 44 exist in the plane perpendicular to the $\Delta_\|$ axis.

Figure 5A:
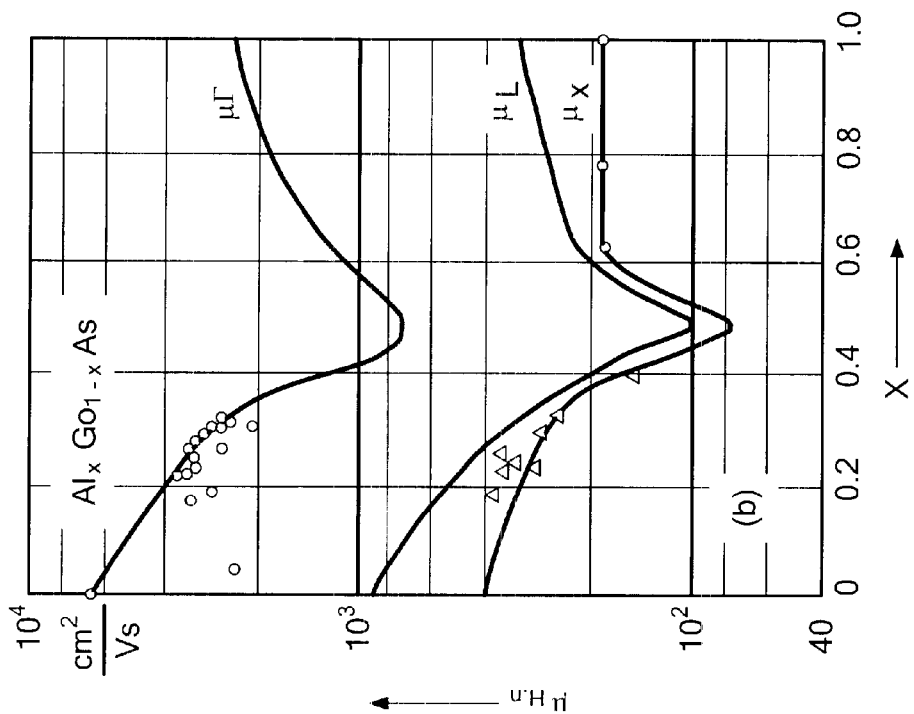
FIG. 5A is a plot showing the decomposition of the electron Hall mobility into the contributions of the Γ-, L-, and X-minima deduced from the Hall measurements at atmospheric and high pressures.
Figure 5:
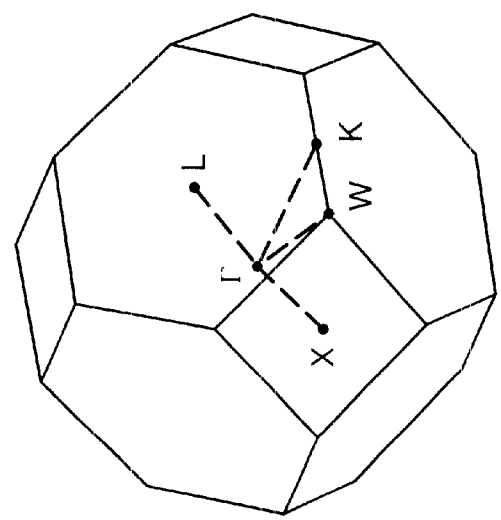
FIG. 5 is a diagram showing the first Brillouin zone for face-centered cubic crystals showing pertinent high symmetry points.

Referring briefly to FIG. 5, the first Brillouin zone for a face-centered cubic crystal (fcc) lattice is shown together with the symbols $\Gamma$, L, X, K and W that denote various high symmetry points in the first Brillouin zone. In GaAs and AlAs (and other III–V compounds) the conduction band extrema lie at the $\Gamma$-, L- and X-points in the Brillouin zone. It should be noted that the relative orders in energy among these three valley types for pure GaAs and AlAs are opposite: (from low energy to high energy) $\Gamma \rightarrow L \rightarrow X$ for GaAs and $X \rightarrow L \rightarrow \Gamma$ for AlAs. It should be noted also that the $\Delta$ point in FIG. 4 is an intermediate point between $\Gamma$ and X, and the conduction band extreme for the III–V compounds are at the X point, a limiting case of the $\Delta$ point which applies to Si.

In FIG. 5A, a plot showing the decomposition of the electron Hall mobility into the contributions from the $\Gamma$-, L- and X-minima, deduced from the Hall measurements at atmospheric and high pressures is shown. One way to choose the values for the electron carrier mobilities for each existing subband (band minima), for the optimization process in the carrier pocket engineering technique, is from this kind of experimental study, where the experimental Hall mobility is decomposed into the contributions from each subband. Other methods include theoretical estimation of $\mu$'s for each subband.

It should be noted that various electronic properties associated with these existing valley types are determined separately by various experimental and theoretical techniques. For example techniques such as optical absorption/transmission spectroscopy, Hall coefficient measurement under atmospheric and high pressures, and theoretical band calculations are used. The bulk properties of n-type semiconductors are governed by the lowest energy conduction band extremum, i.e., the $\Gamma$-valley for GaAs and X-valleys for AlAs.

The thermoelectric properties for these constituent materials (i.e. GaAs and AlAs) are generally poor. This is because of the large values of lattice thermal conductivity $K_{ph}$ (44 W/m·K and 91 W/m·K for GaAs and AlAs, respectively, at 300° K.), and the small value of the density-of-states mass for GaAs ($m_\Gamma^*/m$=0.067), or the small value for the carrier mobility for AlAs ($\mu_x$=180 cm$^2$/V·s). These values are shown in Tables 1 and 2.

Either of these combinations (a large value for $K_{ph}$ and a small value for $m_\Gamma^*$, or a large value for $K_{ph}$ and a small value for $\mu_x$ leads to a small value of $Z_{3D}T$ for these materials as shown in Table 1. Enhancements in $Z_{3D}T$ would be expected if GaAs is mixed with AlAs to form a solid solution of $Ga_{1-x}Al_xAs$ alloys, because the energies for the valley edges at the $\Gamma$-, L- and X-points in the Brillouin zone become very close to one another for x≈0.45 in the $Ga_{1-x}Al_xAs$ alloy. Moreover, the lattice thermal conductivity $K_{ph}$ for $Ga_{1-x}Al_xAs$ alloys is found to be strongly reduced, due to the alloy scattering of phonons, relative to the corresponding bulk values for pure GaAs and AlAs solids. Therefore, an enhancement in the figure of merit $Z_{3D}T$ in $Ga_{1-x}Al_xAs$ alloys is also expected through the reduction of the lattice thermal conductivity $K_{ph}$.

It turns out, however, that $Ga_{1-x}Al_xAs$ alloys are not good thermoelectric materials. This is because the carrier (electron) mobility $\mu$ for $Ga_{1-x}Al_xAs$ alloys is significantly reduced due to the increased inter-valley scattering and the alloy scattering of the carriers as x (in $Ga_{1-x}Al_xAs$) approaches 0.45, where the energies of all the valley edges become very close to one another (see FIG. 5A). Because of such reductions in $\mu$, the resultant value for $Z_{3D}T$ for $Ga_{1-x}Al_xAs$ alloys (x≈0.45) is not as large as anticipated. For example, calculated $Z_{3D}T$ at 300° K. is 0.076 assuming that all the available valleys are degenerate (see Table 1).

This is despite the complete degeneracy among all the Γ-, L- and X-valley types (at least in the model that is used in the present discussion) for $Ga_{1-x}Al_xAs$ alloy (x=0.45), as well as the large reduction in the lattice thermal conductivity $K_{ph}$ due to the alloy scattering of phonons.

Nevertheless, it should be noted that the value for $Z_{3D}T$ obtained for $Ga_{1-x}Al_xAs$ alloys (x≈0.45) is still significantly larger than the corresponding value for $Z_{3D}T$ for pure GaAs and AlAs crystals, where only the lowest lying Γ- or X-valleys can contribute to the thermoelectric transport, respectively ($Z_{3D}T$=0.0085 at 300° K.). Since the reduction in $\mu$ due to the inter-valley scattering and alloy scattering is the main cause for the poor thermoelectric properties in the $Ga_{1-x}Al_xAs$ alloys, the key idea to make this material system (i.e., the materials composed of GaAs and AlAs) into a good thermoelectric material with enhanced values of $Z_{3D}T$ is to implement some mechanisms that minimize the effect of inter-valley scattering and alloy scattering of the conduction electrons.

If the superlattices are made using GaAs and AlAs constituent materials, quantum wells are formed in both the GaAs and AlAs layers. In this case, the quantum wells formed in the GaAs layers are due to the conduction band offsets at the Γ- and L-valleys in the Brillouin zone and the quantum wells formed in the AlAs layers are due to the conduction band offset at the X-valley in the Brillouin zone. It is, then, possible to separate the carriers in the Γ-, L-valleys from the carriers in the X-valleys in the real space to minimize the inter-valley scattering of the carriers between these valleys by using GaAs/AlAs superlattice structures.

It is noted that the subband energies for the quantum wells at the X- and L-points in the Brillouin zone are increased and decreased, respectively, by making the thickness of the AlAs layers smaller (or by making the thickness of the GaAs layers larger). Therefore, the subband energies for the quantum wells formed at the X- and L-points in the Brillouin zone are easily made close to each other in energy by changing the relative thicknesses of the GaAs and AlAs layers.

In addition, it is also possible to have the energy of the Γ-point subband close to those of the X- and L-point subbands since the small value for the Γ-point effective mass (m*/m=0.067) suggests that the energy for the Γ-point subband can be increased significantly by making the thickness of the GaAs layers sufficiently small (on the order of 20 Å). Therefore, it is believed that at some specific conditions for the GaAs and AlAs layer thicknesses and the superlattice growth orientation, all the subbands derived from the Γ-, X-, and L-valleys in the Brillouin zone become nearly degenerate with one another. Therefore, the "carrier pocket engineering condition" can be achieved in GaAs/AlAs superlattices, which leads to a significant enhancement in $Z_{3D}T$ relative to that for the corresponding bulk materials. The carrier pocket engineering condition, is defined as the condition that all subbands derived from the Γ-, X-, and L-valleys in the Brillouin zone become nearly degenerate with one another. It should, however, be appreciated that the term "carrier pocket engineering technique" refers to the systematic methodology to realize the "carrier pocket engineering condition" using superlattice structures.

It is known that the lattice thermal conductivity $K_{ph}$ is greatly reduced in GaAs/AlAs superlattices relative to those for bulk GaAs or AlAs. It was found that the value for $K_{ph}$, for GaAs/AlAs superlattices with equal thicknesses for the GaAs and AlAs layers ($d=d_{GaAs}=d_{AlAs}$), decreases with decreasing thickness d of the layers and $K_{ph}$ approaches the value of $K_{ph}$ for $Ga_{1-x}Al_xAs$ alloys with x≈0.5 below d=50 Å. At present, it is not clear whether the value for the lattice thermal conductivity for the superlattices can be smaller than that for $Ga_{1-x}Al_xAs$ alloy (x≈0.5), though some theoretical and experimental results suggest that it is indeed possible. It was found that the measured lattice thermal conductivities of the GaAs/AlAs superlattices ($d_{GaAs}=d_{AlAs}$) are in qualitative agreement with the kinetic formula where the value for l (phonon mean free path) is substituted by the value of $d_{GaAs}$ (or $d_{AlAs}$). Listed in Table 2 above are the parameters needed for the estimation of $K_{ph}$ for the GaAs/AlAs superlattices. The equation for the kinetic formula is given as:

$$K_{ph}=1/3C_v \cdot v \cdot l$$

where $C_v$=specific heat v=sound velocity l=phonon mean free path

Detailed modeling of the lattice thermal conductivity $K_{ph}$ of superlattice, based on the Boltzmann transport equation, is available for GaAs/AlAs superlattices. The model includes the interface scattering parameter p which represent the degree of specularity at the GaAs/AlAs interfaces for the phonon scattering. In this model, p=1 implies that interface scattering at the GaAs/AlAs layer boundaries is completely specular, so that any incoming phonons to the interfaces are either transmitted or reflected without any thermalization. On the other hand, p=0 implies totally diffuse interfaces at the GaAs/AlAs layer boundaries, so that all the phonons colliding at the interfaces are completely randomized.

It has been suggested that the atomic scale roughness at the GaAs/AlAs interfaces causes a significant reduction in the lattice thermal conductivity for the whole GaAs/AlAs superlattice, while it has no significant effect on the scattering of the conduction electrons. Therefore, it is possible to engineer the superlattice material in such a way that it has both a reduced value of $K_{ph}$ and an enhanced value of $\mu$ (electron carrier mobility) at the same time, relative to those for the corresponding bulk materials. This is accomplished by combining the lattice interface engineering technique with other techniques that would enhance the value of $\mu$ such as δ-doping and/or modulation doping techniques.

For the values of $K_{ph}$ obtained by the calculation described above, it has been found that the modeling results fit the experimental results very well for p=0.8. The above modeling results (p=0.8) are used for equal thickness ($d_{GaAs}=d_{AlAs}$) superlattices in the calculation of $Z_{3D}T$ for GaAs/AlAs Γ-point superlattices.

The results for the Γ-point superlattice are given in the Koga thesis as are the results of modeling $K_{ph}$ first published by Prof. Gang Chen at UCLA. Where the optimization of the superlattice structure and the exploration of the conditions for having the "Carrier Pocket Engineering condition" are performed by considering small variations in the superlattice structures from its optimum GaAs(20 Å)/AlAs(20 Å) structure, one can use $K_{ph}$=7.3 W/m·K for the value of the lattice thermal conductivity for the whole superlattice in the calculation, which is the value of $K_{ph}$ for the GaAs(20 Å)/AlAs(20 Å) superlattice.

As described above in conjunction with FIG. 2, to calculate the various transport coefficients and the thermoelectric figure of merit for the whole superlattice $Z_{3D}T$, the following equation is used:

$$E(k_x, k_y, k_z) = \frac{\hbar^2 k_x^2}{2m_x} + \frac{\hbar^2 k_y^2}{2m_y} + E_z(k_z)$$

where the z axis is here taken to be parallel to the superlattice growth axis, the y axis is chosen in such a way that the main axis of the constant energy ellipsoid in the bulk form which is connected with the subband that is now being considered, lies in the $k_y k_z$-plane. The above equation is referred to as "the energy dispersion relation" for each subband that is formed in the superlattice.

The function $E_z(k_z)$ in the last equation is obtained by solving a simple one-dimensional Kronig-Penney model as described below. The derivation of the equation is straightforward and exact, if (1) the principal axes for the constant energy ellipsoid of the pertinent conduction band valley in the bulk form for the quantum well and barrier materials coincide with the choice of the xyz-coordinate axes, and (2) the quantum well and barrier materials that compose the pertinent superlattice have the same values for $m_x$ and $m_y$, i.e., $m_{x,W} = m_{x,B}$ and $m_{y,W} = m_{y,B}$, where subscripts W and B denote the well and barrier layers, respectively. For the general case of $m_{i,W} \neq m_{i,B}$, where i='x' or 'y', the latter equation (i.e. the energy dispersion relation) is not exact even if the principal axes for the constant energy ellipsoids for the corresponding bulk materials coincide with the xyz-axes. The exact form of the energy dispersion relation for the superlattice in this case is given by $$E(k_x, k_y, k_z) = \frac{\hbar^2 k_x^2}{2m_{xW}} + \frac{\hbar^2 k_y^2}{2m_{yW}} + E_z(k_x, k_y, k_z)$$

where $E_z$ is not a function of only $k_z$, but is also a function of all $k_x$, $k_y$ and $k_z$. In the present invention calculations of transport coefficients for GaAs/AlAs superlattices are made using the approximate form of the energy dispersion relation of the penultimate equation, where the $E_z(k_x, k_y, k_z)$ term in the last equation is approximated by $E_z(k_z) \equiv E_z(0, 0, k_z)$.

When the principal axes of the pertinent constant energy ellipsoids do not coincide with the xyz-coordinate, but have a tilted angle with the xyz-coordinate, the tilted ellipsoids are transformed into some equivalent ellipsoids having principal axes which coincide with the xyz-axes. Such transformed ellipsoids are constructed from the projected and cross-sectional ellipses of the original tilted ellipsoid. Such a transformation of the constant energy ellipsoids preserves the volume inside the ellipsoid and hence, the density of states for electron is conserved under such transformations. Also, the transformation provides an exact form for the electronic energy dispersion relation of the superlattice, if the electronic bound states formed in the quantum wells are sufficiently isolated. That is, the transformation provides an exact form for the electronic energy dispersion relation of the superlattice if the potential barrier height for the barrier layer is infinitely high or/and the thickness of the barrier layer is infinitely large so that the overlap of the wavefunctions between the neighboring quantum wells is completely negligible. It is noted that the components of the effective mass tensor $m_x$, $m_y$, and $m_z$ that define the transformed constant energy ellipsoid are given by:

$$m_{t(2D)} = M_{xx}, \quad m_{l(2D)} = M_{yy}$$

and $$m_z^{-1} = (M^{-1})_{zz}$$

That is, $m_{t(2D)}$ and $m_{l(2D)}$ are obtained from the diagonal xx and yy components of the effective mass tensor M for the original tilted constant energy ellipsoid, respectively, and $m_z$ is obtained by the inverse of the diagonal zz component of the inverse effective mass tensor $M^{-1}$ for the original tilted constant energy ellipsoid. Since the projected constant energy ellipse in this transformation is elongated along the $k_y$-axis in the $k_x k_y$-plane in the choice of xyz-coordinate, the values for $m_x$ and $m_y$ in the penultimate equation are given by $m_{t(2D)}$ (transverse component for the 2D effective mass tensor) and $m_{l(2D)}$ (longitudinal component for the 2D effective mass tensor), respectively. Tables 3 and 4, below provide a summary of the formulae that relate the projected effective mass components $m_{t(2D)}$, $m_{l(2D)}$ and the cross-sectional effective mass component $m_z$, as discussed above, to the transverse ($m_t$) and the longitudinal ($m_l$) components of the diagonalized effective mass tensor M for the original tilted constant ellipsoids, for various conduction band valleys found in (001) and (111) oriented GaAs/AlAs superlattices, together with the resultant values for $m_{t(2D)}$, $m_{l(2D)}$ and $m_z$ that are used in the actual calculations of the thermoelectric figure of merit $Z_{3D}T$ as to be described.

Referring now to Table 3, band parameters for various conduction band valleys in (001) oriented GaAs/AlAs superlattices are listed. $\Delta E_{edge}$ denotes the energy for the pertinent conduction valley edge measured from the bottom of the Γ-valley in the conduction band of bulk GaAs and $\Delta E_c$ denotes the conduction band offset for the pertinent valley. $X_l$ and $X_t$ denote the longitudinal (main axis of the ellipsoid parallel to the superlattice growth axis) and the transverse (main axis of the ellipsoid perpendicular to the superlattice growth axis) X-valleys, respectively.

TABLE 3

| Band Parameter | Γ-valley | $X_l$-valley | $X_t$-valley | L-valley |
|---|---|---|---|---|
| Equations that relate $m_{t(2D)}$, $m_{l(2D)}$ and $m_z$; to $m_t$ and $m_l$ | | | | |
| $m_{t(2D)}$ [$M_{xx}$] | $m_t$ | $m_t$ | $m_t$ | $m_t$ |
| $m_{l(2D)}$ [$M_{yy}$] | $m_t$ | $m_t$ | $m_t$ | $\frac{2m_t + m_l}{3}$ |
| $m_z^{-1}$ [$(M^{-1})_{zz}$] | $m_l^{-1}$ | $m_l^{-1}$ | $m_l^{-1}$ | $\frac{1}{3}\left(\frac{1}{m_t} + \frac{2}{m_l}\right)$ |
| Values used in the Present work for GaAs | | | | |
| $m_{t(2D)}/m$ | 0.067 | 0.23 | 0.23 | 0.0754 |
| $m_{l(2D)}/m$ | 0.067 | 0.23 | 1.3 | 1.292 |
| $m_z/m$ | 0.067 | 1.3 | 0.23 | 0.111 |
| Values used in the present work for AlAs | | | | |
| $m_{t(2D)}/m$ | 0.150 | 0.19 | 0.19 | 0.0964 |
| $m_{l(2D)}/m$ | 0.150 | 0.19 | 1.1 | 1.299 |
| $m_z/m$ | 0.150 | 1.1 | 0.19 | 0.141 |
| Other parameters and properties | | | | |
| N | 1 | 1 | 2 | 4 |
| Conduction layer | GaAs | AlAs | AlAs | GaAs |
| $\mu_{bulk}$ [cm$^2$/V · s] | 3000 | 180 | 180 | 950 |
| $\Delta E_c$ [eV] | 1.084 | 0.242 | 0.242 | 0.132 |
| $\Delta E_{edge}$ [eV] | 0 | 0.234 | 0.234 | 0.284 |
| $B_{3D}^*$ | 2.65 × $10^{-2}$ | 4.51 × $10^{-3}$ | 2.17 × $10^{-2}$ | 1.57 × $10^{-1}$ |
| $Z_{3D}^*T$ | 0.102 | 0.0181 | 0.0840 | 0.495 |

Referring now to Table 4, band parameters for various conduction band valleys in (111) oriented GaAs/AlAs superlattices are shown. $\Delta E_{edge}$ denotes the energy for the pertinent conduction band valley edge measured from the bottom of the Γ-valley in the conduction band of bulk GaAs and $\Delta E_c$ denotes the conduction band offset for the pertinent valley. $L_l$ and $L_o$ denote the longitudinal (main axis of the ellipsoid parallel to the superlattice growth axis) and oblique (main axis of the ellipsoid oblique to the superlattice growth axis) L-valleys, respectively.

TABLE 4

| Band Parameter | Γ-valley | X-valley | $L_l$-valley | $L_o$-valley |
|---|---|---|---|---|
| Equations that relate $m_{t(2D)}$, $m_{l(2D)}$, and $m_z$ and $m_z$ to $m_t$ and $m_l$ | | | | |
| $m_{t(2D)}$ [$M_{xx}$] | $m_t$ | $m_t$ | $m_t$ | $m_t$ |
| $m_{l(2D)}$ [$M_{yy}$] | $m_t$ | $\dfrac{2m_t + m_t}{3}$ | $m_t$ | $\dfrac{8m_t + m_t}{9}$ |
| $m_z^{-1}$ [$(M^{-1})_{zz}$] | $m_t$ | $3\left(\dfrac{1}{m_t} + \dfrac{2}{m_t}\right)$ | $m_l$ | $9\left(\dfrac{1}{m_t} + \dfrac{X}{m_t}\right)^{-1}$ |
| Values used in the present work for GaAs | | | | |
| $m_{t(2D)}/m$ | 0.067 | 0.23 | 0.0754 | 0.0754 |
| $m_{l(2D)}/m$ | 0.067 | 0.943 | 0.0754 | 1.697 |
| $m_z/m$ | 0.067 | 0.317 | 1.9 | 0.084 |
| Values used in the present work for AlAs | | | | |
| $m_{t(2D)}/m$ | 0.150 | 0.19 | 0.0964 | 0.0964 |
| $m_{l(2D)}/m$ | 0.150 | 0.797 | 0.0964 | 1.700 |
| $m_z/m$ | 0.150 | 0.262 | 1.9 | 0.108 |
| Other parameters and properties | | | | |
| N | 1 | 3 | 1 | 3 |
| Conduction layer | GaAs | AlAs | GaAs | GaAs |
| $\mu_{bulk}$ [cm$^2$/V · s] | 3000 | 180 | 950 | 950 |
| $\Delta E_c$ [eV] | 1.084 | 0.242 | 0.132 | 0.132 |
| $\Delta E_{edge}$ [eV] | 0 | 0.234 | 0.284 | 0.284 |
| $B_{3D}^*$ | $2.65 \times 10^{-2}$ | $2.77 \times 10^{-2}$ | $9.24 \times 10^{-3}$ | $1.35 \times 10^{-1}$ |
| $Z_{3D}^* T$ | 0.102 | 0.106 | 0.0375 | 0.437 |

Now, for the GaAs/AlAs superlattices, the calculation of the energy dispersion relation along the z axis is carried out for each conduction band valley at various high symmetry points (Γ-, X-, and L-points) in the Brillouin zone. The calculations are carried out separately, using the Kronig-Penney model. Requiring the conservation of the particle (electron) flux along the z axis, the following boundary conditions are applied at the GaAs/AlAs interfaces;

$$\psi_{GaAs} = \psi_{AlAs}$$

$$\frac{1}{m_{z(gaAs)}} \frac{d\Psi_{GaAs}}{dz} = \frac{1}{m_{z(AlAs)}} \frac{d\Psi_{AlAs}}{dz}$$

where $\psi_{GaAs}$ and $\psi_{AlAs}$ denote the electron wavefunction for the pertinent conduction band valley for the GaAs and AlAs layers, respectively, and $m_{z(GaAs)}$ and $m_{z(AlAs)}$ are the cross-sectional components of the effective mass tensor M as discussed above. The energy dispersion relation along the z axis [$E_z(k_z)$] under the boundary conditions given by the last two equations is obtained by numerically solving the following equation for $E_z$ for a given value of $k_z$, $$\frac{1}{2}\left\{\frac{m_{z,w}Q_z}{m_{z,B}K_z} - \frac{m_{z,B}K_z}{m_{z,w}Q_z}\right\} \sinh Q_z d_B \sin K_z d_W + \cosh Q_z d_B \cos K_z d_W =$$

$$\cos k_z(d_w + d_B)$$

where $K_z$ and $Q_z$ are given by, $$K_z = \frac{\sqrt{2m_{z,w}E_z}}{\hbar},$$

$$Q_z = \frac{\sqrt{2m_{z,B}(\Delta E_c - E_z)}}{\hbar}.$$

In the latter equations, $\Delta E_c$ is the conduction band offset for the pertinent valley between the well and barrier layers, $d_W$ is the thickness of the quantum well layers (the thickness of the GaAs layers for the Γ-, L-valleys or the thickness of the AlAs layers for the X-valleys), $d_B$ is the thickness of the barrier layers (the thickness of the AlAs layers for the Γ-, L-valleys or the thickness of the GaAs layers for the X-valleys), $m_{z,W}$ and $m_{z,B}$ are the cross-sectional components of the effective mass tensor along the $k_z$-axis for the quantum well layers and the barrier layers, respectively, as mentioned above.

Once the energy dispersion relations for all the available subbands are obtained in this way, various transport coefficients are calculated using the transport $L^{(\alpha)}$ tensors (($\alpha$=0, 1, 2). Since the in-plane components of the transport $L^{(\alpha)}$ tensors for the whole superlattice are usually isotropic, these tensors are represented by scalar quantities $L_{SL}^{(\alpha)}$. The contribution from each available subband to the total $L_{SL}^{(\alpha)}$ quantities for the whole superlattice (denoted by $L_{SL}^{(\alpha)tot}$, is given by $$L_{SL}^{(\alpha)tot}(\varsigma) = \sum_{\text{available subband}} L_{SL}^{(\alpha)}(\varsigma)$$

and $$L_{SL}^{(\alpha)}(\varsigma) \equiv \sum_{k_z} \tilde{L}_{2D}^{(\alpha)}(\varsigma - E_z(k_z)) = \frac{1}{\tilde{N}_s} \sum_{k_z} L_{2D}^{(\alpha)}(\varsigma - E_z(k_z))$$

in which:

$\tilde{N}_S$ is the number of superlattice periods, and the $L_{2D}^{(\alpha)}$'s are given by $$L_{2D}^{(0)}(\varsigma) = D_{2D} F_0$$

$$L_{2D}^{(1)}(\varsigma) = D_{2D} K_B T (2F_1 - \varsigma^* F_0)$$

$$L_{2D}^{(2)}(\varsigma) = D_{2D} (K_B T)^2 (3F_2 - 4\varsigma^* F_1 + \varsigma^{*2} F_0)$$

where $$D_{2D} = N \times \frac{e}{2\pi(d_W + d_B)} \left(\frac{2k_B T}{\hbar^2}\right) \{m_{l(2D)} m_{l(2D)}\}^{1/2} \mu$$

and the summation is over all the values of $k_z$ that satisfy the periodic boundary condition $\exp(ik_z \tilde{N}_S(d_W+d_B))=1$ in the extended zone scheme ($-\infty < k_z < \infty$). In the present work, the limit $\tilde{N}_S \to \infty$ is taken for ease of the numerical calculation, $$L_{SL}^{(\alpha)}(\varsigma) = \frac{1}{\tilde{N}_s \Delta k_z} \sum_{k_z} L_{2D}^{(\alpha)}(\varsigma - E_z(k_z)) \Delta k_z$$

$$= 2x \frac{(d_n + d_n)}{2\pi} \int_0^\infty L_{2D}^{(\alpha)}(\varsigma - E_z) \frac{dk_z}{dE_z} dE_z$$

where the factor 2 in the last expression comes from the fact that $$L_{2D}^{(\alpha)}(\varsigma - E_z(k_z))$$

is an even function of $k_z$, and $\Delta k_z$ is the interval between the allowed $k_z$ values that satisfy the periodic boundary condition $$\Delta k_z = \frac{2\pi}{N_s(d_W + d_B)}.$$

Since the inverse function of $E_z(k_z)$ has the same functional form as the density of states function DOS(E) because the number of available electronic states within a constant energy interval $\Delta E$ for a given value of the allowed $k_z$ (that satisfies the periodic boundary condition) is constant with energy as well as with the value of $k_z$, the following form for the contribution to the $L_{SL}^{(\alpha)tot}(\varsigma)$ from the pertinent subband is obtained:

$$L_{SL}^{(\alpha)}(\varsigma) = \frac{1}{D_{SL}} \int L_{2D}^{(\alpha)}(\varsigma - E) \frac{dDOS(E)}{dE} dE$$

where $L_{2D}^{(\alpha)}$ is obtained using the superlattice period $(d_W + d_B)$ as in the above equation for $D_{2D}$, DOS(E) is the density of states as a function of energy for the whole superlattice for the pertinent subband, and $D_{SL}$ is the step height in the density-of-states function DOS(E) for the pertinent subband given by, $$D_{SL} = N \times \frac{(m_{l(2D)} m_{l(2D)})^{\frac{1}{2}}}{\pi(d_W + d_B)\hbar^2}.$$

The formalism shown here accounts for the effect of the band edge broadening in the DOS(E) function on the resulting transport coefficients for the whole superlattice for each subband. The final $L_{SL}^{(\alpha)tot}(\varsigma)$ functions for the whole superlattice are obtained by summing together the $L_{SL}^{(\alpha)}$ contributions from all the subbands that are here evaluated separately. Finally, the resulting thermoelectric properties for the whole superlattice, for various superlattice periods and superlattice growth directions, are calculated as a function of carrier concentration and temperature.

By calculating the density of states for the Γ-point subband for GaAs/AlAs superlattices with equal thicknesses for the GaAs and AlAs layers, it is found that the density of states near the band edge increases significantly with decreasing superlattice period ($d_{GaAs}+d_{AlAs}$) from 160 Å to 40 Å. It is noted that the broadening of the Γ-point subband becomes comparable to the thermal energy at room temperature (26 meV) for GaAs(20 Å)/AlAs(20 Å) superlattice. Since the broadening effect in the DOS(E) function near the band edge becomes appreciable for superlattice periods ($d_{GaAs}+d_{AlAs}$) below 40 Å, the resultant Seebeck coefficient for a given carrier concentration ($n=10^{18}$ cm$^{-3}$) has a peak at around ($d_{GaAs}+d_{AlAs}$)=40 Å. The decrease in S with decreasing ($d_{GaAs}+d_{AlAs}$) below 40 Å is interpreted as the result of a 2D-to-3D transition of the electronic transport properties of GaAs/AlAs superlattices that results from the increased carrier tunneling between the adjacent quantum wells formed at the Γ-point in the Brillouin zone (within the GaAs layers in the real space) for GaAs/AlAs superlattices.

The thermoelectric figure of merit for the whole superlattice $Z_{3D}T$ for GaAs/AlAs Γ-point superlattices are calculated by combining the data for $K_{ph}$ as a function of the thicknesses of the GaAs and AlAs layers ($d_{GaAs}+d_{AlAs}$) and the models for the transport coefficients that were earlier described. Values of $\Delta E_c=1$ eV and $\mu=3000$ cm$^2$/V·s are used for the conduction band offset at the Γ-valley and for the carrier mobility, respectively, for the GaAs/AlAs Γ-point superlattices. By plotting the results thus obtained for $Z_{3D}T$ normalized to the corresponding value for bulk GaAs at 300° K. (denoted by $(ZT)_{bulk}$) as a function of $d_W$, where the value of $Z_{3D}T$ is optimized with respect to the chemical potential $\varsigma$ for each value of $d_W$, it can be observed that $Z_{3D}T$ for the GaAs(20 Å)/AlAs(20 Å) Γ-point superlattice is more than 0.1 at the optimum carrier concentration ($n=1.5\times10^{18}$ cm$^{-3}$), whereas $(ZT)_{bulk}$ for bulk GaAs is as small as 0.0085 at the optimum carrier concentration ($n=1.5\times10^{18}$ cm$^{-3}$). This is more than a factor of ten enhancement in $Z_{3D}T$ of the GaAs(20 Å)/AlAs(20 Å) Γ-point superlattice relative to the corresponding value for bulk GaAs. It is noted that an overall enhancement in $Z_{3D}T$ in GaAs(20 Å)/AlAs(20 Å) Γ-point superlattices is realized due to a combination of the effect of the interface scattering of phonons to reduce $K_{ph}$, which accounts for a factor of about six enhancement in $Z_{3D}T$ relative to the corresponding bulk value, and the effect of quantum confinement of carriers to enhance S, which account for a factor of about two enhancement in the overall $Z_{3D}T$ relative to the corresponding bulk value.

FIGS. 6–8A illustrate the concept of carrier pocket engineering as applied to GaAs/AlAs superlattices including the contributions from all of the Γ-, L- and X-subbands. The optimum structures and orientation for the GaAs/AlAs superlattices are determined to obtain the largest value of $Z_{3D}T$ in this system. The temperature dependence of the resultant values of $Z_{3D}T$ for the (001) and (111) oriented GaAs/AlAs superlattices, and the conditions for having the "carrier pocket engineering condition" in these superlattices shall now be described further.

Shown in FIGS. 6 through 8A are the calculated density of states DOS for all the available subbands for (001) oriented GaAs(20 Å)/AlAs(20 Å), GaAs(30 Å)/AlAs(20 Å) and GaAs(20 Å)/AlAs(30 Å) superlattices, respectively. By making a superlattice in the (001) orientation, three of the equivalent valleys at the X-point in the Brillouin zone experience a splitting in their valley degeneracy between one longitudinal (the principal axis of the ellipsoid parallel to the superlattice growth axis) and two transverse (principal axes of the ellipsoid perpendicular to the superlattice growth axis) valleys, denoted by $X_l$ and $X_t$, respectively. The resultant subbands derived from these valleys are also denoted as the $X_l$- and $X_t$-subbands, respectively.

Figure 6:
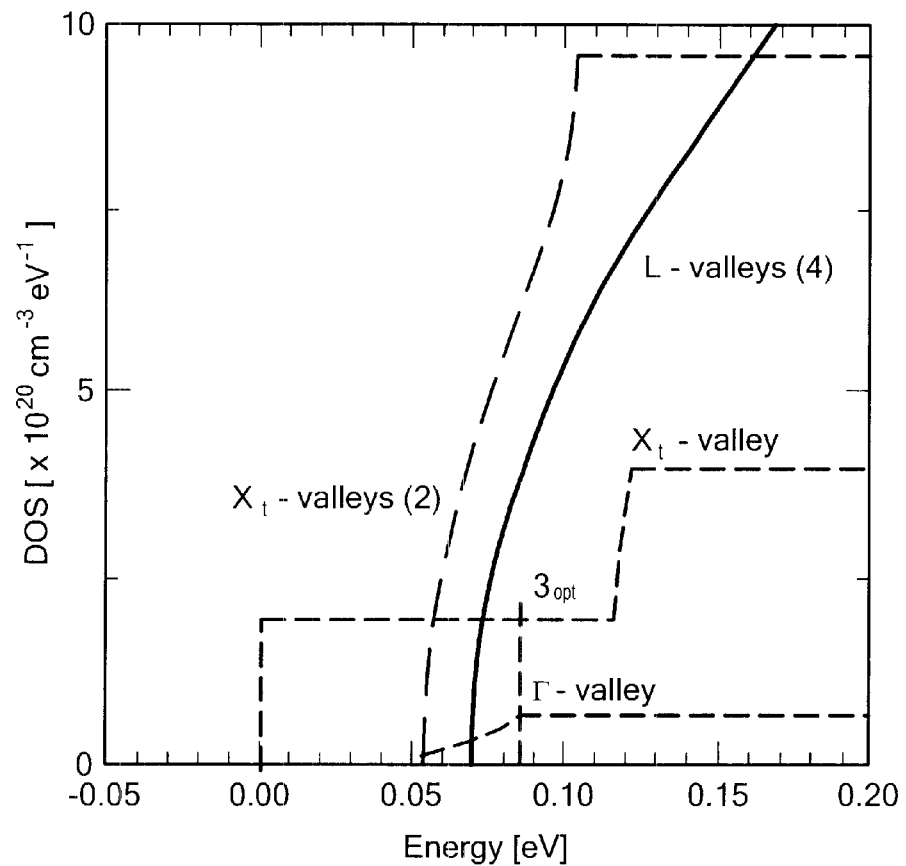
FIG. 6 is a plot of the density of states (DOS) for a superlattice with carrier pockets at the Γ, $X_l X_t$ and L point valleys.
Figure 6A:
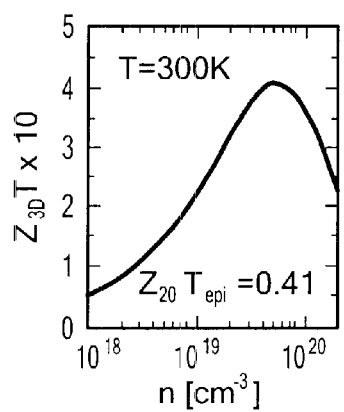
FIG. 6A is a plot for the calculated $Z_{3D}T$ as a function of carrier concentration n for the density of states for a superlattice shown in FIG. 6 at 300° K.

Referring now to FIGS. 6 and 6A, the density of states for electrons DOS(E) for a (001) oriented GaAs(20 Å)/AlAs(20 Å) superlattice calculated for various subbands derived from Γ-, $X_l$-, $X_t$- and L-valleys, as indicated in the figures, are shown. The number inside the parentheses denotes the number of equivalent valleys that are degenerate in energy. For example, the DOS for $X_t$-valleys shown in FIG. 6 includes contributions from two equivalent $X_t$-valleys while the DOS for the L-valleys include contributions from 4 equivalent valleys.

Referring briefly to FIG. 6A, a plot for the calculated $Z_{3D}T$ as a function of carrier concentration n for this superlattice at 300° K. is shown. The position of the chemical potential ζ that gives the optimum value of $Z_{3D}T$ (denoted as $Z_{3D}T_{opt}$) is ζ=0.083 eV on the main scale of FIG. 6.

Examination of FIGS. 6 and 6A, reveals that the Γ-, $X_t$- and L-subbands lie very close in energy in the GaAs(20 Å)/AlAs(20 Å) superlattice, and that the energy for the $X_t$-subband edge is about 50 to 60 meV lower than those for the other subbands. Such a situation doesn't appear to be desirable in obtaining a large value of $Z_{3D}T$, since the mobility for the X-point carriers is relatively low ($\mu_X$=180 cm²/V·s at 300° K.) compared to the mobilities for the carriers in other subbands ($\mu_\Gamma$=3000 cm²/V·s and $\mu_L$=950 cm²/V·s at 300° K.). Nevertheless, it is found that, among all the structures considered here for the (001) oriented superlattices (see FIGS. 6, 7 and 8), the highest $Z_{3D}T$ occurs in the GaAs(20 Å)/AlAs(20 Å) superlattice ($Z_{3D}T$=0.41 at 300° K. for n=5×10¹⁹ cm⁻³). Also shown in the insets of FIGS. 6, 7 and 8 (i.e. FIGS. 6A, 7A, 8A) are the calculated values of $Z_{3D}T$ as a function of carrier concentration for each superlattice structure at 300° K.

Figure 7:
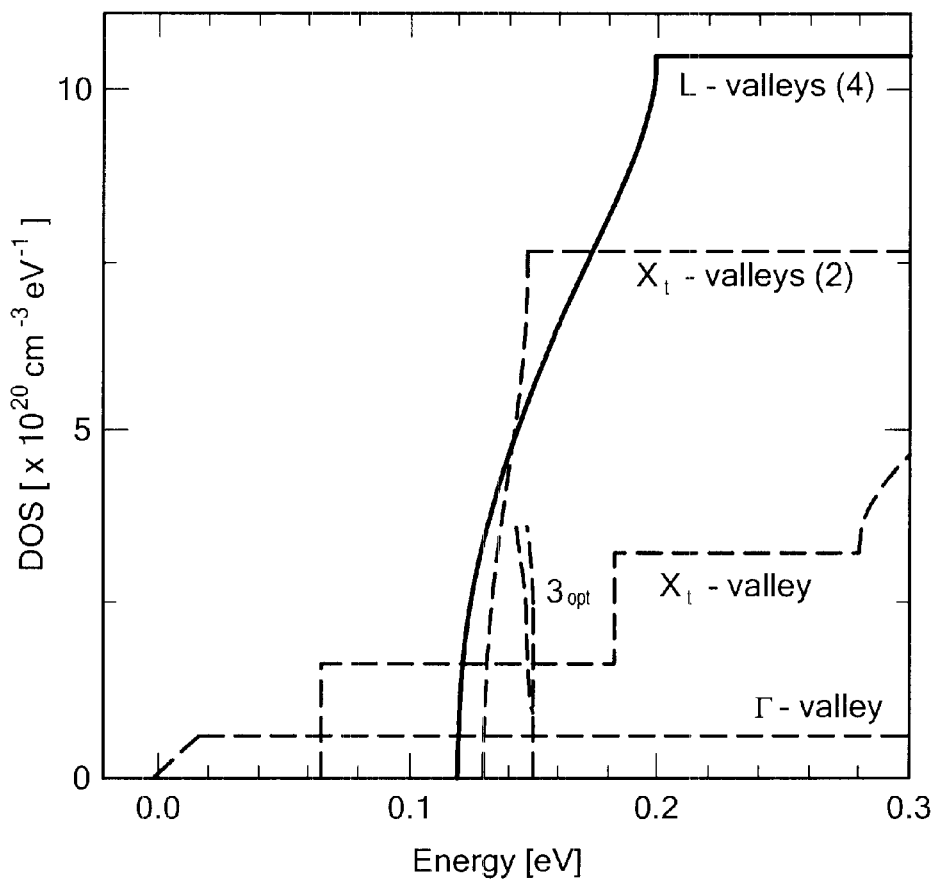
FIG. 7 is a plot showing the density of states for electrons (DOS) for a (001) oriented GaAs(30 Å)/AlAs(20 Å) superlattice calculated for various subbands derived from Γ-, $X_l$-, $X_t$- and L-valleys.

Referring now to FIG. 7, the density of states for electrons DOS(E) for a (001) oriented GaAs(30 Å)/AlAs(20 Å) superlattice calculated for various subbands derived from ζ-, $X_l$-, $X_t$- and L-valleys, as indicated in the figure, is shown. The number inside the parentheses denotes the number of equivalent valleys that are degenerate in energy. For example, the DOS for $X_t$-valleys shown here includes contributions from two equivalent $X_t$-valleys while the DOS for the L-valley includes contributions from four equivalent L-valleys.

Figure 7A:
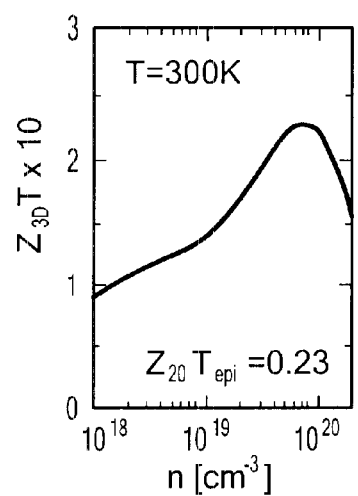
FIG. 7A is a plot for the calculated $Z_{3D}T$ as a function of carrier concentration n for the superlattice corresponding to FIG. 7 at a temperature of 300° K.

Referring now to FIG. 7A, a plot for the calculated $Z_{3D}T$ as a function of carrier concentration n for this superlattice at 300° K. is shown. The reference p denotes the position of the chemical potential ζ that gives the optimum value of $Z_{3D}T$ (denoted as $Z_{3D}T$ (denoted as $Z_{3D}T_{opt}$). In FIG. 7 that value is ζ=0.154 eV as shown on the main scale.

Figure 8:
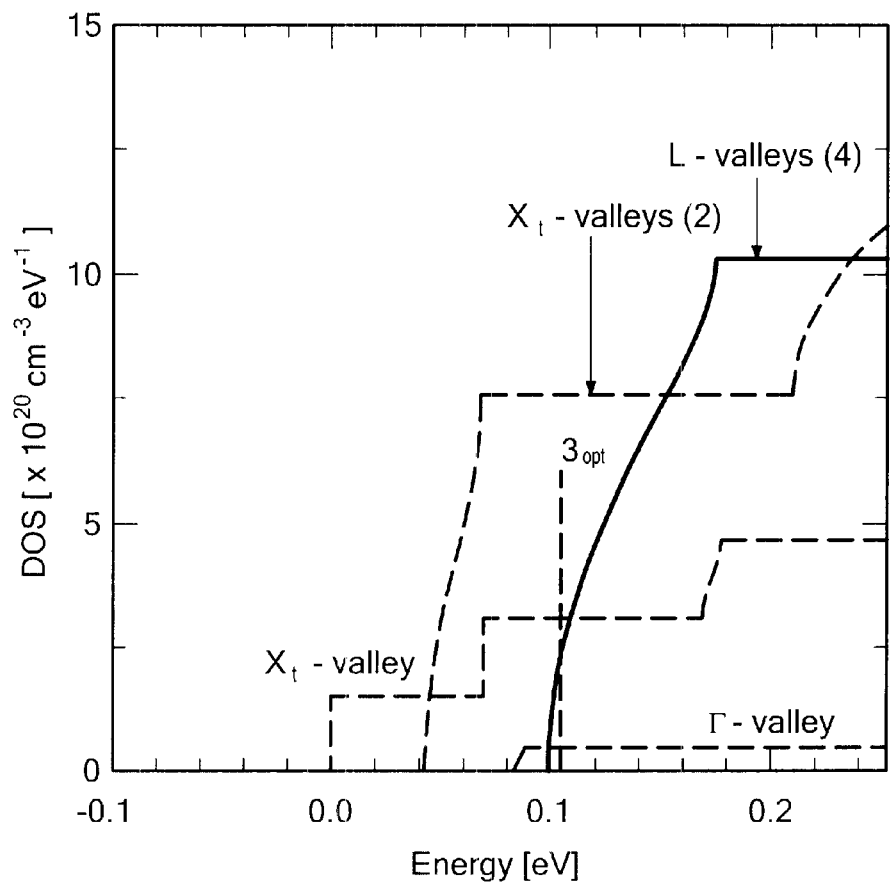
FIG. 8 is a plot of the density of states for electrons (DOS) for a (001) oriented GaAs (20 Å)/AlAs(30 Å)superlattice calculated for various subbands derived from Γ-, $X_C$-, $X_t$-, and L-valleys.

Referring now to FIG. 8, the density of states for electrons DOS(E) for a (001) oriented GaAs(20 Å)/AlAs(30 Å) superlattice) calculated for various subbands derived from Γ-, $X_l$-, $X_t$- and L-valleys, as indicated in the figure, is shown. The number inside the parentheses denotes the number of equivalent valleys that are degenerate in energy. For example, the DOS(E) for $X_t$-valleys includes contributions from two equivalent $X_t$-valleys while the DOS(E) for L-valleys includes contributions from four equivalent L-valleys.

Figure 8A:
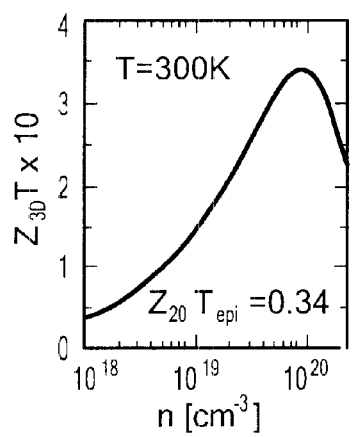
FIG. 8A is a plot showing the calculated $Z_{3D}T$ as a function of carrier concentration n corresponding to the superlattice shown in FIG. 8 at 300° K.

Referring now to FIG. 8A, a plot for the calculated $Z_{3D}T$ as a function of carrier concentration n for this superlattice at 300° K. is shown. The position of the chemical potential ζ that gives the optimum value of $Z_{3D}T$ (denoted as $Z_{3D}T_{opt}$) is ζ=0.107 eV on the main scale of FIG. 8.

Examination of FIGS. 6, 7, and 8, reveals that the relative energies for the Γ-, $X_l$-, $X_t$- and L-subband edges are sensitive to the thicknesses of the GaAs and AlAs layers for the superlattice. For example, for the GaAs(30 Å)/AlAs(20 Å) superlattice (FIG. 7), the lowest lying subband is found to be the Γ-subband. Since the Γ-subband has a relatively large carrier mobility ($\mu_\Gamma$=3000 cm²/V·s) and a relatively small density of states mass ($m_{\Gamma*/m}$=0.067), the behavior of the calculated value of $Z_{3D}T$ for this superlattice is similar to those for the corresponding Γ-point superlattice for relatively small carrier concentrations (n<1.5×10¹⁸ cm²/V·s).

For larger carrier concentrations (n>3×10¹⁸ cm²/V·s), the calculated values of $Z_{3D}T$ for the GaAs(30 Å)/AlAs(20 Å) superlattice are not as large as those for the GaAs(20 Å)/AlAs(20 Å) superlattice. This is because the contribution from the Γ-subband, which has relatively small values of the Seebeck coefficient at larger carrier concentrations (n>3×10¹⁸ cm²/V·s), is rather strong.

In the case of the GaAs(20 Å)/AlAs(30 Å) superlattice (FIG. 8), it is found that the energy separation between the [$X_l$, $X_t$]-subbands and the Γ-, L-subbands becomes larger compared to that for the GaAs(20 Å)/AlAs(20 Å) superlattice. Therefore, a moderate decrease in $Z_{3D}T$ for all carrier concentrations below 1.5×10²⁰ cm⁻³ in this superlattice relative to the corresponding $Z_{3D}T$s for the GaAs(20 Å)/AlAs(20 Å) superlattice is observed. This is indicated by curve 98 in FIG. 8B which relates to the (001) SL(30 Å/20 Å).

Figure 8B:
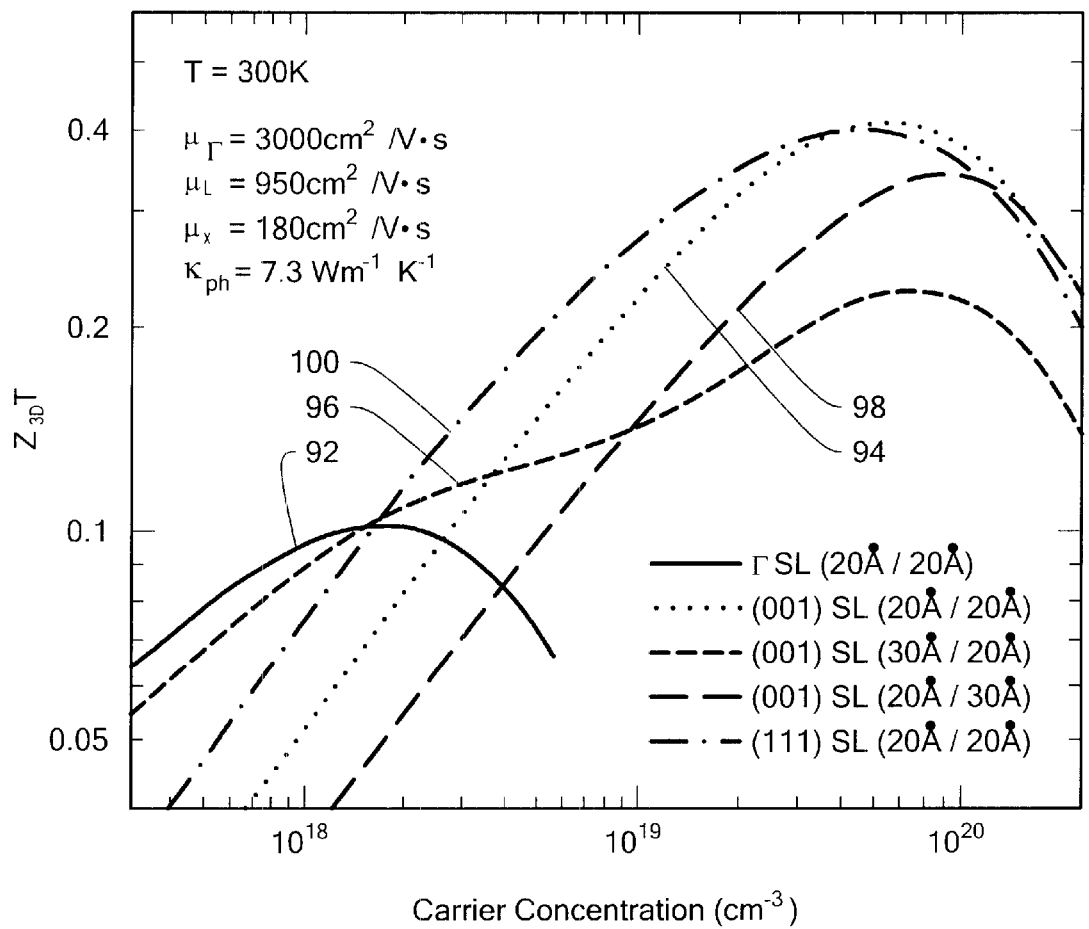
FIG. 8B is a plot of the computed values of $Z_{3D}T$ for various superlattices as a function of carrier concentration.

FIG. 8B is a plot of the computed values of $Z_{3D}T$ as a function of carrier concentration for a plurality of different superlattice structures. Curve 94 represents a (001) oriented GaAs(20 Å)/AlAs(20 Å) superlattice (dotted curve), curve 96 represents a (001) oriented GaAs(30 Å)/AlAs(20 Å) superlattice (short-dashed curve), curve 98 represents a (001) oriented GaAs(20 Å)/AlAs(30 Å) superlattice (long-dashed curve), and curve 100 represents a (111) oriented GaAs(20 Å)/AlAs(20 Å) superlattice (long-dash-short-dashed curve). Curve 92 (the solid curve) in FIG. 8B denotes $Z_{3D}T$ calculated assuming only carriers in the Γ-point subband for a GaAs(20 Å)/AlAs(20 Å) superlattice.

It is known that GaAs can be doped to be a p-type material as heavily as p=10²⁰ cm⁻³ using carbon (C) as a dopant. However n-type doping in GaAs is achieved only up to n=5×10¹⁸ cm⁻³ using silicon as a dopant. Therefore, it is of interest to investigate superlattices that are grown in an orientation other than along the (001) direction, that may have higher values for the thermoelectric figure of merit $Z_{3D}T$ than those for the (001) oriented GaAs/AlAs superlattices at moderate carrier concentrations (n=5×10¹⁸ cm⁻³).

To address this issue, various structures of (111) oriented GaAs/AlAs superlattices have been explored. In (111) oriented GaAs/AlAs superlattices, four equivalent L-valleys in the bulk form experience the lifting of valley degeneracy in the superlattice form. Thus, one can denote the L-valley(s) whose main axis is parallel and oblique to the superlattice growth direction as (longitudinal) $L_l$-valley and (oblique) $L_o$-valleys, respectively, and the resultant subbands as $L_l$- and $L_o$-subbands, respectively. On the other hand, three equivalent X-valleys in the bulk form remain equivalent to one another in the (111) oriented superlattices as well. Therefore, the subband derived from the X-valleys (denoted by the X-subband) consists of three equivalent (or degenerate) X-valleys in the superlattice form.

Figure 9:
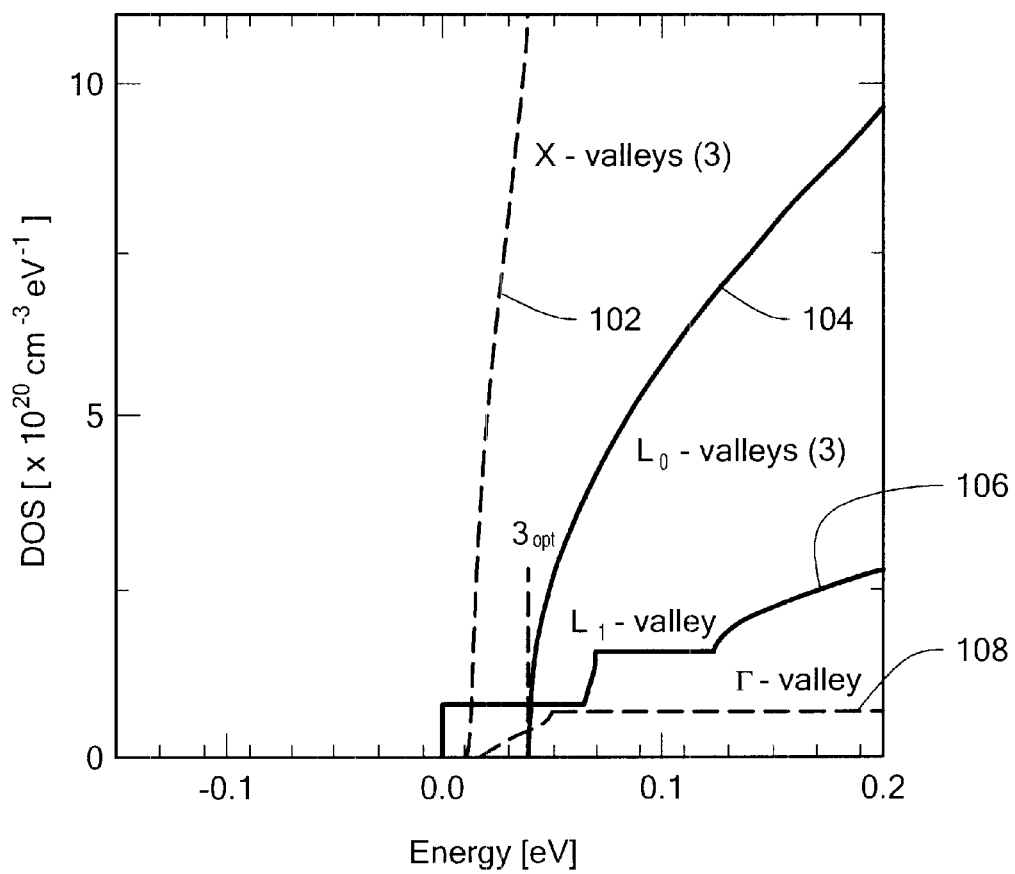
FIG. 9 is a plot of the density of states for electrons (DOS) for a (111) oriented GaAs (20 Å)/AlAs(20 Å)superlattice calculated for various subbands derived from Γ-, $L_o$-, $L_c$-, and X-valleys.
Figure 9A:
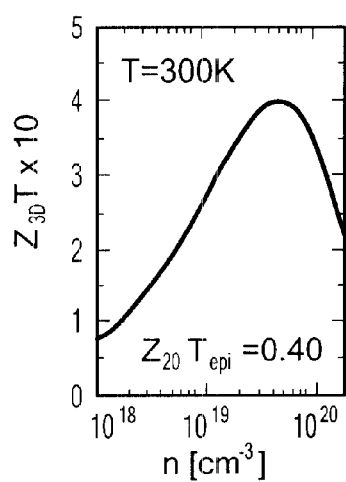
FIG. 9A is a plot for the calculated $Z_{3D}T$ as a function of carrier concentration n corresponding to the superlattice shown in FIG. 9 at 300° K.

Referring now to FIGS. 9 and 9A, the density of states for electrons DOS(E) for a (111) oriented GaAs(20 Å)/AlAs(20 Å) superlattice and the calculated $Z_{3D}T$ as a function of carrier concentration are shown.

FIG. 9 shows the DOS vs. energy for a (111) oriented GaAs(20 Å)/AlAs(20 Å) superlattice calculated for various subbands derived from Γ-, X-, $L_l$- and $L_o$-valleys (as, respectively, indicated in FIG. 9 by curves 108, 102, 106 and 104). The number inside the parentheses denotes the number of equivalent valleys that are degenerate in energy. For example, the DOS for $L_o$-valleys includes contributions from three equivalent $L_o$-valleys while the DOS for X-valleys also includes contributions from three equivalent X-valleys. Thus, in this structure, since all the Γ-, X-, L-subbands lie very close in energy, larger values for $Z_{3D}T$ relative to those for the (001) oriented superlattices are thus expected at lower carrier concentrations ($\sim 5 \times 10^{18}$ cm$^{-3}$).

Referring now to FIG. 9A, the calculated $Z_{3D}T$ for the (111) oriented GaAs(20 Å)/AlAs(20 Å) superlattice is plotted as a function of the carrier concentration. This $Z_{3D}T$ can be compared with the results for the various (001) oriented superlattices considered previously. Such a comparison reveals that the (111) oriented GaAs(20 Å)/AlAs(20 Å) superlattice yields not only as high a $Z_{3D}T$ value as that for the (001) oriented GaAs(20 Å)/AlAs(20 Å) superlattice at the optimum carrier concentrations (n~$5 \times 10^{19}$ cm$^{-3}$ at 300° K.), but also a greatly enhanced value for $Z_{3D}T$ ($Z_{3D}T$=0.2) relative to that for the (001) oriented GaAs(20 Å/AlAs(20 Å) superlattice ($Z_{3D}T$=0.14) at moderate carrier concentrations (~$5 \times 10^{18}$ cm$^{-3}$). This can be compared to curve 100 (FIG. 8B).

FIG. 9A (the inset in FIG. 9) shows a plot for the calculated $Z_{3D}T$ as a function of carrier concentration n for this superlattice at 300° K. The position of the chemical potential ζ that gives the optimum value of $Z_{3D}T$ (denoted as $Z_{3D}T_{opt}$) is ζ=0.042 eV on the main scale of FIG. 9.

Figure 10:
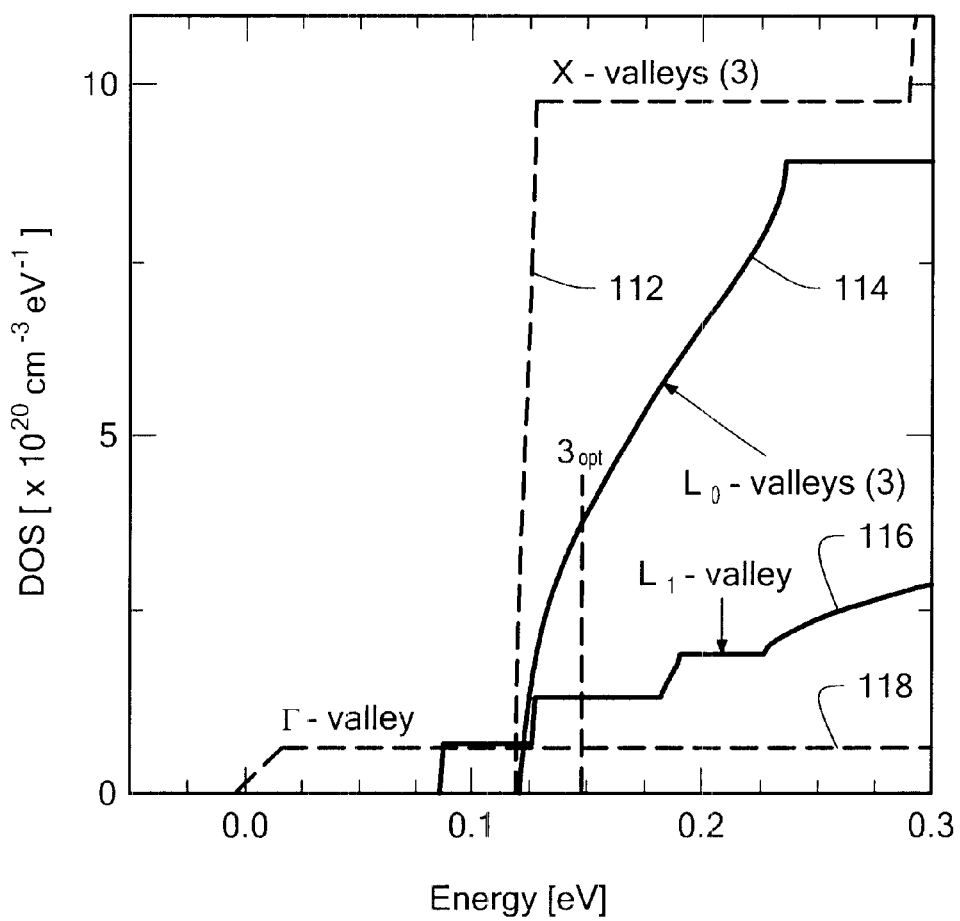
FIG. 10 is a plot showing the density of states for electrons (DOS) for a (111) oriented GaAs(30 Å)/AlAs(20 Å) superlattice calculated for various subbands derived from Γ-, $L_o$, $L_l$-, and X-valleys.
Figure 10A:
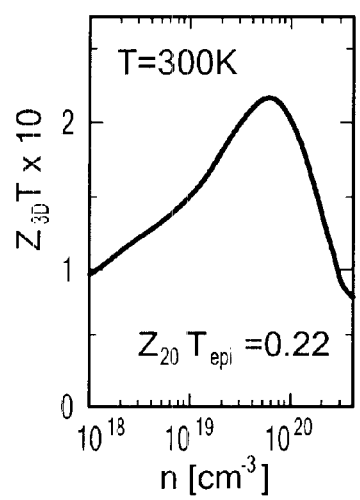
FIG. 10A is a plot for the calculated $Z_{3D}T$ as a function of carrier concentration n for the superlattice corresponding to FIG. 10 at a temperature of 300° K.

Referring now to FIGS. 10 and 10A, the DOS for a (111) oriented GaAs(30 Å)/AlAs(20 Å) superlattice and calculated $Z_{3D}T$ as a function of carrier concentration are shown.

FIG. 10 shows the DOS for a (111) oriented GaAs(30 Å)/AlAs(20 Å) superlattice calculated for various subbands derived from Γ-, X-, $L_l$- and $L_o$-valleys, as indicated in FIG. 10 by curves 118, 112, 116, 114, respectively. The number inside the parentheses denotes the number of equivalent valleys that are degenerate in energy. For example, the DOS for $L_o$-valleys includes contributions from three equivalent $L_o$-valleys and the X-valleys include contributions from three equivalent X-valleys.

FIG. 10A shows a plot for the calculated $Z_{3D}T$ as a function of carrier concentration n for this superlattice at 300° K. The position of the chemical potential ζ that gives the optimum value of $Z_{3D}T$ (denoted as $Z_{3D}T_{opt}$) is ζ=0.147 eV on the main scale of FIG. 10.

Figure 11:
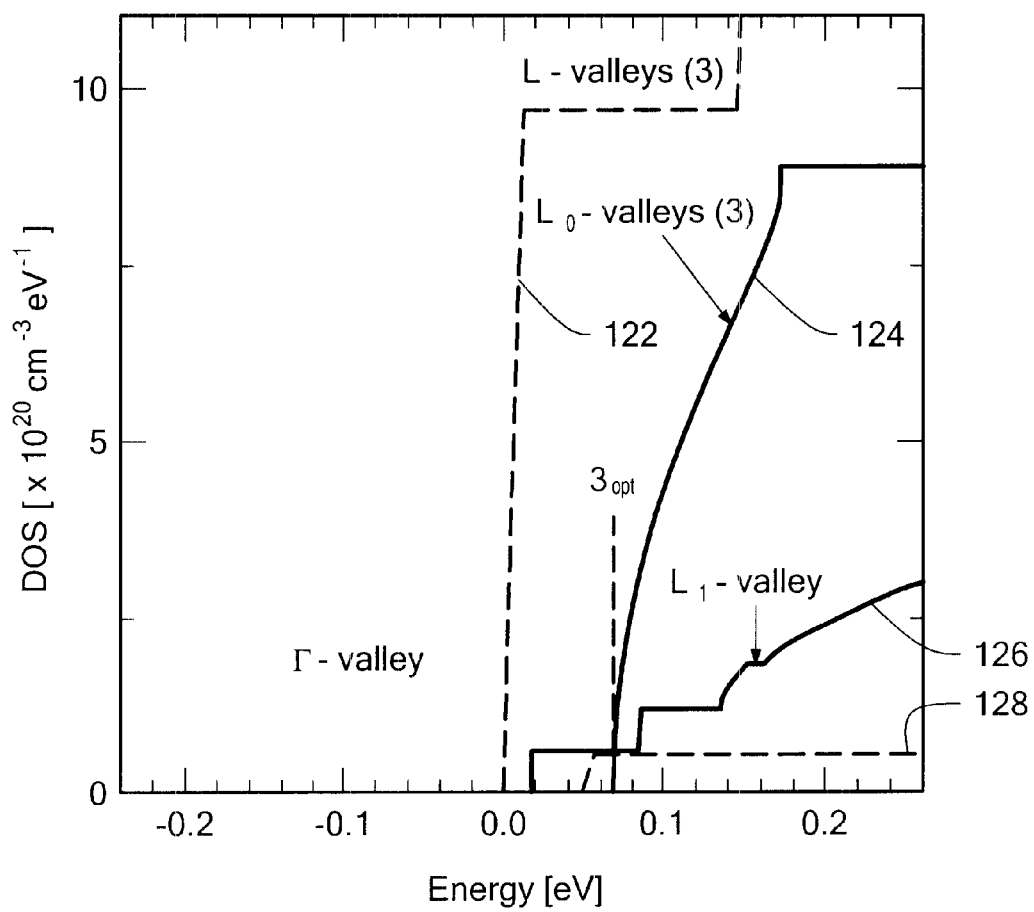
FIG. 11 is a plot of the density of states for electrons (DOS) for a (111) oriented GaAs (20 Å)/AlAs(30 Å) superlattice calculated for various subbands derived from Γ-, $L_o$-, $L_l$-, and X-valleys.
Figure 11A:
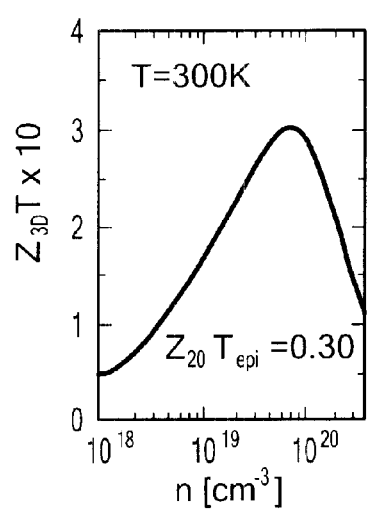
FIG. 11A is a plot for the calculated $Z_{3D}T$ as a function of carrier concentration n for the superlattice corresponding to FIG. 11 at 300° K.

Referring flow to FIGS. 11 and 11A, the DOS for a (111) oriented GaAs(20 Å)/AlAs(30 Å) superlattice and calculated $Z_{3D}T$ as a function of carrier concentration are shown.

FIG. 11 shows the DOS of electrons for a (111) oriented GaAs(20 Å)/AlAs(30 Å) superlattice calculated for various subbands derived from Γ-, X-, $L_l$- and $L_o$-valleys, as indicated in FIG. 11 by curves 128, 122, 126, 124, respectively. The number inside the parentheses denotes the number of equivalent valleys that are degenerate in energy. For example, the DOS for $L_o$-valleys includes contributions from three equivalent $L_o$-valleys and the DOS for X-valleys includes contributions from three equivalent X-valleys.

FIG. 11A shows the calculated $Z_{3D}T$ as a function of carrier concentration n for this superlattice at 300° K. The position of the chemical potential ζ that gives the optimum value of $Z_{3D}T$ (denoted as $Z_{3D}T_{opt}$) is ζ=0.067 eV on the main scale of FIG. 11.

Thus, FIGS. 10 through 11A show the calculated density of states for electrons, DOS(E), for the (111) oriented GaAs(30 Å)/AlAs(20 Å) and GaAs(20 Å)/AlAs(30 Å) superlattices, respectively. FIGS. 10A, 11A (the insets of FIGS. 10 and 11), respectively, show the resultant values for $Z_{3D}T$ calculated assuming these structures are also plotted as a function of the carrier concentration n.

It is found that the lowest lying conduction subband in the (111) oriented GaAs(30 Å)/AlAs(20 Å) superlattice (FIG. 10) is the Γ-subband as in the (001) oriented GaAs(30 Å)/AlAs(20 Å) superlattice. Therefore, the resultant $Z_{3D}T$s for the (111) oriented GaAs(30 Å)/AlAs(20 Å) superlattice show a similar behavior to that for the (001) oriented GaAs(30 Å)/AlAs(20 Å) superlattice, i.e., the values for $Z_{3D}T$ at smaller carrier concentrations (n<$1.5 \times 10^{18}$ cm$^{-3}$) are relatively large ($Z_{3D}T$>0.1) as compared to those for the (111) oriented GaAs(20 Å)/AlAs(20 Å) superlattice (because of the relatively large value for the carrier mobility for the Γ-subband ($\mu_\Gamma$=3000 cm$^2$/V·s)). However, the values for $Z_{3D}T$ at larger carrier concentrations (n>$2 \times 10^{18}$ cm$^{-3}$) for the (111) oriented GaAs(30 Å)/AlAs(20 Å) superlattice are relatively small compared to those for the (111) oriented GaAs(20 Å)/AlAs(20 Å) or GaAs(20 Å)/AlAs(30 Å) superlattices, because a large contribution from the Γ-subband to the total thermoelectric coefficients for the whole superlattice tends to reduce the value of the Seebeck coefficient for the whole superlattice because of the relatively large energy separation between the Γ-subband and the other X-, $L_l$- and $L_o$-subbands in the (111) oriented GaAs(30 Å)/AlAs(20 Å) superlattice. For the (111) oriented GaAs(20 Å)/AlAs(30 Å) superlattice (see FIG. 11), the lowest subband turns out to be the X-subband. Because the carriers occupying the X-subband have relatively low mobilities ($\mu_x$=180 cm$^2$/V·s), the resultant values for $Z_{3D}T$ are not as large as those for the (111) oriented GaAs(20 Å)/AlAs(20 Å) superlattice (see FIG. 9A).

Figure 12:
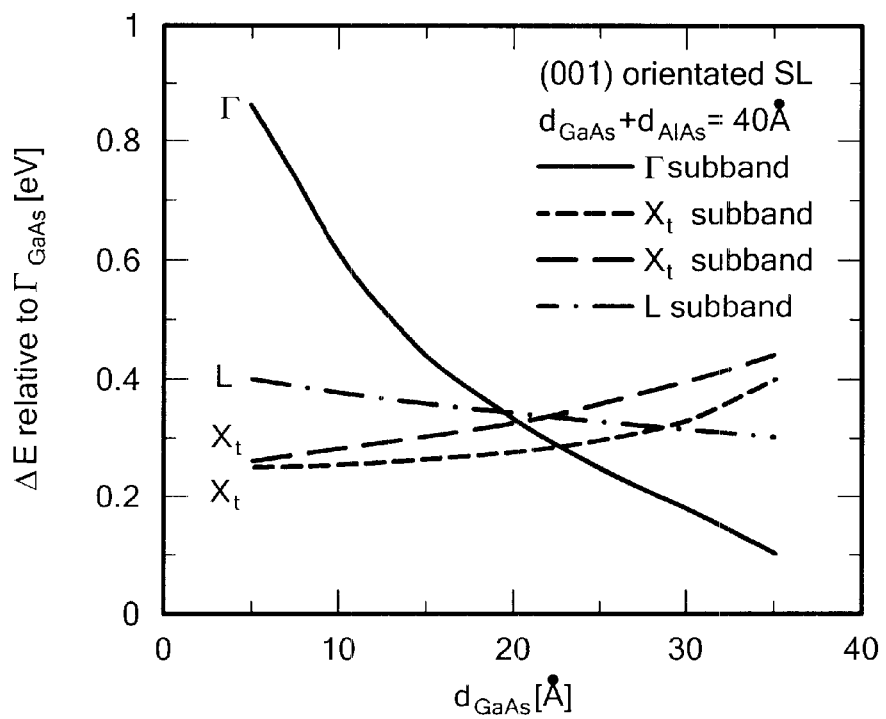
FIG. 12 is a plot of calculated energies for various subband edges for a (001) oriented GaAs/AlAs superlattice, measured from the conduction band edge at the Γ point in the Brillouin zone for bulk GaAs.
Figure 12A:
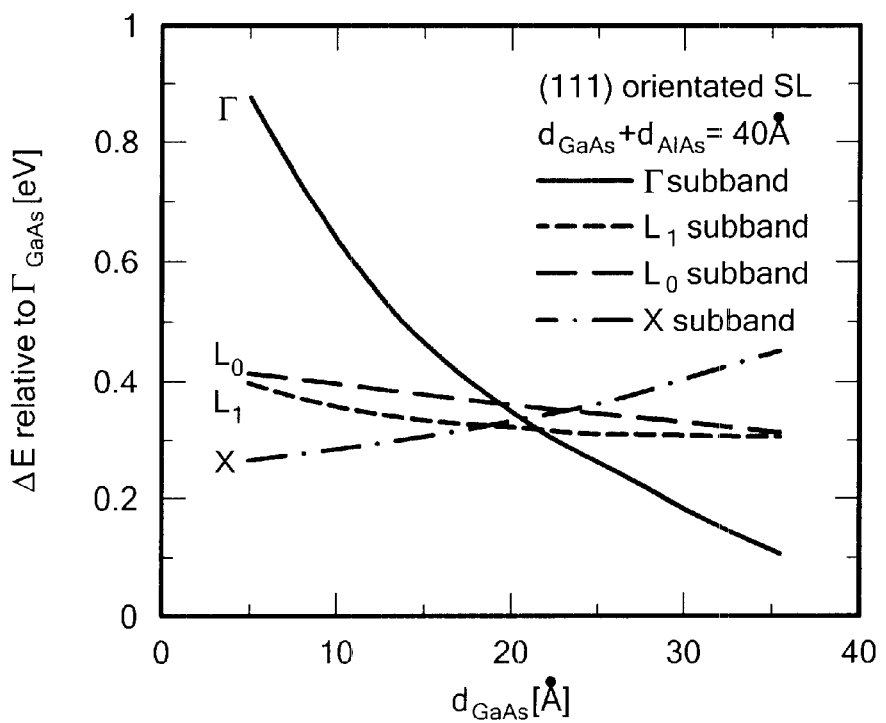
FIG. 12A, is a plot of calculated energies for various subband edges for a (111) oriented GaAs/AlAs superlattices, measured from the conduction band edge at the Γ point in the Brillouin zone for bulk GaAs.

With reference to FIGS. 12 and 12A, one can examine how the relative energies for the available subband edges would change when the superlattice period is fixed (i.e., $d_{GaAs}+d_{AlAs}$=constant) but the relative thicknesses for the GaAs and AlAs layers (denoted by $d_{GaAs}$ and $d_{AlAs}$, respectively) are varied.

FIGS. 12 and 12A show the calculated energies for various subband edges in (001) and (111) oriented GaAs/AlAs superlattices, respectively, for the superlattice period $d_{GaAs}+d_{AlAs}$=40 Å. Examination of FIGS. 12 and 12A reveals that the Γ-, X- and L-subbands all lie very close in energy for $d_{GaAs}$ around 20 Å in both (001) and (111) oriented superlattices. Therefore, one can conclude that a GaAs(20 Å)/AlAs(20 Å) superlattice indeed provides the optimum structure for the superlattice for obtaining enhanced values of $Z_{3D}T$ for the GaAs/AlAs system.

FIG. 12 shows calculated energies for various subband edges for (001) oriented GaAs/AlAs superlattices, measured from the conduction band edge at the Γ-point in the Brillouin zone for bulk GaAs. The calculated results are obtained for a fixed superlattice period $(d_{GaAs}+d_{AlAs})=40$ Å. It is noted that the X-point quantum well is formed within the AlAs layers, whereas the Γ- and L-point quantum wells are formed within the GaAs layers. Subscripts l, t and o in $X_l$, $X_t$, $L_l$, and $L_o$ denote the orientation of the pertinent conduction band valley: longitudinal, transverse, and oblique orientations, respectively, relative to the superlattice growth direction.

Similarly, FIG. 12A shows calculated energies for various subband edges for (111) oriented GaAs/AlAs superlattices, measured from the conduction band edge at the Γ-point in the Brillouin zone for bulk GaAs. The calculated results are obtained for a fixed superlattice period $(d_{GaAs}+d_{AlAs})=40$ Å. It is noted that the X-point quantum well is again formed within the AlAs layers, whereas the Γ- and L-point quantum wells are formed within the GaAs layers. The subscripts l, t and o in $X_l$, $X_t$, $L_l$, and $L_o$ in FIG. 12A denote the same parameters as in FIG. 12.

Figure 13:
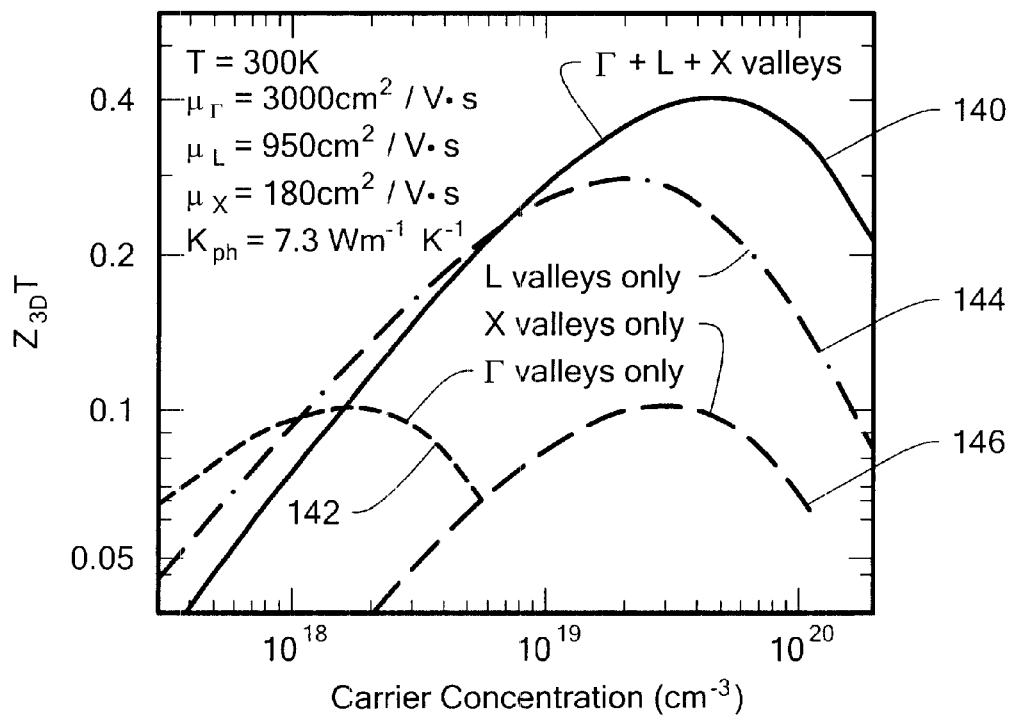
FIG. 13 is a plot of calculated $Z_{3D}$Ts for a (111) oriented GaAs(20 Å)/AlAs(20 Å) superlattice as a function of carrier concentration treating the Γ, L- and X-valleys, separately, as well as treating all three types of valleys together.

Referring now to FIG. 13, curves 140–146 represent calculated $Z_{3D}$Ts for a (111) oriented GaAs(20 Å)/AlAs(20 Å) superlattice as a function of carrier concentration. In FIG. 13, the curves 142–146 treat Γ-(short-dashed curve), L-(i.e., $[L_C, L_o]$-) (dash-dotted curve) and X-valleys (long-dashed curve), separately. Curve 140 treats all three types of valleys together (solid curve).

Figure 13A:
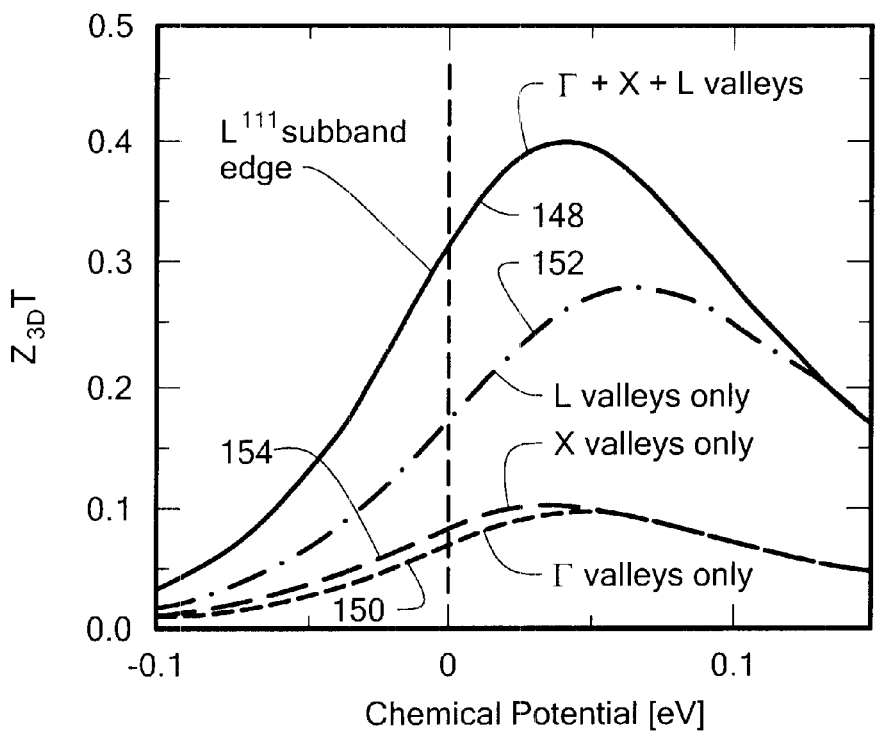
FIG. 13A is a plot of calculated $Z_{3D}$Ts for a (111) oriented GaAs(20 Å)/AlAs(20 Å) superlattice as a function of chemical potential measured from the longitudinal L-valley subband edge (the lowest conduction subband in energy), treating the Γ, L- and X-valleys, separately, as well as treating all three types of valleys together.

Referring now to FIG. 13A, curves 148–154 represent calculated $Z_{3D}$TS for a (111) oriented GaAs(20 Å)/AlAs(20 Å) superlattice as a function of chemical potential measured from the longitudinal L-valley subband edge (the lowest conduction subband in energy). Curves 150–154 are generated treating Γ-(short-dashed curve), L-(dash-dotted curve) and X- (long-dashed curve) valleys separately while curve 148 is generated treating all three types of valleys together (solid curve).

In FIG. 13, the calculations are made assuming carrier mobilities of 3000, 950 and 180 cm²/V·s for the Γ-, L- and X-valleys, respectively, and a lattice thermal conductivity of 7.3 W/m·K to simulate the thermoelectric properties of (111) oriented GaAs(20 Å)/AlAs(20 Å) superlattices at 300° K. As is clear in FIG. 13, the optimum value for $Z_{3D}$T for the (111) oriented GaAs(20 Å)/AlAs(20 Å) superlattice ($Z_{3D}$T=0.4 at n=5×10¹⁹ cm⁻³ given by curve 140 in FIG. 13) is obtained not by the contribution from any of the single valley types, but is the result of contributions from all the Γ-, L- and X-valleys to the thermoelectric transport. This last feature can be seen more clearly by plotting the $Z_{3D}$Ts as a function of chemical potential (FIG. 13A). In this case, it is found that the extrema of the $Z_{3D}$Ts that are calculated by treating each valley type separately occur at similar positions of the chemical potential (within the order of the thermal energy at 300° K.). This result validates the hypothesis of the "carrier pocket engineering condition", i.e., the contributions from all the conduction band valleys add up positively to increase the $Z_{3D}$T for the whole superlattice if the structure and orientation of the superlattice are carefully optimized.

It should also be appreciated that the thermoelectric figure of merit $Z_{3D}$T is also a function of temperature. One can use such information about the temperature dependence of $Z_{3D}$T both to design actual systems for thermoelectric applications in such a way that the system operates at a temperature where the maximum values of $Z_{3D}$T for the constituent thermoelectric elements are realized and to design the thermoelectric materials in such a way that the value of $Z_{3D}$T is maximized at a given desired temperature for the pertinent thermoelectric applications. It turns out that the value of $Z_{3D}$T generally tends to increase with increasing temperature because the increase in $S^2T$ and the reduction in K usually overweigh the reduction in σ as the temperature is increased. A peak in $Z_{3D}$T as a function of temperature usually takes place when the excitation of carriers across the energy band gap (excitation of holes) reduces the magnitude of the Seebeck coefficient at sufficiently high temperature. Another limit for the use of thermoelectric materials at high temperatures is given by the temperature where a structural instability takes place with the given material system, such as interdiffusion phenomena at the well-barrier interfaces for the case of the thermoelectric materials using superlattice structures or the segregation or precipitation of the doping impurities at sufficiently high temperatures.

Figure 14:
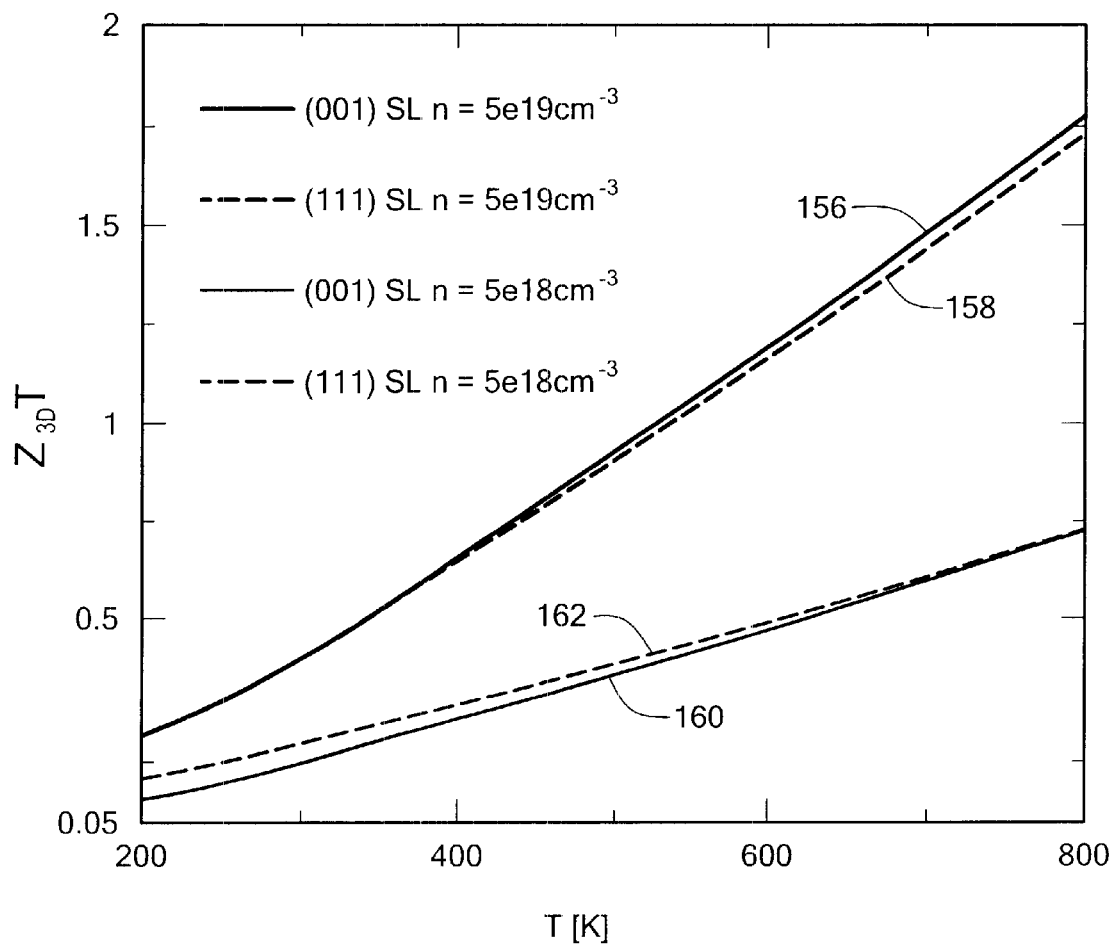
FIG. 14 is a plot of calculated values of $Z_{3D}T$ as a function of temperature for a (001) oriented GaAs(20 Å)/AlAs(20 Å) superlattice, and for a (111) oriented GaAs(20 Å)/AlAs(20 Å) superlattice for two different carrier concentrations.

Referring briefly to FIG. 14, curves 156–162 represent examples of modeling results for $Z_{3D}$T as a function of temperature for (001) and (111) oriented GaAs(20 Å)/AlAs (20 Å) superlattices. The calculations on which the curves 156–162 are based are made assuming $\mu \geq T^{-\frac{1}{2}}$ for the temperature dependence of the carrier mobility, which is consistent with alloy scattering of the conduction carriers, and for some fixed values of carrier concentrations (n=5× 10¹⁸ cm⁻³ (curves 160, 162) and n=5×10¹⁹ cm⁻³(curves 156, 158). FIG. 14 shows that of $Z_{3D}$T increase with temperature under these assumptions.

It should now be appreciated that Carrier Pocket Engineering can be applied to GaAs/AlAs superlattices both to predict the enhanced thermoelectric figure of merit $Z_{3D}$)T for the whole superlattice relative to the corresponding values for the constituent materials (GaAs and AlAs) in a bulk form and to fabricate superlattice structures having an enhanced $Z_{3D}$T.

It has also been found that $Z_{3D}$T for the Γ-point superlattice could be enhanced by a factor of more than ten relative to that for bulk GaAs. The values for $Z_{3D}$T under the Carrier Pocket Engineering condition, where all the available conduction subbands are almost degenerate to one another, could be about 50 times as large as that for the corresponding bulk materials. Also shown are the relative contributions from all the available Γ-, X-($X_t$- and $X_l$-) and L- ($L_l$- and $L_o$-) subbands to the total thermoelectric figure of merit $Z_{3D}$T for the whole superlattice. It has been demonstrated that various superlattice parameters such as the superlattice period, layer thicknesses and the superlattice growth direction can be used to optimize the value of thermoelectric figure of merit $Z_{3D}$T for the whole superlattice. Values of $Z_{3D}$T>0.4 are possible at 300° K. for both (001) or (111) oriented GaAs(20 Å)/AlAs(20 Å) superlattices under heavy doping conditions (~5×10¹⁹ cm⁻³), whereas $Z_{3D}$T~0.2 is possible at moderate carrier concentrations (~5×10¹⁸ cm⁻³) for a (111) oriented GaAs(20 Å)/AlAs(20 Å) superlattice, which is still much larger than the corresponding value of $Z_{3D}$T for bulk GaAs or for bulk AlAs ($Z_{3D}$T~0.0085) at 300° K.

It has thus been shown in accordance with the present invention that it is possible to model three-dimensional $Z_{3D}$Ts of the superlattices using short period GaAs/AlAs superlattices. Consideration of the effect of the contributions from the Γ-valleys only, between the well (GaAs) and the barrier (AlAs) layers (denoted as a Γ-point superlattice), on the thermoelectric properties of the superlattices have been also made. And, the models have been extended to include the contributions from other X- and L-valleys in the Brillouin zone. It is shown that $Z_{3D}$T for the Γ-point superlattice could be more than ten times larger than that for the corresponding bulk GaAs. It has also been shown that $Z_{3D}$T for the (001) or (111) oriented GaAs(20 Å)/AlAs(20 Å)

superlattices using the present technique is enhanced by a factor of about 50 relative to the corresponding value of $Z_{3D}T$ for bulk GaAs. It has also further been shown that, in order to obtain such a large enhancement in $Z_{3D}T$, the geometry and structure of the superlattices (such as the layer thicknesses and the superlattice growth direction) have to be carefully optimized. This is so that both the GaAs and AlAs layers can be utilized as the conduction channels for electrons that are contributing to the thermoelectric transport. The term "carrier pocket engineering" refers to this design process.

With reference to FIGS. 15–22B, the concept of carrier pocket engineering is applied to strained Si/Ge superlattices to obtain a structure having an enhanced thermoelectric figure of merit $Z_{3D}T$.

Before explaining the figures in detail, an overview is provided. It has been observed that by using lattice strain engineering to control the conduction band offsets, it is possible to obtain strained Si/Ge superlattices having improved thermoelectric figure of merit $Z_{3D}T$. Furthermore, by changing various geometries and structures for the superlattice one can maximize the value of $Z_{3D}T$ for the whole (3D) superlattice. The resultant value for $Z_{3D}T$ at 300° K. calculated for a strain-symmetrized (111) oriented Si(20 Å)/Ge(20 Å) superlattice is 0.96 (a factor of 70 enhancement relative to the corresponding value for bulk Si), and is shown to increase significantly at elevated temperatures. It is also noted that the optimum value of $Z_{3D}T$ for a (111) oriented Si(20 Å)/Ge(20 Å) superlattice is predicted to be a factor of four larger than the corresponding value of $Z_{3D}T$ for a (001) oriented Si(20 Å)/Ge(20 Å) superlattice, due to the density-of-states factor only.

It has also been observed that the lowest subband that contributes to the actual thermoelectric transport in a (001) oriented Si(20 Å)/Ge(20 Å) superlattice is a subband that is derived from the two equivalent longitudinal $\Delta$-valleys in the bulk form (denoted as the $\Delta^{\|}$- or $\Delta^{001}$-subband). Since the $\Delta^{001}$-subband has a relatively small density of states for electrons, because of its rather small in-plane effective mass component and a small multiplicity factor, (2 for the number of equivalent valleys), the predicted value for the optimum figure of merit $(Z_{3D}T)$ is only 0.24 at 300° K. However, this value is still 17 times larger than the corresponding $Z_{3D}T$ value for bulk Si.

Figure 16:
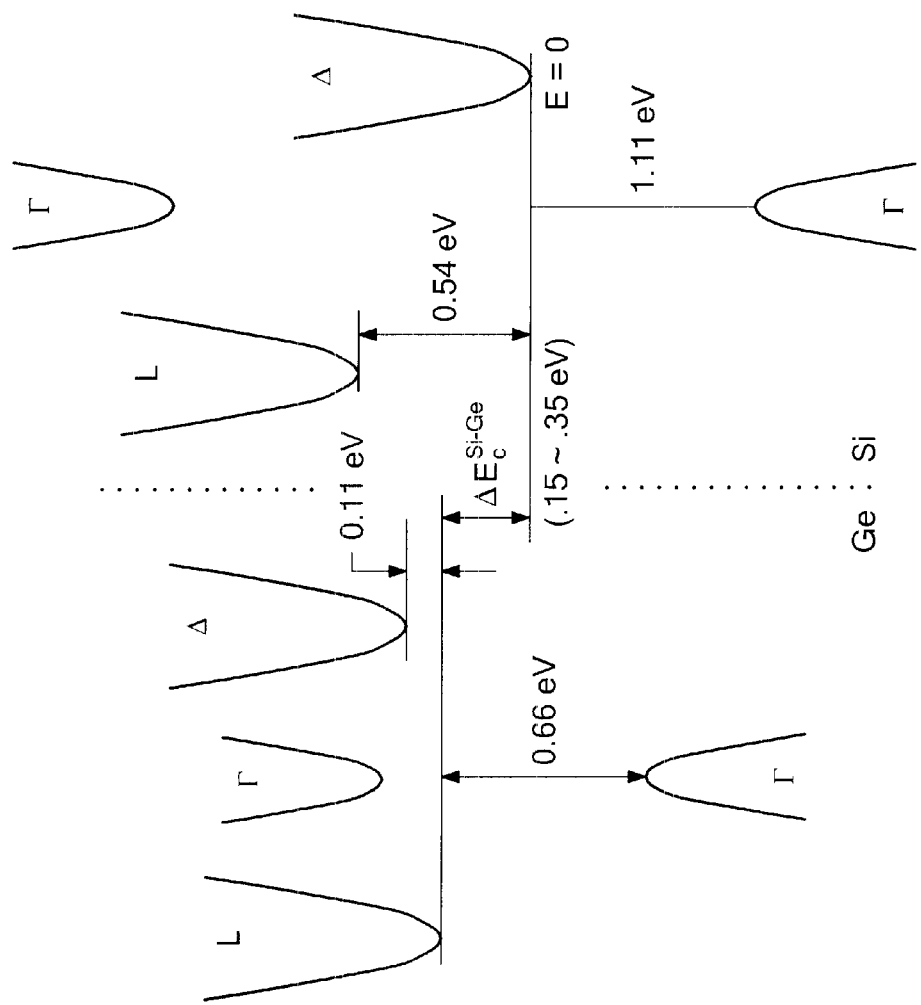
FIG. 16 is a schematic band diagram showing the relative energies between the various conduction band minima for bulk Si and Ge.
Figure 18:
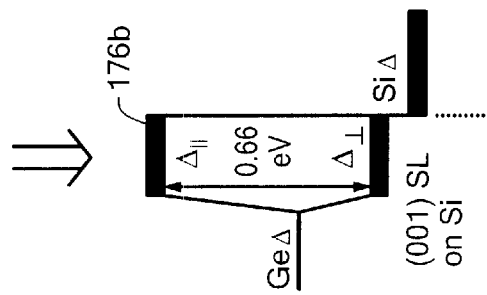
FIGS. 18 and 18A show the energy levels for the strained bulk materials that are used for the superlattices shown in FIGS. 17 and 17A respectively.
Figure 18A:
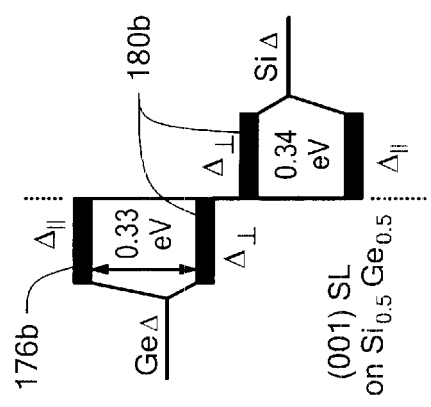

In general (as shown in FIG. 16), since bulk Si and Ge have their conduction band minima at the $\Delta$- and L-points in the Brillouin zone, respectively (the number of the equivalent sites at these high symmetry points are 6 and 4, respectively), the Si/Ge superlattice provides a preferred system for exploring actual applications of the carrier pocket engineering technique for obtaining enhanced values of $Z_{3D}T$.

It should be appreciated that another strategy for enhancing the values of $Z_{3D}T$ using superlattice structures includes enhancing $Z_{3D}T$ through the reduction of the lattice thermal conductivity $K_{ph}$. It has been observed that the detailed mechanisms for the reduction of $K_{ph}$ in $Si_{1-x}Ge_x$ alloys (i.e., alloy scattering and impurity scattering of phonons) are considered to be distinct from those in the Si/Ge superlattices (interface and impurity scattering of phonons, and phonon scattering due to defects and threading dislocations). However, the understanding of the mechanisms for the reduced $K_{ph}$ in $Si_{1-x}Ge_x$ alloys should also provide some insight into the mechanisms for the reduced $K_{ph}$ in Si/Ge superlattices. It has been found that the reduction of $K_{ph}$ in $Si_{1-x}Ge_x$ alloys takes place not only due to the alloy scattering, but also due to the impurity scattering of phonons for heavily doped $Si_{1-x}Ge_x$ alloy samples. Since the optimum doping levels for Si/Ge superlattices for thermoelectric applications are predicted to be relatively high $(n=10^{19}\sim10^{20}$ cm$^{-3})$, the importance of the impurity scattering on reducing K in $Si_{1-x}Ge_x$ alloys suggests that a new concept of the "dopant impurity" engineering can be developed for Si/Ge superlattices. In this "dopant impurity" engineering concept, the dopant impurities are introduced into the superlattice structures in such a way that the values of $K_{ph}$ for the superlattices are reduced due to the impurity scattering of phonons, but the values of the carrier mobility for the superlattices are not reduced appreciably by the large dopant concentrations due to some special doping techniques, such as $\delta$- and modulation doping techniques.

It has been observed that the lattice thermal conductivities $K_{ph}$ for Si/Ge and $Si_{1-x}Ge_x$ superlattices are significantly reduced from the corresponding values for bulk Si and Ge. In some cases, the values of $K_{ph}$ for Si/Ge or $Si_{1-x}Ge_x$ superlattice samples are even lower than the corresponding values of $K_{ph}$ for $Si_{1-x}Ge_x$ alloys, where x is close to 0.5. Since the values of $K_{ph}$ for these superlattice samples crucially depend on the quality of the samples, it is essential to use high-quality, well-characterized superlattice samples for the experiment of the in-plane and cross-plane thermal conductivity measurements in order to identify the possible mechanisms that are responsible for the observed reduction in $K_{ph}$ for Si/Ge and $Si_{1-x}Ge_x$ superlattices.

It was found that the values of the thermal conductivity K for $Si_{1-x}Ge_x$ alloys are greatly reduced from the corresponding values for bulk Si (K≈150 W/m·K) and for bulk Ge (K≈60 W/m·K). It has been found that the values of $K_{ph}$ for $Si_{1-x}Ge_x$, x≈0.5 alloys are approximately 8 W/m·K for undoped alloys and can be smaller than 5 W/m·K for heavily doped alloys (n~1.5×10$^{20}$ cm$^{-3}$). It is noted that the electronic contribution to the thermal conductivity (denoted by $K_c$) is only on the order of 10% of the total thermal conductivity, even for the heavily doped samples. Therefore, reducing the values of $K_{ph}$ by increasing dopant concentrations, due to the increased impurity scattering of phonons, outweighs the increase in K due to the increased values of $K_c$ that are caused by the increased carrier concentrations.

It was found that the values of the thermal resistivity $K^{-1}$ first increase with increasing n and reach a maximum value at n=8×10$^{19}$–2×10$^{20}$ cm$^{-3}$, depending on the temperature, and then decrease with further increasing n due to the increasing contribution of $K_c$ to the total thermal conductivity K.

The experiments on the cross-plane thermal conductivity $(K_\perp)$ measurement can be performed in a much more reliable way than the in-plane thermal conductivity $K_\|$ measurement, because the geometrical configuration in the cross-plane measurement of $K_\perp$ for Si/Ge superlattices allows one to use the 3$\omega$-technique that can be performed without removing the substrate and the buffer layer part of the sample from the superlattice, whereas an in-plane $K_\|$ measurement generally requires a free-standing sample of Si/Ge superlattices. It is, however, noted that there is a variation of the 3$\omega$-technique, the so-called "2-wire 3$\omega$ method", that allows one to measure the in-plane $K_\|$ of the superlattice samples without removing the substrate and buffer layer part of the samples.

Yet another method to estimate the values of the in-plane thermal conductivity of $K_\|$ includes a way to estimate $K_\|$ from the measured cross-plane thermal conductivity $K_\perp$ of the Si/Ge superlattice samples. The values of $K_\perp$ are measured using the 3$\omega$-technique, as a function of temperature as discussed above. The resultant experimental results for $K_\perp$ are fitted using the specularity constant p as a fitting parameter. Then, the specularity constant obtained in this fitting of $K_\perp$ is used to predict the in-plane thermal conductivity using the same basic models as for $K_\perp$ for the in-plane thermal conductivity $K_\parallel$.

Figure 15:
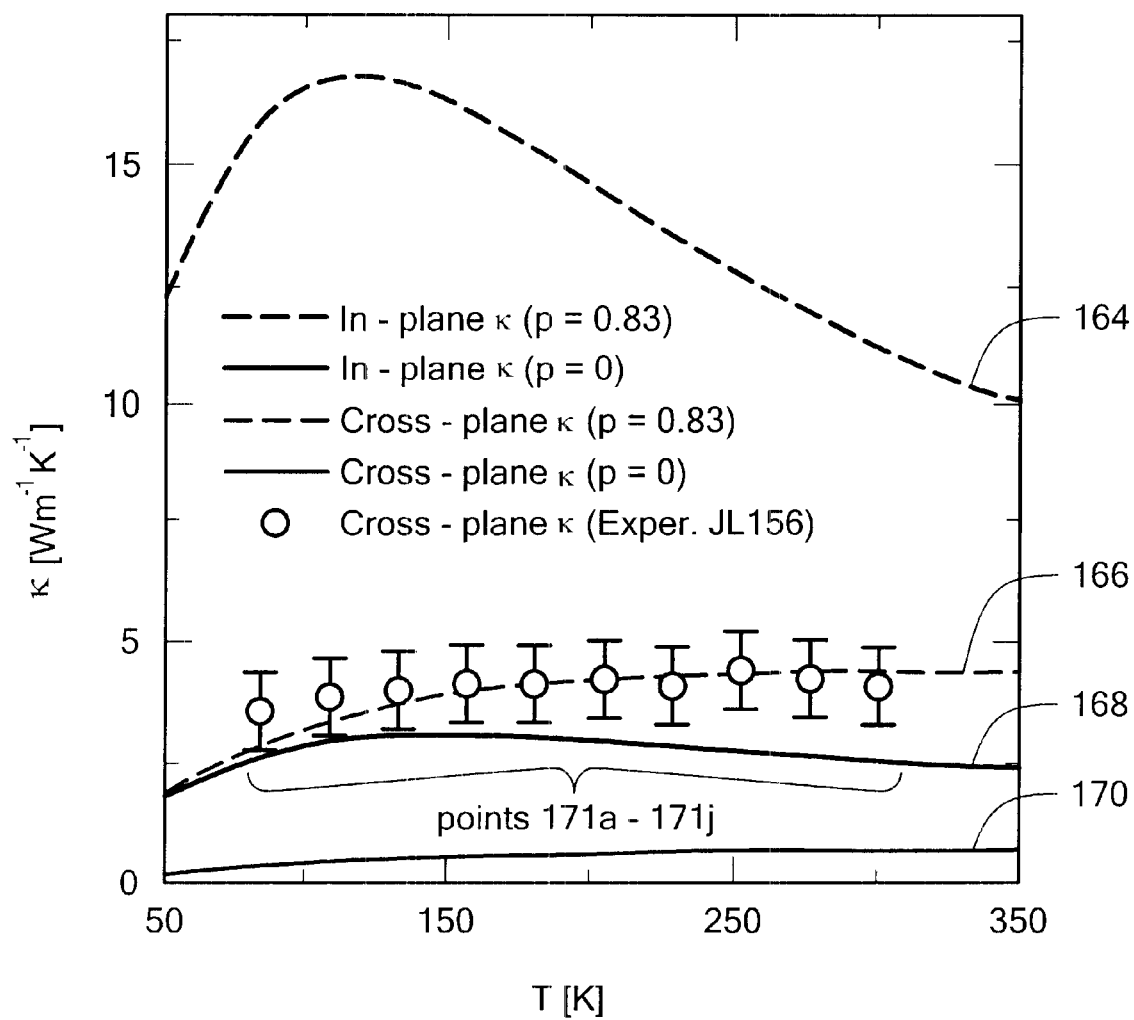
FIG. 15 is a plot of the cross-plane thermal conductivity $K_\perp$ for an MBE-grown Si/Ge superlattice sample in which $d_W+d_B=44$ Å.

Referring now to FIG. 15, curves 164–170 represent estimates of the in-plane and the cross-plane thermal conductivity $K_\parallel$ and $K_\perp$ using a high-quality Si/Ge superlattice sample grown using molecular beam epitaxy (MBE). Curve 164 represents the in-plane values of K (p=0.83), curve 166 represents the cross-plane values of K (p=0.83), curve 168 represents the in-plane values of K for p=0 and curve 170 represents the cross-plane values of K for (p=0). Points 171a–171j represent experimental values of the cross-plane K. The superlattice sample used for this analysis was grown on a (001) Si substrate using a $Si_{1-x}Ge_x$ graded buffer layer, and the thicknesses for the quantum wells (Si) and barrier layers (Ge) for this sample were both determined to be 22 Å.

As can be seen from the curves 164–170 in FIG. 15, the best fit to the experimental cross-plane thermal conductivity for the sample is obtained for the specularity constant p=0.83, which is also consistent with the value of p obtained for the GaAs/AlAs superlattices sample. Using this value (p=0.83) for the specularity constant, the values for the in-plane thermal conductivity $K_\parallel$ of this superlattice sample are predicted to be two to five times larger than those for the cross-plane thermal conductivity $K_\perp$.

FIG. 16 is a schematic diagram showing the conduction band structures for bulk Si and Ge. FIG. 16 shows that Si and Ge have the lowest conduction band minima at the $\Delta$-point and the L-point in the Brillouin zone, respectively. When an interface is created between Si and Ge, the value for the conduction band offset between the Si $\Delta$-point and the Ge L-point (denoted by $\Delta E_c^{Si-Ge}$ in the absence of uniaxial strain ranges between 0.15 eV to 0.35 eV, depending on the hydrostatic component of the lattice strain in the superlattice. A value of 0.25 eV is used for $\Delta E_c^{Si-Ge}$ in the present calculation. It has been found that the final results of the calculated values for the thermoelectric transport coefficients are rather insensitive to the value of $\Delta E_c^{Si-Ge}$ used in the calculation.

Uniaxial strain due to the lattice mismatch at the Si/Ge interfaces leads to a splitting of the conduction bands that are degenerate in the absence of strain. These splittings (denoted as $\Delta E_c^{valley\ name}$) are expressed with respect to the average band position, which is shifted only by the hydrostatic component of the strain. When the uniaxial strain along the (001) direction is applied to a Si or Ge crystal, as is realized in each layer of Si and Ge in a (001) oriented Si/Ge superlattice, the conduction band minima at the $\Delta$-point (called the $\Delta$-valleys) split according to (the energy of the L-point valley extrema is not affected in this case), $$\Delta E_c^{001} = \tfrac{2}{3}\Xi_u^\Delta(\epsilon_\perp - \epsilon_\parallel)$$

$$\Delta E_c^{100,010} = -\tfrac{1}{3}\Xi_u^\Delta(\epsilon_\perp - \epsilon_\parallel)$$

where:
the superscripts to $\Delta E_c$ denote the alignment direction for the pertinent valley;
$\Xi_u^\Delta$ is the strain deformation potential for the $\Delta$-valley (likewise, the notation $\Xi_U^L$ is used to denote the strain deformation potential for the L-valley); and
$\epsilon_\perp(\epsilon_\parallel)$ is the component for the lattice strain tensor perpendicular (parallel) to the interface, as defined below.
Similarly, under uniaxial strain along the (111) direction, as is realized in (111) oriented Si/Ge superlattices, the energies of the $\Delta$-point valleys are not affected, while the energy of the L-point valleys splits according to:

$$\Delta E_c^{111} = \tfrac{2}{3}\Xi_u^L(\epsilon_\perp - \epsilon_\parallel)$$

$$\Delta E_c^{\bar{i}ii,i\bar{i}i,ii\bar{i}} = -\tfrac{2}{9}\Xi_u^L(\epsilon_\perp - \epsilon_\parallel)$$

The values for $\epsilon_\perp$ and $\epsilon_\parallel$ are calculated assuming that the lateral lattice constant (parallel to the interfaces) for the strained layer is equal to that of the substrate, where a linear interpolation technique is utilized to determine the lattice constant for a $Si_{1-x}Ge_x$ substrate, via $\epsilon_\perp = (a_\perp - a_0)/a_0$, and $\epsilon_\parallel = (a_\parallel - a_0)/a_0$. Here, $a_0$ is the lattice constant for the layer in the absence of lattice strain, and $a_\parallel$ (taken to be the lattice constant for the substrate in the present calculation) and $a_\perp$ are the lattice constants parallel and perpendicular to the interfaces, respectively, for the strained layer under consideration. In the present invention, the values for $a_\perp$ are calculated according to:

$$a_\perp = a_0\{1 - D(a_\parallel/a_0 - 1)\}$$

where $D = 2(c_{12}/c_{11})$ and $D = 2(c_{11} + 2c_{12} + 2c_{44})/(c_{11} + 2c_{12} + 4c_{44})$ for the (001) and (111) oriented superlattices, respectively. The values for the elastic constants $c_{11}$, $C_{12}$, $C_{44}$ and other parameters that are used in the present calculations are summarized in Table 5.

TABLE 5

| Band Parameter | Si | Ge |
|---|---|---|
| $a_0$ [Å]$^a$ | 5.4307 | 5.6579 |
| $m_\perp/m^a$ | 0.19 | 0.082 |
| $m_\parallel/m^a$ | 0.92 | 1.59 |
| band minima | $\Delta$ | L |
| $N^b$ | 6 | 4 |
| $\mu$[cm$^2$/V·s]$^c$ | 1350 | 3600 |
| $K_{ph}$[W/m·K]$^d$ | 7.3 | |
| $\Delta E_2^{Si-Ge}$[eV]$^e$ | | 0.25 |
| $c_{11}$ | 1.675 | 1.315 |
| $c_{12}$ | 0.650 | 0.494 |
| $c_{44}$ | 0.801 | 0.684 |
| $\Xi_u^\Delta$[eV] | 9.16 | 9.42 |
| $\Xi_u^L$[eV] | 16.14 | 15.13 |

It should be noted that entries having a superscript "a" denote data taken from O. Madelung, in "Landolt-Bornstein Numerical Data and Functional Relationships in Science and Technology, New Series, Group III: Crystal and Solid State Physics", page 43 and 87, edited by O. Madelung and M., Schutz (Springer-Verlag, Berlin, 1987), Vol. 22a and references therein. Also entries with a superscript "b" denotes a number of equivalent valleys. Entries with a superscript "c" denote bulk carrier mobilities at 300° K. (data taken from the O. Madelung reference). Entries having a superscript "d" denote value of the lattice thermal conductivity used in the present calculations for the Si/Ge superlattices. It should be noted that experimental values found in the literature are somewhat smaller than this value (see S. M. Lee, D. G. Cahill and R. Venkatasubramian, Appl. Phys. Lett., 70, 2957 (1998)). Thus, the resultant values for $Z_{3D}T$ obtained in the calculations of the present invention are conservative.

Entries having a superscript "e" denote conduction band offset between the average position for Si $\Delta$-valleys and the average position for Ge L-valleys. The literature values for $\Delta E^{Si-Ge}$ are between 015 eV and 0.35 eV (see M. M. Reiger and P. Vogl, Phys. Rely. B, 48, 14276 (1993)), depending on the hydrostatic component of the strain in the superlattice.

Figure 17:
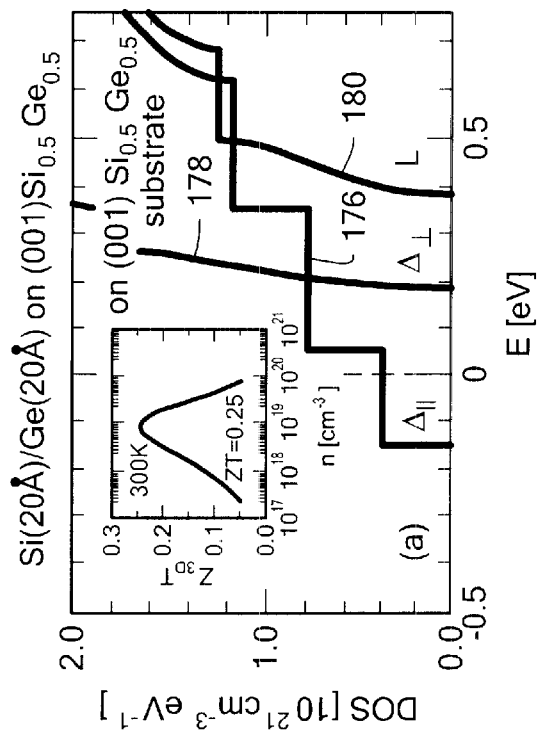
FIG. 17 is a plot of the density of states for electrons in (001) oriented Si/Ge superlattices as a function of energy relative to the Γ point of bulk Si calculated for the sub-bands derived from the $\Delta^{001}$ (curve 176), $\Delta^{100,010}$ (curve 178) and L-(curve 180) point valleys of an Si(20 Å)/Ge(20 Å) superlattice grown on a (001) oriented $Si_{0.50}Ge_{0.50}$ substrate

When a superlattice is grown on a (001) $Si_{0.5}Ge_{0.5}$ substrate, the Si and Ge layers experience tensile and compressive stresses, respectively. Therefore, the energy for the Ge (Si) $\Delta^{001}$-valley is shifted upward (downward) and the Ge (Si) $\Delta^{100,010}$-valley is shifted downward (upward). This makes the effective barrier height larger (smaller) for the quantum well derived from the $\Delta^{001}$-valley $\Delta^{100,010}$-valley). Here, the superscript on $\Delta$ denotes the orientation along which the pertinent valley is aligned. The resulting density of states for electrons, shown in FIG. 17, is calculated for a (001) oriented Si(20 Å)/Ge(20 Å) superlattice grown on a (001) $Si_{0.5}Ge_{0.5}$ substrate, where the thicknesses for the Si and Ge layers (20 Å) are chosen so that the resulting optimum value for $Z_{3D}T$ is maximized. It is noted that the quantum wells for the $\Delta$- and L-valleys are formed in the Si and Ge layers, respectively. Therefore, there is a possibility for the realization of the "Carrier Pocket Engineering condition" for the (001) oriented Si/Ge superlattice.

It should, however, be noted that for this particular case, L-point carriers make a negligible contribution to the transport, because the energy for the L-point subband edge is very high (200 meV above the edge of the subband derived from the $\Delta^{100,010}$-valleys). The resultant $Z_{3D}T$ calculated with this superlattice structure is 0.24 at 300° K., which is rather small, although it is much larger than the value of the corresponding $Z_{3D}T$ for bulk Si ($Z_{3D}T=0.014$ at 300° K.).

Furthermore, the following two approaches can be used to increase the values of $Z_{3D}T$ even further for the Si/Ge superlattices. The first method is to grow the superlattice on a (001) oriented Si substrate so that the effective barrier height for the quantum wells derived from the $\Delta^{001}$-valley will be enhanced due to the compressive stress on the Ge layer as can be seen from the right hand diagram in FIG. 19. Under these circumstances, the $\Delta^{001}$-valley and $\Delta^{100,010}$-valleys in the Ge layer are shifted to higher and lower energies, respectively, because of the uniaxial strain along the (001) direction, while the Si $\Delta$-valleys are left degenerate (since the Si layer is unstrained).

Figure 17A:
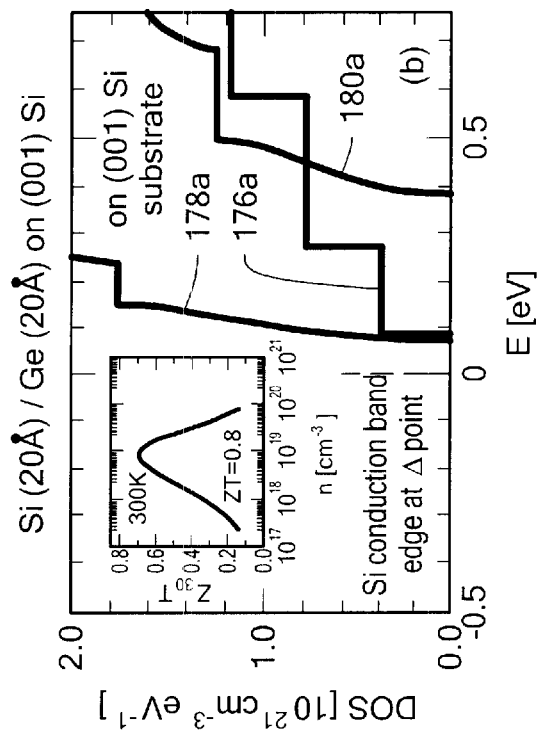
FIG. 17A is a plot of the density of states for electrons in (001) oriented Si/Ge superlattices as a function of energy relative to the Γ point of bulk Si calculated for the sub-bands derived from the $\Delta^{001}$ (curve 176a), $\Delta^{100,010}$ (curve 178a) and L-(curve 180a) point valleys of an Si(20 Å)/Ge(20 Å) superlattice grown on a (001) oriented Si substrate.

Referring now to FIGS. 17, 17A, plots are shown of the density of states for electrons in (001) oriented Si/Ge superlattices as a function of energy relative to the $\Delta$-point of bulk Si calculated for the subbands derived from the $\Delta^{001}$-(curve 176), $\Delta^{100,010}$-(curve 178) and L-(curve 180) point valleys.

FIG. 17 shows results for an Si(20 Å)/Ge(20 Å) superlattice grown on a (001) oriented $Si_{0.5}Ge_{0.5}$ substrate and FIG. 17A shows results for an Si(20 Å)/Ge(20 Å) superlattice grown on a (001) oriented Si substrate. The calculated value of $Z_{3D}T$ as a function of the carrier concentration for each of the superlattices are shown in the inset of FIGS. 17, 17A respectively. The chemical potential $\zeta$ that gives the optimum value of $Z_{3D}T$ (denoted by $Z_{3D}T_{opt}$) is at the band edge of the $\Delta^{\parallel}$-subband for the structures shown in both FIGS. 17 and 17A.

FIG. 17A shows the resultant density of states for a Si(20 Å)/Ge(20 Å) superlattice grown on a (001) Si substrate. The figure shows the density of states for electrons in (001) oriented Si/Ge superlattices as a function of energy relative to the $\Delta$-point of bulk Si calculated for the subbands derived from the $\Delta^{001}$-(curve 176a), $\Delta^{100,010}$-(curve 178a) and L-(curve 180a) point valleys of an Si(20 Å)/Ge(20 Å) superlattice grown on a (001) oriented Si substrate.

With this design of the superlattice, the subband levels associated with the $\Delta^{001}$-valley and the $\Delta^{100,010}$-valleys, respectively, stay very close to each other in energy. This is because the large effective mass along the (001) direction (confinement direction) for the $\Delta^{001}$-valley is compensated by the large barrier height when forming subband levels for the quantum well. The resulting value for $Z_{3D}T$ calculated for this superlattice is 0.78 at 300° K., which represents more than a factor of three enhancement relative to the corresponding value for $Z_{3D}T$ for the superlattice grown on a (001) $Si_{0.5}Ge_{0.5}$ substrate.

One drawback for this design of the superlattice is that the superlattice is not strain-symmetrized, i.e. the lattice constant for a fully relaxed Si(20 Å)/Ge(20 Å) superlattice, which is considered to have the same lattice constant as the $Si_{0.5}Ge_{0.5}$ alloy, is different from the lattice constant for the substrate (Si in this case). Thus, a Si(20 Å)/Ge(20 Å) superlattice can be grown on a (001) oriented Si only up to a certain critical thickness (of the order of 10 to 100 Å) before a large number of crystalline defects and dislocations are introduced, when the superlattice is fully relaxed.

Figure 19:
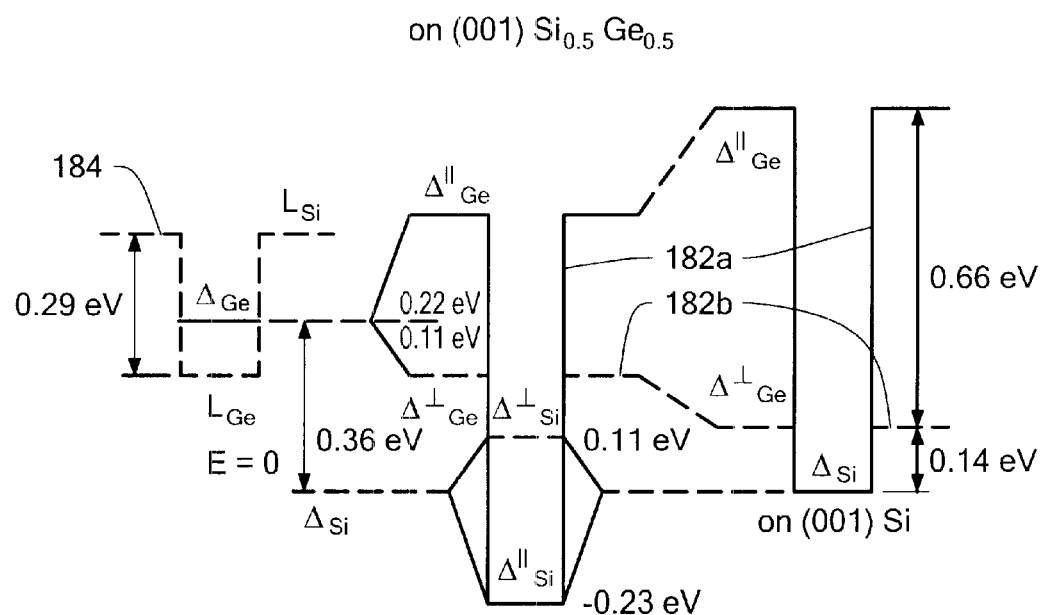
FIGS. 19 and 19A are plots of conduction band offset diagrams for (001) (FIGS. 17 and 17A) and (111) (FIGS. 21 and 22) oriented Si/Ge superlattices.
Figure 19A:
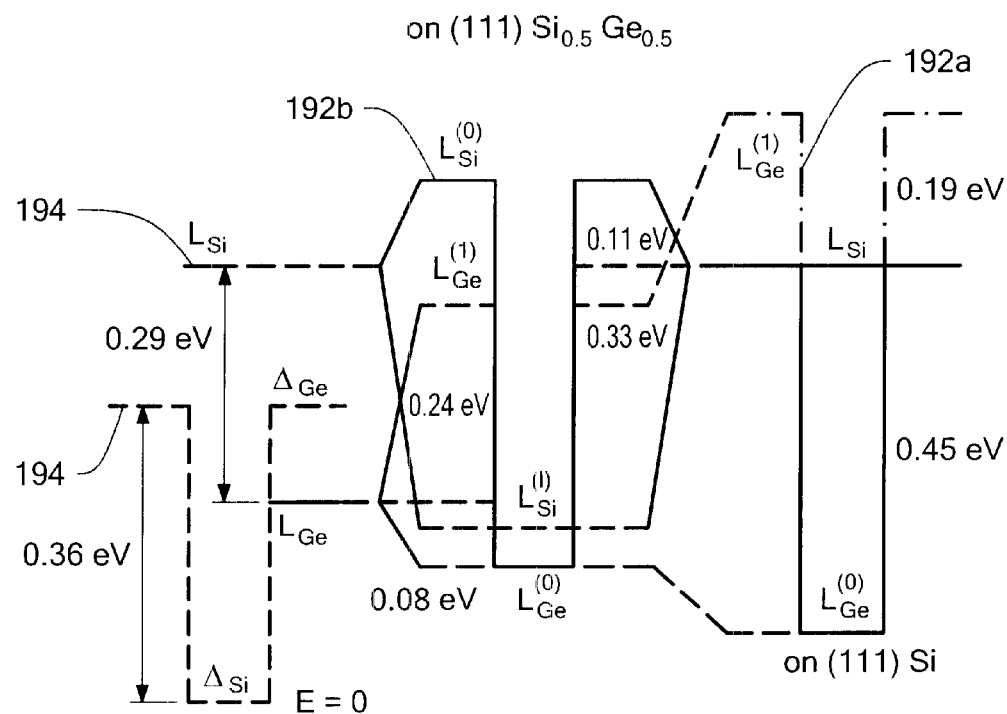

A second method that can be used to increase the values of $Z_{3D}T$ for the Si/Ge superlattice is to grow the superlattice in a (111) direction, which is next discussed in conjunction with FIGS. 19 and 19A.

Referring now to FIG. 19, a plot of the conduction band offsets for the L- and $\Delta$-valleys are shown for a (001) oriented Si/Ge superlattice. The band offsets formed at the $\Delta^{001}$ and $\Delta^{100,010}$ valleys (denoted by $\Delta^{\parallel}$ and $\Delta^{\perp}$, respectively) are represented by curves 182a, 182b, respectively, i.e. the curves represent levels). It should be noted that some portions of curve 182b actually fall on top of curve 182a and this portion of curve 182b is overlapped with 182a. The middle and right portions of FIG. 19 correspond to band offsets for the strained layers for a superlattice grown on a $Si_{0.5}Ge_{0.5}$ substrate and for a superlattice grown on an Si substrate, respectively. The left most portion of FIG. 19 represents the band offsets at the L- and $\Delta$-points in the Brillouin zone for the unstrained Si and Ge layers (as represented by curve 184).

Referring now to FIG. 19A, a plot of the conduction band offsets for the L- and $\Delta$-valleys are shown for a (111) oriented Si/Ge superlattice.

The band offsets formed at the $L^{111}$- and $L^{iii,iii,iii}$-valleys (denoted as $L^{(1)}$ and $L^{(0)}$, respectively, in FIG. 19A) are represented as curves 192a, 192b in FIG. 19A. The middle portion of FIG. 19A denotes the band offsets for the strained layers for a superlattice grown on an $Si_{0.5}Ge_{0.5}$ substrate while the right most portion of FIG. 19A denotes the band offset for the strained layers for a superlattice grown on a (111) Si substrate. The left most portion of FIG. 19A denotes the band offsets for the unstrained layers of the superlattice at the L- and $\Delta$-points in the Brillouin zone (represented as curve 194).

For a superlattice having a (111) orientation (growth direction), the subbands derived from the $\Delta$-valleys of Si and Ge remain degenerate due to symmetry considerations only. The resulting value for $Z_{3D}T$ for the (111) oriented Si(15 Å)/Ge(20 Å) superlattice grown on a (111) oriented $Si_{0.5}Ge_{0.5}$ substrate is calculated to be 0.98 at 300° K. (refer to FIG. 21), which is a factor of 4 enhancement relative to the value of $Z_{3D}T$ calculated for a (001) oriented Si(20 Å)/Ge(20 Å) superlattice grown on a (001) oriented $Si_{0.5}Ge_{0.5}$ substrate.

It is noted that although the Si(15 Å)/Ge(20 Å) superlattice doesn't have a completely strain-symmetrized structure, since $d_{Si} \neq d_{Ge}$, where $d_{Si}$ and $d_{Ge}$ are thicknesses for the Si and Ge layers, respectively, the corresponding values for $Z_{3D}T$ calculated for a completely strain-symmetrized (111) oriented Si(20 Å)/Ge(20 Å) superlattice are found to have similar values ($Z_{3D}T=0.96$ at 300° K.) to those for the Si(15 Å)/Ge(20 Å) superlattice. An even larger value of $Z_{3D}T$ is expected if the superlattice is designed in such a way that the subbands derived from the Δ-valleys and the $L^{\bar{1}\bar{1}\bar{1},\bar{1}\bar{1}\bar{1},\bar{1}\bar{1}\bar{1}}$-valleys stay very close to each other in energy. The latter is realized by growing a Si(15 Å)/Ge(40 Å) superlattice on top of a (111) oriented Si substrate (see FIG. 22).

FIG. 19A (the right hand portion) and FIG. 22 show the band offsets and resulting electronic density of states as a function of energy, respectively, for the strain-non-symmetrized Si(15 Å)/Ge(40 Å) superlattice. Since the Ge layers in this superlattice are compressively strained while the Si layer is unstrained, only the Ge L-point valleys are split into a $L^{111}$-valley (higher in energy) and $L^{\bar{1}\bar{1}\bar{1},\bar{1}\bar{1}\bar{1},\bar{1}\bar{1}\bar{1}}$-valleys (lower in energy). The resulting value for $Z_{3D}T$ calculated for this structure is 1.25, which is a factor of five enhancement relative to the corresponding value of $Z_{3D}T$ for the Si(20 Å)/Ge(20 Å) superlattice grown on a (001) oriented $Si_{0.5}Ge_{0.5}$ substrate. It should be noted that the growth of such a strain-non-symmetrized superlattice is not yet possible with current MBE technology. The realization of such superlattices awaits future developments in material science.

FIG. 20 shows the location of the L alleys superimposed on a cartesian coordinate system.

Referring now to FIGS. 21–22B, a series of plots are shown which represent the density of states for electrons in (111) oriented Si/Ge superlattices as a function of energy relative to the Δ-point of bulk Si. In FIG. 21, these densities of states for electrons are calculated for the subbands derived from the $L^{111}$-point valley (represented by curve 242), $L^{\bar{1}\bar{1}\bar{1},\bar{1}\bar{1}\bar{1},\bar{1}\bar{1}\bar{1}}$-point valleys (represented by curve 240), and Δ-point valleys (represented by curve 243). FIG. 21 corresponds to an Si(15 Å)/Ge(20 Å) superlattice grown on a (111) oriented $Si_{0.5}Ge_{0.5}$ substrate, while FIG. 22 corresponds to a Si(15 Å)/Ge(40 Å) superlattice grown on a (111) oriented Si substrate. The calculated values of $Z_{3D}T$ as a function of the carrier concentration are shown in FIGS. 21A and 22A (which are insets to FIGS. 21 and 22, respectively). The chemical potential ζ that gives the optimum value of $Z_{3D}T$ (denoted by $Z_{3D}T_{opt}$) is at the band edge of the Δ-subband for the structures shown in both FIGS. 21 and 22.

In FIG. 21A, $Z_{3D}T_{opt}$ equals 0.98 and in FIG. 22A $Z_{3D}T_{opt}$ equals 1.25.

Figure 23:
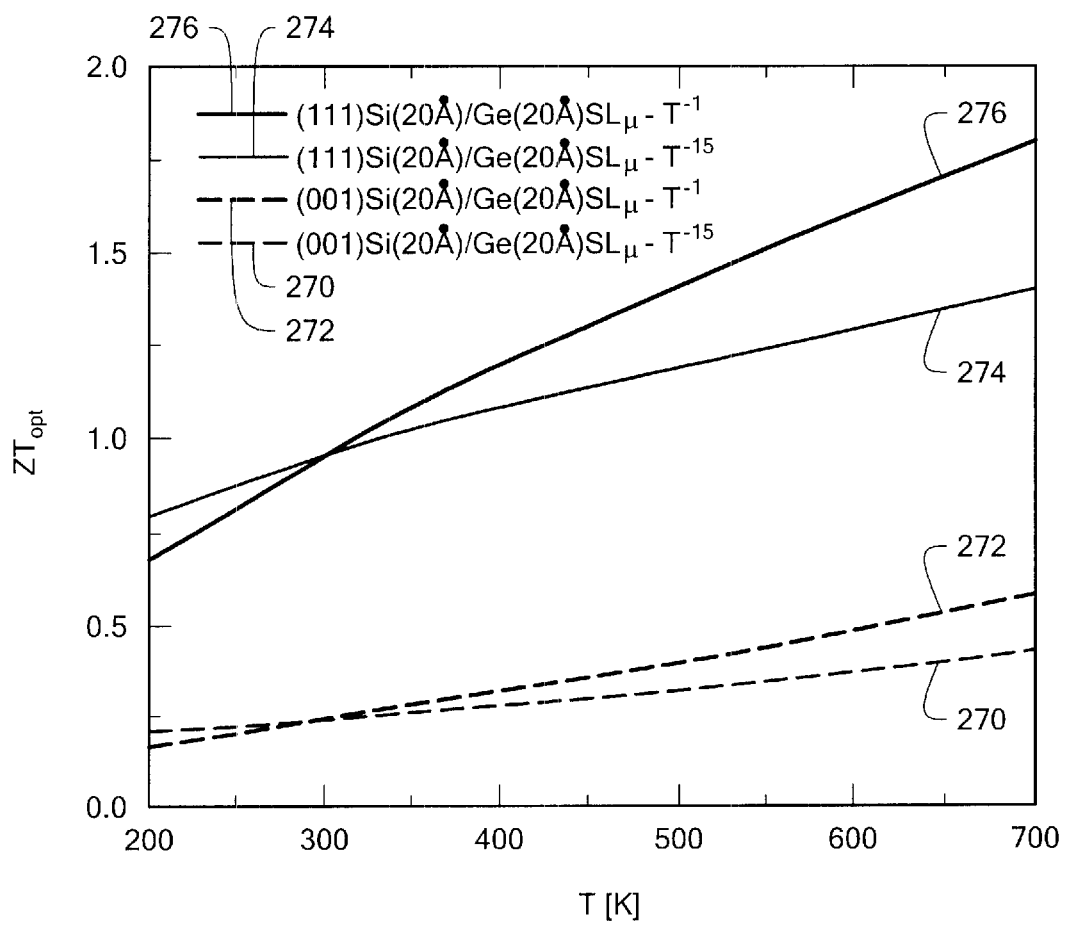
FIG. 23 is a plot showing the optimized ZT as a function of temperature for a series of (001) and (111) SiGe superlattice structures with different temperature dependences of the mobilities.

The temperature dependence of $Z_{3D}T$ is next explained with reference to FIG. 23. Referring now to FIG. 23, the calculated value for $Z_{3D}T$ as a function of temperature is shown for a strain-symmetrized (001) oriented Si(20 Å)/Ge (20 Å) superlattice grown on a (001) oriented $Si_{0.5}Ge_{0.5}$ substrate as well as for a strain-symmetrized (111) oriented Si(20 Å)/Ge(20 Å) superlattice grown on a (111) oriented $Si_{0.5}Ge_{0.5}$ substrate. The calculation was made assuming a $T^{-v}$ dependence for the value of μ (where μ is the electron mobility) with v=1 (empirical result for bulk Si) and v=1.5 (acoustic phonon deformation potential scattering). It is also assumed that the value $K_{ph}$ for the Si/Ge superlattices is constant with temperature, since the length for the phonon mean free path l is limited by the thicknesses of the Si and Ge layers. The results are plotted as curves 270–276.

Examination of FIG. 23 reveals that the value of $Z_{3D}T$ increases significantly as the temperature is increased for the strain-symmetrized (111) oriented Si(20 Å)/Ge(20 Å) superlattice, so that $Z_{3D}T \cong 1.5$ is predicted at ~600° K. for such a superlattice. It turns out that the dominant scattering mechanism for an actual (001) oriented Si(20 Å)/Ge(20 Å) superlattice (for $n > 1 \times 10^{18}$ cm$^{-3}$) is ionized impurity scattering. Although ionized impurity scattering has an effect of increasing the value of the Seebeck coefficient through its $\tau \sim E^{3/2}$ dependence for the relaxation time τ for electrons, where E is the energy of the electrons measured from the pertinent band edge, impurity scattering also has the effect of reducing the value of carrier mobility μ relative to the values obtained without ionized impurity scattering, as realized in lightly doped or undoped samples ($n < 1 \times 10^{17}$ cm$^{-3}$). However, the effect of ionized impurity scattering should be greatly reduced by introducing δ- and modulation doping techniques to dope carriers into the superlattices.

It should now be appreciated that the concept of carrier pocket engineering as applied to the strained Si/Ge superlattices to design superlattices with enhanced values of $Z_{3D}T$ is useful. The effect of the lattice strain at the Si/Ge interfaces is shown to be utilized as an additional tool to control the conduction band structure of the superlattice. The value of $Z_{3D}T$ calculated for a strain-non-symmetrized, (111) oriented Si(15 Å)/Ge(40 Å) superlattice using the constant relaxation time approximation is 1.25 at 300° K., which represents a factor of 1.25 enhancement relative to the corresponding value of $Z_{3D}T$ calculated for a strain-symmetrized, (111) oriented Si(20 Å)/Ge(20 Å) superlattice using the same basic models.

The theoretical predictions made herein were tested using strain-symmetrized (001) oriented Si(20 Å)/Ge(20 Å) superlattice samples that are homogeneously doped throughout the Si/Ge superlattice part of the sample. It turns out that the experimental results obtained in this study are in fair agreement, in the temperature range between 4.2° K. and 300° K., with the results of semi-classical models that were developed, which utilize ionized impurity scattering as the dominant scattering mechanism.

Figure 24:
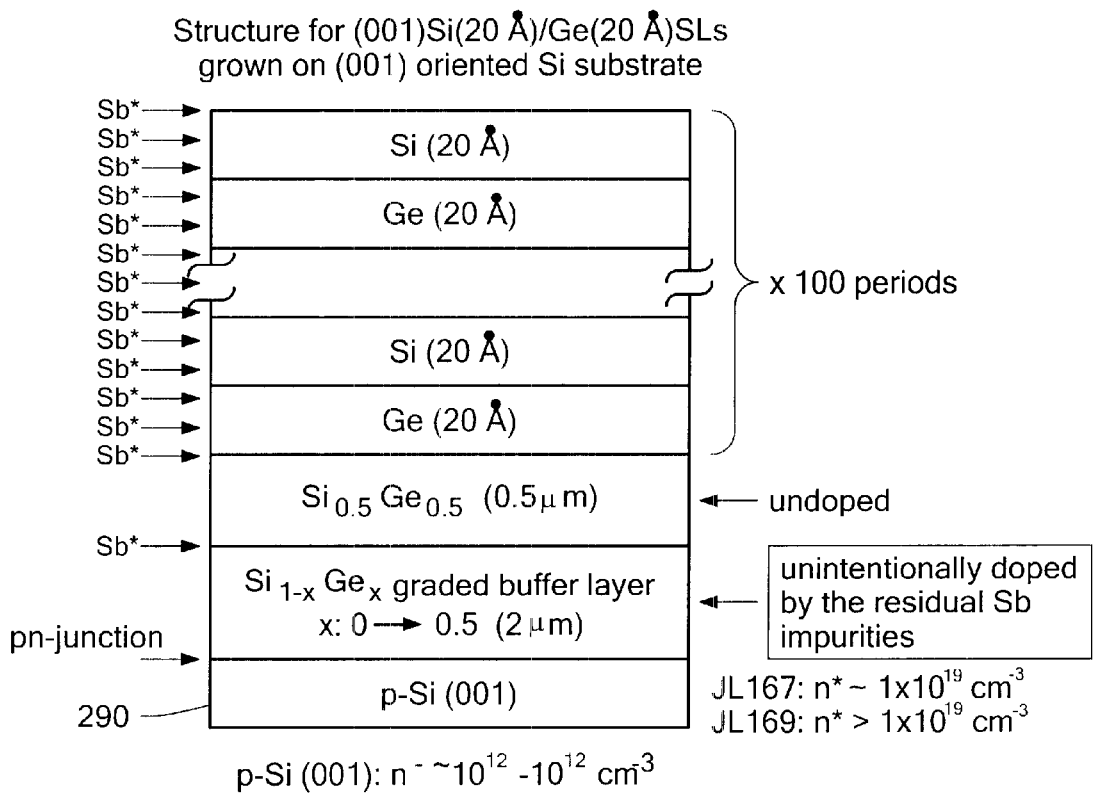
FIG. 24 is a schematic diagram to show the sample structure for Si(20 Å)/Ge(20 Å) superlattice grown on a (001) oriented Si substrate.
Figure 25:
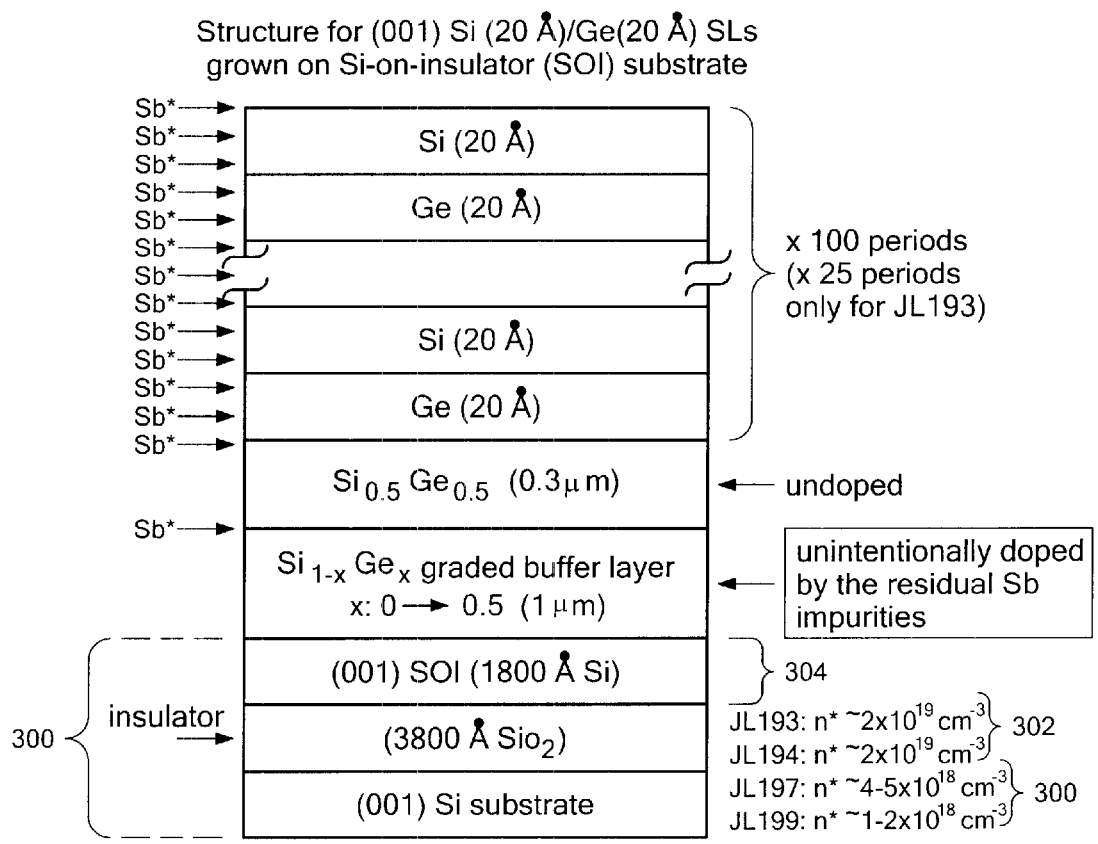
FIG. 25 is a schematic diagram to show the sample structure for Si(20 Å)/Ge(20 Å) superlattice grown on an Si-on-insulator substrate.

Referring now to FIGS. 24 and 25, high quality (001) oriented Si(20 Å)/Ge(20 Å) superlattice samples used for the experimental proof-of-principle study are shown.

These samples are grown by a molecular-beam epitaxy (MBE) technique using an $Si_{1-x}Ge_x$ graded buffer layer on top of a (001) oriented Si (FIG. 24) or Si-on-insulator (SOI) substrate (FIG. 25). In both of these structures, the Ge composition x is gradually increased from 0 to 0.5 across the thickness (1–2 μm) of the buffer layer as shown on FIGS. 24 and 25.

The structures of these samples are schematically drawn in FIGS. 24 and 25. In FIG. 24 the samples (denoted JL167 and JL169) are grown on top of (001) oriented Si substrates 290. In FIG. 25, the samples (denoted JL193, JL194, JL197 and JL199) are grown on top of (001) oriented SOI substrates 300 using thinner buffer layers than those used for samples JL167 and JL169.

In FIG. 24, the sample structure for the Si(20 Å)/Ge(20 Å) superlattices grown on (001) oriented Si substrates (samples JL167 and JL169) are provided having dopant concentrations (denoted by $n^+$) in the range of about $1 \times 10^{18}$ cm$^{-3}$ to about $2 \times 10^{19}$ cm$^{-3}$. The (001) Si substrate (the bottom most layer in FIG. 24) is slightly p-type doped ($n \approx 10^{12} - 10^{13}$ cm$^{-3}$). The $Si_{1-x}Ge_x$ graded buffer layer is slightly doped n-type due to residual Sb surfactant impurities. Thus a pn-junction is formed at the interface between the $Si_{1-x}Ge_x$ (x: 0→0.5) graded buffer layer and the (001) oriented p-type Si substrate, which should provide good electrical insulation between the film (superlattice+buffer layer) and the substrate.

In FIG. 25, the sample structure for the Si(20 Å)/Ge(20 Å) superlattices grown on (001) oriented SOI substrates 300 (samples JL193, JL194, JL197 and JL199) are provided having dopant concentrations (also denoted by $n^-$) in the range of about $1 \times 10_{18}$ cm$^{-3}$ to about $2 \times 10^{19}$ cm$^{-3}$. These samples are provided to avoid the effect of increasing S below 200° K. due to the Si substrate.

The SOI substrate 300 is composed of 1800 Å of a (001) oriented Si layer 304 on top of a 3800 Å $SiO_2$ layer 302 where the $SiO_2$ layer 302 is grown on top of the (001) oriented Si substrate 300 as well. This 3800 Å $SiO_2$ layer 302 should provide perfect electrical insulation between the film (the layers above the 1800 Å Si layer in FIG. 25) and the (001) oriented Si substrate underneath the 3800 Å $SiO_2$ layer. In addition, a 3800 Å $SiO_2$ layer is considered to provide good thermal insulation between the film and the substrate.

For both sets of samples, the actual Si(20 Å)/Ge(20 Å) superlattices are grown on top of an undoped $Si_{0.5}Ge_{0.5}$ buffer layer (0.3–0.5 μm in thickness) that is grown on top of the $Si_{1-x}Ge_x$(x: 0→0.5) graded buffer layer mentioned above.

The fabrication processes for these superlattices are briefly explained as follows. First, a layer of $Si_{1-x}Ge_x$(x: 0→0.5) graded buffer layer is grown on top of a (001) oriented Si or SOI substrate using Sb (antimony) as a surfactant (using the surfactant-mediated growth technique). The $Si_{1-x}Ge_x$(x: 0→0.5) graded buffer layer grown in this way typically has a very small threading dislocation density ($1.5\times10^4$ $cm^{-2}$) and has atomically smooth surfaces, whose surface roughness is estimated to be 20 Å from a number of AFM studies (20 μm×20 μm in area) for similarly grown samples. Second, a homogeneous, undoped $Si_{0.5}Ge_{0.5}$ buffer layer (0.3–0.5 μm in thickness) is grown on top of the $Si_{1-x}Ge_x$(x: 0→0.5) graded buffer layer.

It is noted that a sheet of Sb impurities, that were used as a surfactant for the growth of the $Si_{1-x}Ge_x$(x: 0→0.5) graded buffer layer, remain at the interface between the $Si_{1-x}Ge_x$(x: 0→0.5) graded buffer layer and the undoped $Si_{0.5}Ge_{0.5}$ buffer layer. No surfactant is used for the growth of the undoped $Si_{0.5}Ge_{0.5}$ homogeneous buffer layer.

There are the following two roles for the undoped $Si_{0.5}Ge_{0.5}$ homogeneous buffer layer. First, since the Sb surfactant impurities that are used for the growth of the $Si_{1-x}Ge_x$(x: 0→0.5) graded buffer layer act as an n-type dopant, an undoped $Si_{0.5}Ge_{0.5}$ layerce part of the sample. And second, since the top surface of the $Si_{1-x}Ge_x$(x: 0→0.5) graded buffer layer is highly strained due to the rapid (though continuous) change in the lattice constant across the thickness of the buffer layer, an additional layer of homogeneous $Si_{0.5}Ge_{0.5}$ (0.3–0.5 μm in thickness) is needed to obtain a (001) surface of $Si_{0.5}Ge_{0.5}$ that is fully relaxed through the lattice strain for the growth of strain-symmetrized (001) oriented Si/Ge superlattices.

Finally, structurally strain-symmetrized Si(20 Å)/Ge(20 Å) superlattices [with 100 periods, except for sample JL193, where only 25 periods of the Si(20 Å)/Ge(20 Å) layers] were grown on top of the undoped (001) oriented $Si_{0.5}Ge_{0.5}$ buffer layer. The growth temperature for the Si(20 Å)/Ge(20 Å) layers is chosen to be 500 °C. for samples JL167 and JL169. The growth temperature used for the growth of Si(20 Å)/Ge(20 Å) layers in samples JL193, JL194, JL197 and JL199 was 350° C. to provide sharper Si/Ge interfaces in the superlattice by reducing interdiffusion problems.

The samples used in the present investigation are homogeneously doped through-out the whole thickness of the Si(20 Å)/Ge(20 Å) superlattice part of the sample during the growth process. The doping levels of the samples are in the range of about $1\times10^{18}$ $cm^{-3}$ to about $2\times10^{19}$ $cm^{-3}$, where Sb impurities are used as an 3-type dopant. In alternate embodiments, it may be desirable to use δ- and/or modulation doping of the Si/Ge superlattices, since the values of $Z_{3D}T$ for the samples that are δ- or modulation-doped in the Ge layers are predicted to be significantly enhanced relative to the values of the corresponding $Z_{3D}T$ for the homogeneously doped samples.

It has also been found that the measured Seebeck coefficient |S| is enhanced above 300° K. relative to the values predicted by theory at room temperature, and the difference between the values of the measured |S| and the predicted |S| increases with increasing temperature. A check has been made to confirm that such an increase in |S| above 300° K. is not due to the parallel transport contributions from the buffer layer and/or substrate using the parallel conductors model.

Next discussed are models, developed under the semi-classical Boltzmann transport theory, used to predict the values of the transport coefficients for the (001) oriented Si(20 Å)/Ge(20 Å) superlattices that were discussed herein above. It should be appreciated that the basic technique of the Boltzmann transport theory calculations is already discussed for a two-dimensionally confined electron gas in a (111) oriented PbTe(20 Å)/$Pb_{1-x}Eu_xTe$(400 Å) MQW (multiple-quantum-well) sample, assuming longitudinal acoustic phonon deformation potential scattering and polar optical phonon scattering. It should also be appreciated that the z-direction (superlattice growth direction) wavefunction for a (001) oriented Si(20 Å)/Ge(20 Å) superlattice is sufficiently confined within the Si layers so that the overlap of the wavefunction between the two adjacent quantum wells (Si layers) is negligible.

Detailed differences between the modeling of (111) PbTe (20 Å)/$Pb_{1-x}Eu_xTe$(400 Å) MQWs and that of (001) oriented Si(20 Å)/Ge(20 Å) superlattices include: (1) inclusion of the thickness of the Ge layers into the formalism when calculating the transport coefficients in the case of Si(20 Å)/Ge(20 Å) superlattices (this is done since the interest is in the values of $Z_{3D}T$, rather than the values of $Z_{2D}T$); (2) the dominant scattering mechanisms included in the models for the (001) orieSi(20 Å)/Ge(20 Å) superlattices are screened ionized impurity scattering and longitudinal acoustic phonon deformation potential scattering. For PbTe(20 Å)//$Pb_{1-x}Eu_xTe$(400 Å) MQWs, on the other hand, ionized impurity scattering is not important because of the large static dielectric constant ($\epsilon_S$~414 $\epsilon_0$ at 300° K.) of these MQWs. Instead, polar optical phonon scattering was one of the most important scattering mechanisms in PbTe/$Pb_{1-x}Eu_xTe$ MQWs. Thus, this scattering process would be included in the optimization step 16 in FIG. 1 when modeling the vaue of $Z_{2D}T$ (or $Z_{3D}T$) for PbTe/$Pb_{1-x}Eu_xTe$ MQWs.

On the other hand, in the (001) oriented Si(20 Å)/Ge(20 Å) superlattices, polar optical phonon scattering is not important, since both Si and Ge are not polar in nature (elemental semiconductors). Instead, ionized impurity scattering becomes one of the most important scattering mechanisms in the Si/Ge superlattices because the static dielectric constants for these materials are relatively small ($\epsilon_S$~1.7$\epsilon_0$ and 16.1$\epsilon_0$ for Si and Ge, respectively), and because general thermoelectric applications require rather large carrier concentrations ($>5\times10^{18}$ $cm^{13}$).

The detailed differences between the modeling of (111) PbTe(20 Å)/$Pb_{1-x}Eu_xTe$(400 Å) MQWs and that of (001) oriented Si(20 Å)/Ge(20 Å) superlattices further include: (3) The effects of the free carrier screening both on ionized impurity scattering and longitudinal acoustic phonon deformation potential scattering through the inclusion of a Debye screening length λ are included in the theoretical formalism for the (001) oriented Si(20 Å)/Ge(20 Å) superlattices; and (4) the energy dispersion relation for the (001) oriented Si(20 Å)/Ge(20 Å) superlattices is assumed to be parabolic, whereas the non-parabolicity in the energy dispersion relations was explicitly considered in the (111) oriented PbTe/$Pb_{1-x}Eu_xTe$ MQWs.

It has been found that the predicted values for the carrier mobility for the δ- and modulation doped superlattices are enhanced significantly relative to the corresponding values of the mobility predicted for the homogeneously doped (001) oriented Si(20 Å)/Ge(20 Å) superlattices, while the values of the Seebeck coefficient are almost unaffected by the specific doping schemes considered for carrier injection. Therefore, it is concluded that the thermoelectric properties of the actual (001) oriented Si(20 Å)/Ge(20 Å) superlattices should be accordingly enhanced by introducing the δ- and modulation doping techniques for carrier doping.

Furthermore, using the concept of the carrier pocket engineering with the (111) oriented Si/Ge superlattices, a factor of four enhancement is predicted in the values of $Z_{3D}T$ for a (111) oriented Si(20 Å)/Ge(20 Å) superlattice relative to the corresponding values of $Z_{3D}T$ for a (001) oriented Si(20 Å)/Ge(20 Å) superlattice using a simple model based on the constant relaxation time approximation as discussed herein above.

One can introduce the dopant impurities using different doping techniques including homogeneously doped superlattice where the ionized impurity dopants are introduced homogeneously throughout the Si(20 Å)/Ge(20 Å) superlattice layers; modulation-doped superlattice, where the ionized impurity dopants are homogeneously distributed only in the Ge layers of the Si(20 Å)/Ge(20 Å) superlattices; and δ-doped superlattice, where the ionized impurity dopants are introduced two-dimensionally in the middle of each Ge layer in the Si(20 Å)/Ge(20 Å) superlattices.

If the Kronig-Penney model is adopted, for simplicity, it is possible to predict both the z-direction wavefunction $\psi_z(Z)$ (which predicts the distribution of the free carriers along the z-direction) and the conduction band potential profile (which is determined by the distributions of the ionized impurities and of the free carriers) in a self-consistent manner by solving the Schrödinger equation and the Poisson equation simultaneously, including the band bending effect along the z-direction.

There is a certain relation between the scattering rate for the conduction electrons in 2D systems and the degree of quantum confinement for the conduction electrons along the z-direction as is evident in (111) oriented PbTe(20 Å)/Pb$_{1-x}$Eu$_x$Te(400 Å) multiple-quantum-wells, where it has been found that the scattering rate for the longitudinal subband is enhanced relative to that for the oblique subband due to the larger values of the $$\int_{-\infty}^{\infty} |(G(q))_z|^2 dq_z$$

factor $$\left(G(q_z) = \int_{-\infty}^{\infty} \Psi_z^*(z) e^{iq_z z} \Psi_z(z) dz\right)$$

for the longitudinal subband than for the oblique subband. It is noted that the larger the confinement of the conduction electrons in the z-direction (i.e., the narrower the width of $|\Psi_z(z)|^2$), the broader the width of $|G(q_z)|^2$, where the value of $G(q_z)$ at $q_z=0$, denoted by $G(0)$, is always unity (i.e., $$G(0) = \int_{-\infty}^{\infty} |\Psi_z(z)|^2 dz = 1 \Big).$$

This indicates that a large quantum confinement does not necessarily imply enhanced thermoelectric properties (since the mobility is reduced due to the increased $$\int_{-\infty}^{\infty} |G(q_z)|^2 dq_z$$

factor). Therefore, it is necessary to develop an improved optimization process to maximize the value of $Z_{3D}T$, including the nature of the 2D electron gas, so that one can predict the most desirable design of the superlattice to obtain the largest value of $Z_{3D}T$ using 2D systems.

Once the momentum relaxation time function τ (E) is obtained by solving the Boltzmann equation, one can use the following expressions to evaluate the electrical conductivity σ and the Seebeck coefficient S for the model system of the (001) oriented Si(20 Å)/Ge(20 Å) superlattices:

$$\sigma = \frac{n_{3D} e^2}{m^*} \langle \tau(E) \rangle$$

for the electrical conductivity, and $$S = -\frac{1}{eT} \left\{ \frac{\langle E\tau(E) \rangle}{\langle \tau(E) \rangle} - \zeta \right\}$$

for the Seebeck coefficient, where ζ is the chemical potential and <A> denotes the following average for the energy dependent quantity A in 2D systems:

$$\langle A \rangle = \frac{\int_0^\infty \left(-\frac{\partial f_0}{\partial E}\right) A(E) E dE}{\int_0^\infty \left(-\frac{\partial f_0}{\partial E}\right) E dE}$$

$f_0(E)$ denotes the Fermi-Dirac distribution function, and the energy E is measured from the pertinent band edge.

The calculation of the Seebeck coefficient for (001) oriented Si(20 Å)/Ge(20 Å) superlattices as a function of the carrier concentration n, where one can choose (1) homogeneous doping throughout the whole superlattice layers, (2) modulation doping only in the Ge layers, and (3) δ-doping at the center of each Ge layer, shows that the predicted values of |S| that are obtained using the semi-classical models developed are greatly enhanced over the values predicted by the constant relaxation time approximation. This is because the momentum relaxation time τ (E) predicted using the semi-classical models developed is an increasing function of energy. Such a property of the τ (E) function is mainly caused by the nature of ionized impurity scattering, where a τ (E)~E$^{-3/2}$ dependence is predicted for pure ionized impurity scattering for 3D materials without including the screening effect due to the free carriers.

The second feature that is observed is that although the predicted values for |S| are rather insensitive to the details of the doping techniques that are considered here, they do show some differences among these doping schemes. The main reason for the observed differences in the value of |S| among these three doping techniques comes from the amount of the relative contribution of ionized impurity scattering to the total scattering probability for the conduction electrons. It is predicted that the contribution of ionized impurity scattering to the total scattering probability is the largest in the homogeneously doped samples and is the smallest in the δ-doped samples among the three doping techniques considered here.

Therefore the resultant τ (E) function for the δ-doped superlattice samples is expected to have the weakest energy dependence among those for the three doping schemes considered here.

Although the predicted values for |S| for the δ-doped and the modulation-doped (001) oriented Si(20 Å)/Ge(20 Å) superlattices are found to be smaller than those predicted for the homogeneously-doped samples, if the predicted values for the carrier mobility for the δ-doped and the modulation-doped samples are significantly larger than the corresponding values for the homogeneously doped superlattice samples, one can still achieve enhancements in the thermoelectric power factor S2 and the resultant $Z_{3D}T$ relative to those predicted for the homogeneously doped samples, by introducing the δ- and/or modulation doping schemes, since the observed differences in the predicted values of |S| between the δ- and modulation-doped samples and the homogeneously doped samples are rather small.

Carrier Mobility

It is found that the enhancements in the predicted values of the carrier mobility for the δ-doped or modulation-doped superlattices relative to the corresponding values for the homogeneously doped samples are larger in the heavy doping regime (n>5×10$^{18}$ cm$^{-3}$) than in the light doping regime (n<5×10$^{18}$ cm$^{-3}$). This is because the δ-doped or modulation-doped impurities are screened by the free carriers more strongly than the homogeneously doped impurities in the particular models that are used to describe the (001) oriented Si(20 Å)/Ge(20 Å) superlattices (Kronig-Penney model). Also a uniform, isotropic medium has been assumed when calculating the values of the Debye screening length for the Si(20 Å)/Ge(20 Å) superlattices.

The calculated values for the Debye screening length λ as a function of the carrier concentration at 300° K. are found to decrease with increasing carrier concentration. Since the magnitude of the scattering potential created by an ionized impurity decays exponentially with the distance r (where r is measured from the center of the impurity potential) for a distance larger than the Debye screening length, the ionized impurities that are most effective in scattering electrons are those located within the Debye screening length from the center of the electron's wavefunction. Since the position of the δ-doped impurities is 20 Å away from the center of the Si layers in the model for the δ-doped Si(20 Å)/Ge(20 Å) superlattices, ionized impurity scattering is expected to be relatively unimportant in the δ-doped samples for carrier concentrations larger than 5×10$^{19}$ cm$^{-3}$, where the Debye screening length λ is predicted to be smaller than 20 Å. This is the reason for the observed increase in the predicted carrier mobility for the δ-doped Si(20 Å)/Ge(20 Å) superlattices in the heavy doping regime (n>3×10$^{18}$ cm$^{-3}$).

Similarly, it has been found that the predicted values for the thermoelectric power factor S$^2$σ obtained by combining the corresponding results for |S| and a for the δ- and modulation-doped (001) oriented Si(20 Å)/Ge(20 Å) superlattices are greatly enhanced relative to the corresponding values predicted for the homogeneously doped superlattices.

A relatively large (a factor of two) enhancement in the values of $Z_{3D}T$ can be expected for the δ- or modulation-doped (001) oriented Si(20 Å)/Ge(20 Å) superlattice samples relative to the corresponding values for the homogeneously doped (001) oriented Si(20 Å)/Ge(20 Å) superlattice samples.

It should now be appreciated that one can use semi-classical models to predict the thermoelectric properties of the (001) oriented Si(20 Å)/Ge(20 Å) superlattices including ionized impurity scattering and longitudinal acoustic phonon deformation potential scattering. The following three doping schemes have been explicitly considered in the models to predict the effect of the δ- and modulation doping techniques to enhance the values of the carrier mobility relative to those for the homogeneously doped samples: (1) The model superlattice is homogeneously doped throughout the whole superlattice (homogeneously doped samples). (2) The impurity ions are introduced only in the Ge layers of the superlattice. Within the Ge layers, the impurity ions are homogeneously distributed (modulation-doped samples). (3) The model superlattice is δ-doped in the middle of each Ge layer (δ-doped sample).

Use of the above-described techniques has shown significant enhancements in the values of the calculated mobility for the δ-doped or modulation-doped samples when compared with the corresponding values for the homogeneously doped samples. The enhancements are by a factor of two to three, depending upon the temperature and the carrier concentration. The largest value for $Z_{3D}T$ that is obtained for the δ-doped sample at 300° K. is 0.49. This value is obtained using a constant K=5 W/m·K for the value of thermal conductivity. This value of $Z_{3D}T$ is a factor of more than two enhancement relative to the corresponding value for the homogeneously doped samples ($Z_{3D}T$=0.22).

Furthermore, regarding the (111) oriented Si/Ge superlattices, it has been shown that the optimum value of $Z_{3D}T$ for a (111) oriented Si(20 Å)/Ge(20 Å) superlattice may be as much as a factor of four larger than the corresponding value for a (001) oriented Si(20 Å)/Ge(20 Å) superlattice. This result is shown using a simple model based on the constant relaxation time approximation. The semi-classical treatment of the thermoelectric transport coefficients for the (001) oriented Si(20 Å)/Ge(20 Å) superlattices can be extended to predict the thermoelectric properties of the (111) oriented Si/ Ge superlattices. Combining the effect of the enhanced density of states near the band edge in the (111) oriented Si/Ge superlattices (relative to the corresponding (001) oriented Si/Ge superlattices or to the corresponding bulk materials (Si or Ge)) and the effect of enhancing the values of the carrier mobility using the δ- or modulation-doping techniques, one can expect a truly large enhancement in the value of $Z_{3D}T$ (relative to the corresponding values for the (001) oriented Si/Ge superlattices and for the corresponding constituent bulk materials (Si or Ge)) and a practically useful value of $Z_{3D}T$ ($Z_{3D}T$ ≈2.0 at 300° K.) in the (111) oriented Si/Ge superlattice systems.

Figure 26:
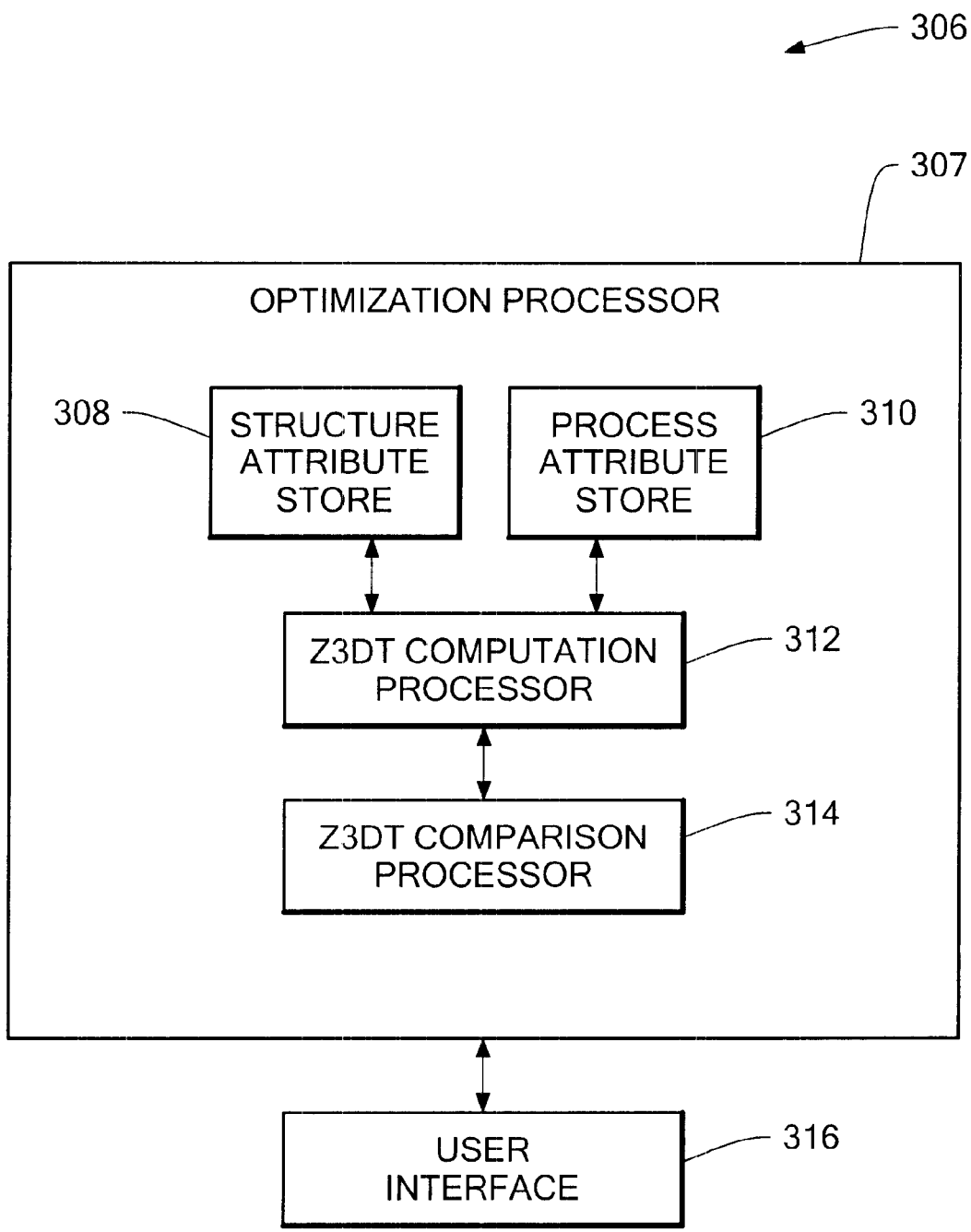
FIG. 26 is a schematic diagram of a system for designing superlattice structures using the carrier pocket engineering techniques described in conjunction with FIGS. 1–25.

Referring now to FIG. 26, a system 306 for implementing the carrier pocket engineering technique described herein includes an optimization processor coupled to a user interface. The optimization processor 307 performs the processes described herein to provide superlattice structures in accordance with the carrier pocket engineering concepts explained herein and having enhanced values of $Z_{3D}T$. The optimization processor includes structure attribute and process attribute storage devices 308, 310, each coupled to a computation processor 312 for computing $Z_{3D}T$ values using the techniques described hereinabove. The computation processor is coupled to a comparison processor 314 which compares the $Z_{3D}T$ values computed by the computation processor 312 and identifies preferred $Z_{3D}T$ values and the structures which provided such preferred values. The optimum values for the structural parameters, dopant concentration and the resultant value for the optimum $Z_{3D}T$ are provided to a user interface 316.

Figure 27:
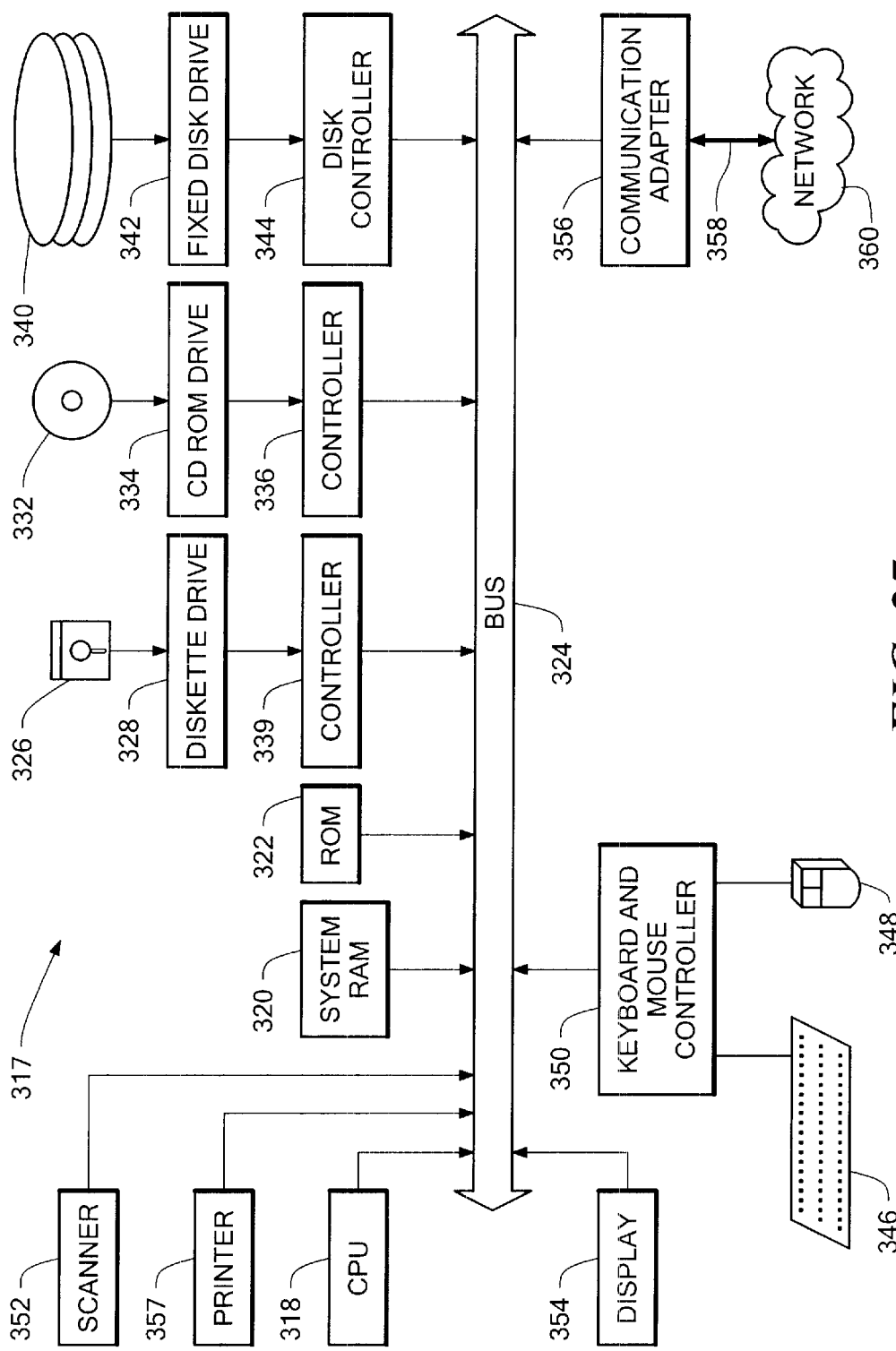
FIG. 27 is a schematic diagram of a system on which a method for designing superlattice structures using the carrier pocket engineering techniques described in conjunction with FIGS. 1–25 can be implemented.

Referring now to FIG. 27, a computer system 317 on which the carrier pocket engineering techniques of the present invention may be implemented is shown. Computer system 317 may be provided, for example, as an IBM compatible computer or an equivalent computer system. The exemplary computer system 317 of FIG. 27 is for descriptive purposes only. Although the description may refer to terms commonly used in describing particular computer systems, the description and concepts equally apply to other processing systems, including systems having architectures dissimilar to that shown in FIG. 26.

Computer system 317 includes a central processing unit (CPU) 318, which may be provided, for example, as a conventional microprocessor, a random access memory (RAM) 320 for temporary storage of information, and a read only memory (ROM) 322 for permanent storage of information. Each of the aforementioned components are coupled to a bus 324. Operation of computer system 317 is generally controlled and coordinated by operating system software. The operating system controls allocation of system resources and performs tasks such as processing, scheduling, memory management, networking, and I/O services, among other things. Thus, an operating system resident in system memory and executed by CPU 318 coordinates the operation of the other elements of computer system 317.

Also coupled to bus 324 is a non-volatile mass storage device which may be provided as a diskette 326. Diskette 326 is insertable into a diskette drive 328 which is, in turn, coupled to bus 324 by a controller 330. Similarly, a compact disc (CD) ROM 332 is insertable into a CD ROM drive 334 which is, in turn, coupled to bus 324 by a controller 336. A hard disk 340 is typically provided as part of a fixed disk drive 342 which is coupled to bus 324 by a disk controller 344.

Data and software may be provided to and extracted from computer system 317 via removable storage media such as hard disk 340, diskette 326, and CD ROM 332. For example, data values generated using techniques described above may be stored on storage media similar to media 326, 332, 340. The data values may then be retrieved from the media 326, 332, 340 by CPU 318 and utilized by CPU 318 to recommend one of a plurality of items in response to a user's query.

Alternatively, computer software useful for performing computations related to the carrier pocket engineering techniques may be stored on storage media similar to media 326, 332, 340. Such computer software may be retrieved from media 326, 332, 340 for immediate execution by CPU 318 or by processors included in one or more peripherals such as communication adapter 356. CPU 318 may retrieve the computer software and subsequently store the software in RAM 320 or ROM 322 for later execution.

User input to computer system 317 may be provided by a number of devices. For example, a keyboard 346 and a mouse 348 are coupled to bus 324 by a controller 350. Also, a scanner 352 and optionally Optical Character Recognition (OCR) techniques may be used to input data to the system 317.

Also, use output to computer system 317 may be provided by a number of devices for example, a display 354 and a printer 357 may be used to provide information to a user of the system 317.

Computer system 317 also includes a communications adaptor 356 which allows the system to be interconnected to a local area network (LAN) or a wide area network (WAN), schematically illustrated by bus 358 and network 360. Thus, data and computer program software can be transferred to and from computer system 317 via adapter 356, bus 358 and network 360.

Having described preferred embodiments of the invention, it will now become apparent to one of ordinary skill in the art that other embodiments incorporating their concepts may also be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A thermoelectric material comprising:

a plurality of alternating layers of at least two different semiconductor materials, wherein first ones of the layers correspond to barrier layers and second ones of the layers correspond to well layers and wherein each of the well layers are provided having quantum well states formed from carrier pockets at various high symmetry points in the Brillouin zone to provide a superlattice structure having a relatively high thermoelectric figure of merit.

2. The thermoelectric material of claim 1 wherein:

said barrier layers are provided from one of AlAs and AlGaAs; and said well layers are provided from one of GaAs and AlGaAs.

3. The thermoelectric material of claim 1 wherein:

said barrier layers are provided from one of Si and SiGe; and said well layers are provided from one of Ge and SiGe.

4. The thermoelectric material of claim 1 wherein the plurality of alternating layers is grown on a substrate having a first layer.

5. The thermoelectric material of claim 4 wherein the first layer comprises a Si-on-insulator (SOI) substrate.

6. The thermoelectric material of claim 4 wherein the substrate comprises a semiconductor junction.

7. The thermoelectric material of claim 4 wherein the substrate further comprises a graded buffer layer disposed between said first layer and said plurality of alternating layers.

8. The thermoelectric material of claim 7 wherein the substrate further comprises an undoped layer disposed between said graded buffer layer and said plurality of alternating layers.

9. The thermoelectric material of claim 4 wherein the first layer comprises (001) oriented Si material.

* * * * *